(12) United States Patent
Hayashi et al.

(10) Patent No.: US 10,431,603 B2
(45) Date of Patent: Oct. 1, 2019

(54) SEMICONDUCTOR DEVICE

(71) Applicant: JOLED INC., Tokyo (JP)

(72) Inventors: Hiroshi Hayashi, Tokyo (JP); Tokuaki Kuniyoshi, Tokyo (JP); Yasuhiro Terai, Tokyo (JP); Eri Matsuo, Tokyo (JP); Toshiaki Yoshitani, Tokyo (JP); Naoki Asano, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/863,009

(22) Filed: Jan. 5, 2018

(65) Prior Publication Data

US 2018/0197884 A1   Jul. 12, 2018

(30) Foreign Application Priority Data

Jan. 12, 2017 (JP) ................................ 2017-003486
Jan. 12, 2017 (JP) ................................ 2017-003487
(Continued)

(51) Int. Cl.
*H01L 27/12* (2006.01)
*H01L 29/786* (2006.01)
(Continued)

(52) U.S. Cl.
CPC ........ *H01L 27/124* (2013.01); *H01L 21/0273* (2013.01); *H01L 21/76802* (2013.01);
(Continued)

(58) Field of Classification Search
CPC ... H01L 27/124; H01L 29/7869–78693; H01L 27/1255; H01L 29/78666;
(Continued)

(56) References Cited

U.S. PATENT DOCUMENTS

2011/0240998 A1   10/2011   Morosawa et al.
2015/0162399 A1*   6/2015   Sato ........................ H01L 29/12
257/43
(Continued)

FOREIGN PATENT DOCUMENTS

JP      2011-228622 A    11/2011
JP      2015-108731 A     6/2015
JP         2016-9791 A     1/2016

*Primary Examiner* — Selim U Ahmed
*Assistant Examiner* — Evan G Clinton
(74) *Attorney, Agent, or Firm* — Hauptman Ham, LLP

(57) ABSTRACT

A semiconductor device includes a substrate, a first wiring line, a semiconductor film, a second wiring line, and an insulating film. The substrate includes first, second, and third regions provided adjacently in this order in a predetermined direction. The first wiring line is provided on the substrate and provided in each of the first, second, and third regions. The semiconductor film has a low-resistance region in at least a portion thereof. The semiconductor film is provided between the first wiring line and the substrate in the first region, and is in contact with the first wiring line in the second region. The second wiring line is provided at a position closer to the substrate than the semiconductor film, and is in contact with the first wiring line in the third region. The insulating film is provided between the first wiring line and the semiconductor film in the first region.

19 Claims, 45 Drawing Sheets

(30) Foreign Application Priority Data

Mar. 13, 2017 (JP) ................................ 2017-046990
Mar. 22, 2017 (JP) ................................ 2017-056165
Oct. 4, 2017 (JP) ................................ 2017-194109

(51) Int. Cl.
*H01L 21/027* (2006.01)
*H01L 21/768* (2006.01)
*H01L 29/66* (2006.01)
*H01L 29/417* (2006.01)

(52) U.S. Cl.
CPC .. *H01L 21/76877* (2013.01); *H01L 21/76897* (2013.01); *H01L 27/1225* (2013.01); *H01L 27/1248* (2013.01); *H01L 27/1255* (2013.01); *H01L 27/1262* (2013.01); *H01L 27/1288* (2013.01); *H01L 29/41733* (2013.01); *H01L 29/66969* (2013.01); *H01L 29/786* (2013.01); *H01L 29/7869* (2013.01)

(58) Field of Classification Search
CPC ......... H01L 29/78675; H01L 29/66757; H01L 29/78648
See application file for complete search history.

(56) References Cited

U.S. PATENT DOCUMENTS

2015/0380560 A1    12/2015  Ishikawa et al.
2017/0186777 A1*    6/2017  Toyotaka ............ H01L 27/1266
2018/0012947 A1*    1/2018  Lee .................... H01L 27/3272
2018/0315792 A1*   11/2018  Sekine ............... H01L 27/14663

\* cited by examiner

SEMICONDUCTOR DEVICE

CROSS REFERENCE TO RELATED APPLICATIONS

This application claims the benefit of Japanese Priority Patent Application JP 2017-003487 filed on Jan. 12, 2017, Japanese Priority Patent Application JP 2017-003486 filed on Jan. 12, 2017, Japanese Priority Patent Application JP 2017-056165 filed on Mar. 22, 2017, Japanese Priority Patent Application JP 2017-046990 filed on Mar. 13, 2017, and Japanese Priority Patent Application JP 2017-194109 filed on Oct. 4, 2017, the entire contents of which are incorporated herein by reference.

BACKGROUND

The technology relates to a semiconductor device including a thin film transistor (TFT), for example.

With the progress in larger screen and higher-speed driving of active-matrix-driven displays, thin film transistors (TFT) that use an oxide semiconductor film as a channel have been actively developed. For example, reference is made to Japanese Unexamined Patent Application Publications No. 2015-108731, No. 2016-9791, and No. 2011-228622. The semiconductor device including the oxide semiconductor film is provided with components such as a plurality of wiring lines and a storage capacitor element in addition to the thin film transistor.

Further, the semiconductor device that drives a unit such as a display unit is provided with the storage capacitor in addition to such a thin film transistor, and the thin film transistor and the storage capacitor are electrically coupled to each other.

SUMMARY

What is desired in a semiconductor device is to have enhanced stability of the contact (i.e., coupling) as mentioned above. What is also desired in the semiconductor device is to have a further enhanced degree of freedom of design of components such as an electronic element and a wiring line.

It is desirable to provide a semiconductor device that makes it possible to enhance contact stability, and a semiconductor device that makes it possible to enhance a degree of freedom of design.

According to an embodiment of the technology, there is provided a semiconductor device including:
  a substrate including a first region, a second region, and a third region that are provided adjacently in this order in a predetermined direction;
  a first wiring line that is provided on the substrate and provided in each of the first region, the second region, and the third region;
  a semiconductor film having a low-resistance region in at least a portion of the semiconductor film, the semiconductor film being provided between the first wiring line and the substrate in the first region, and being in contact with the first wiring line in the second region;
  a second wiring line that is provided at a position closer to the substrate than the semiconductor film, and is in contact with the first wiring line in the third region; and
  an insulating film provided between the first wiring line in the first region and the semiconductor film in the first region.

According to an embodiment of the technology, there is provided a semiconductor device including:
  a substrate including a first region, a second region, and a third region that are provided adjacently in this order in a predetermined direction;
  a first wiring line that is provided on the substrate and provided at least in the third region;
  a first insulating film that covers the first wiring line;
  a semiconductor film that is provided on the substrate and provided in each of the first region and the second region, with the first insulating film being interposed between the substrate and the semiconductor film, the semiconductor film having a low-resistance region at least in a portion of the semiconductor film;
  a second insulating film that covers the semiconductor film; and
  a second wiring line that is provided on the substrate and provided in each of the second region and the third region, with the second insulating film being interposed between the substrate and the second wiring line, the second wiring line being in contact with the semiconductor film in the second region via a contact hole provided in the second insulating film and the first insulating film, and being in contact with the first wiring line in the third region via the contact hole provided in the second insulating film and the first insulating film,
  the second wiring line and the semiconductor film each having a width that is larger than a width of the contact hole.

According to an embodiment of the technology, there is provided a semiconductor device including:
  a transistor having a gate electrode, and a channel region of an oxide semiconductor film that faces the gate electrode;
  a first wiring line provided in same layer as a layer in which the oxide semiconductor film is provided, and including same constituent material as a constituent material of the oxide semiconductor film;
  a second wiring line provided in same layer as a layer in which the gate electrode is provided; and
  a stack that includes
    an oxygen-permeation prevention film that faces the second wiring line, with the first wiring line being interposed between the second wiring line and the oxygen-permeation prevention film, and
    a first insulating film provided between the oxygen-permeation prevention film and the first wiring line.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

Figure 1:
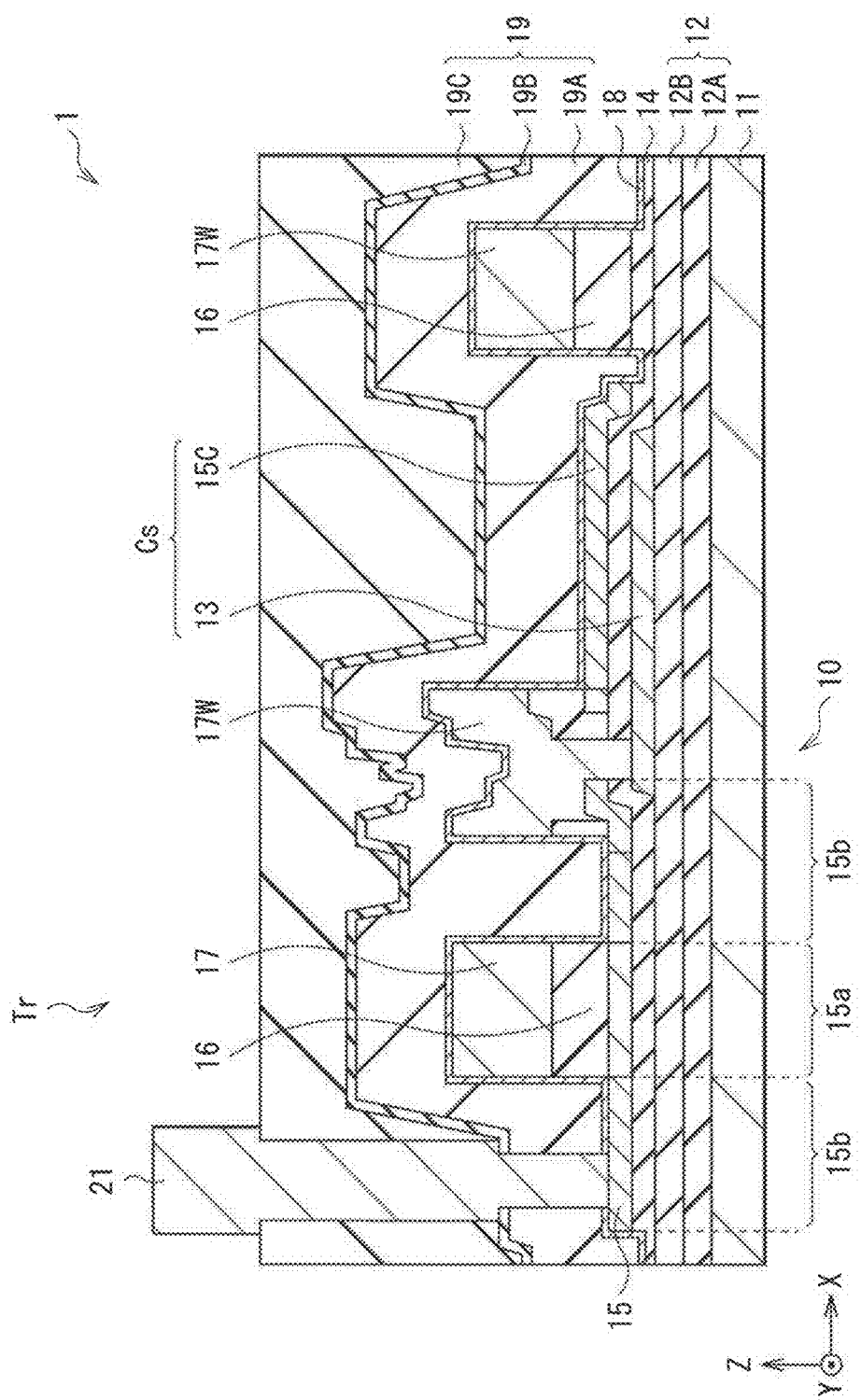
FIG. 1 is a schematic cross-sectional view of an outline configuration of a semiconductor device according to an embodiment of the technology.
Figure 2:
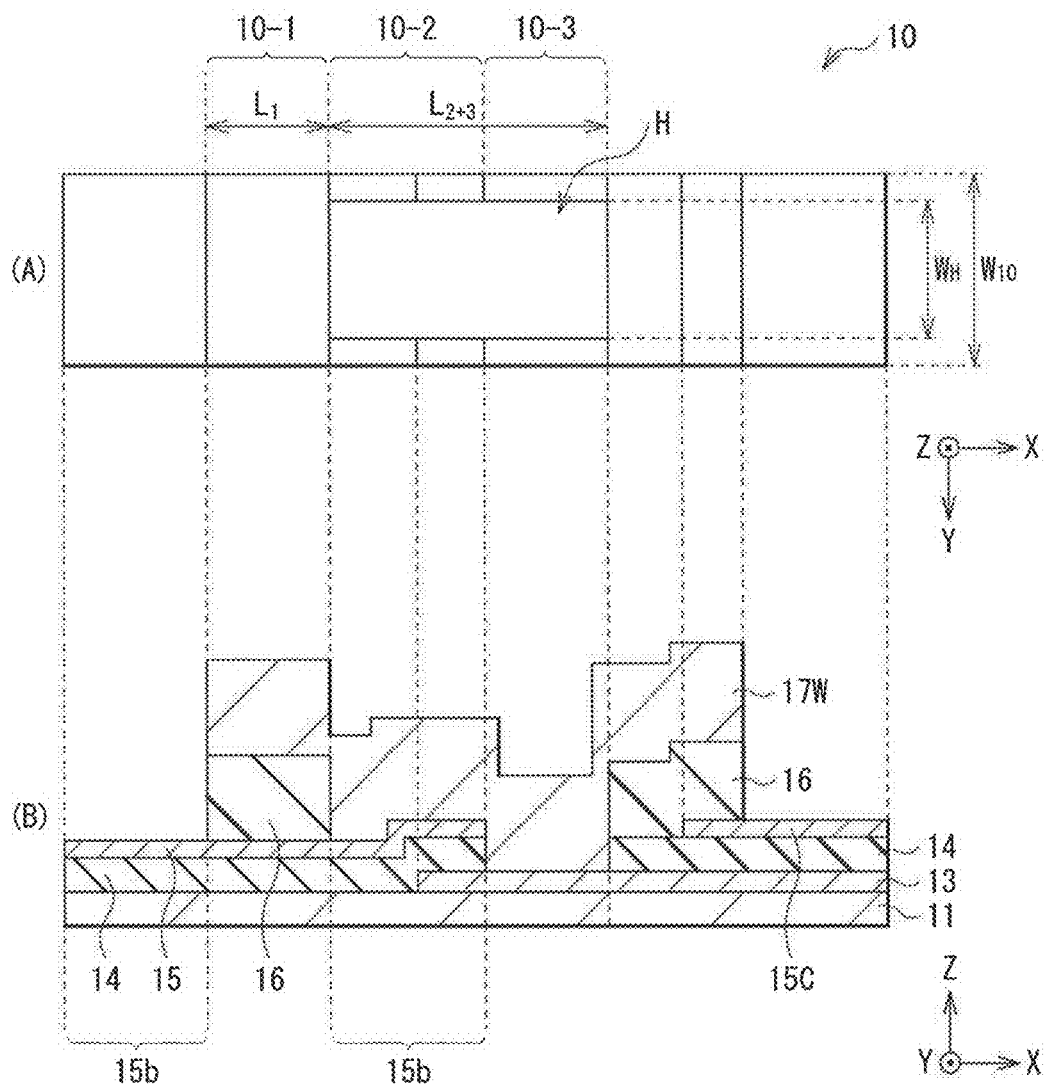

(A) of FIG. 2 is a plan view of a configuration of a contact illustrated in FIG. 1, and (B) of FIG. 2 is a cross-sectional view thereof.

Figure 3:
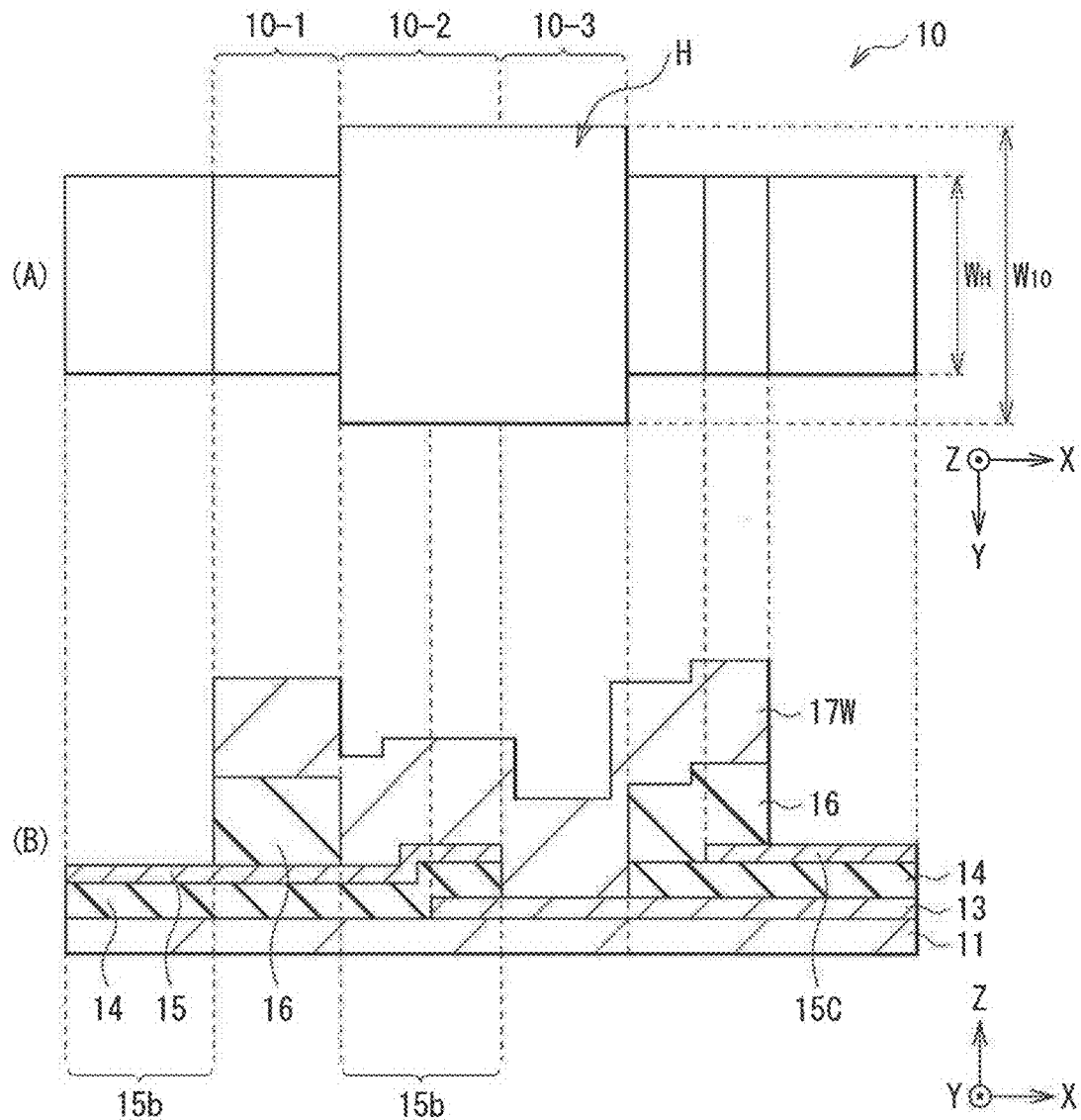

(A) of FIG. 3 is a plan view of another configuration of the contact illustrated in FIG. 2, and (B) of FIG. 3 is a cross-sectional view thereof.

Figure 4A:
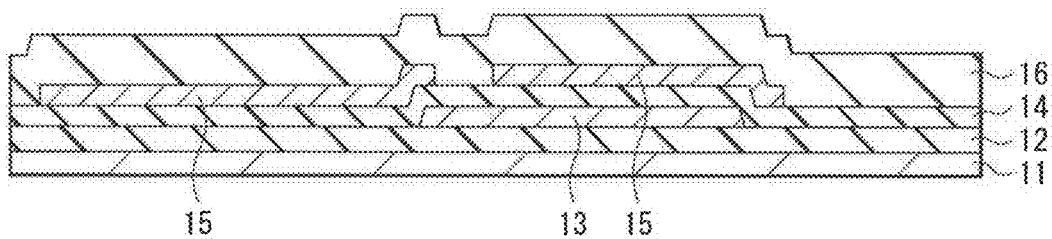

FIG. 4A is a schematic cross-sectional view of one process step of manufacture of the semiconductor device illustrated in FIG. 1.

Figure 4B:
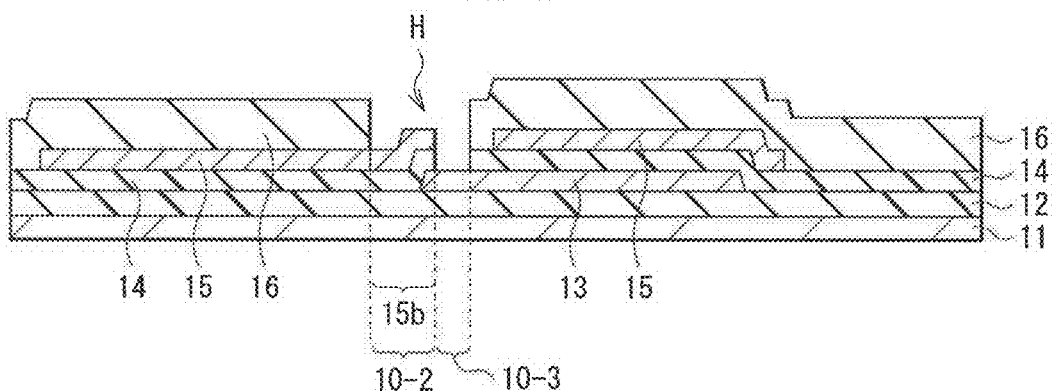

FIG. 4B is a schematic cross-sectional view of a process step subsequent to FIG. 4A.

Figure 4C:
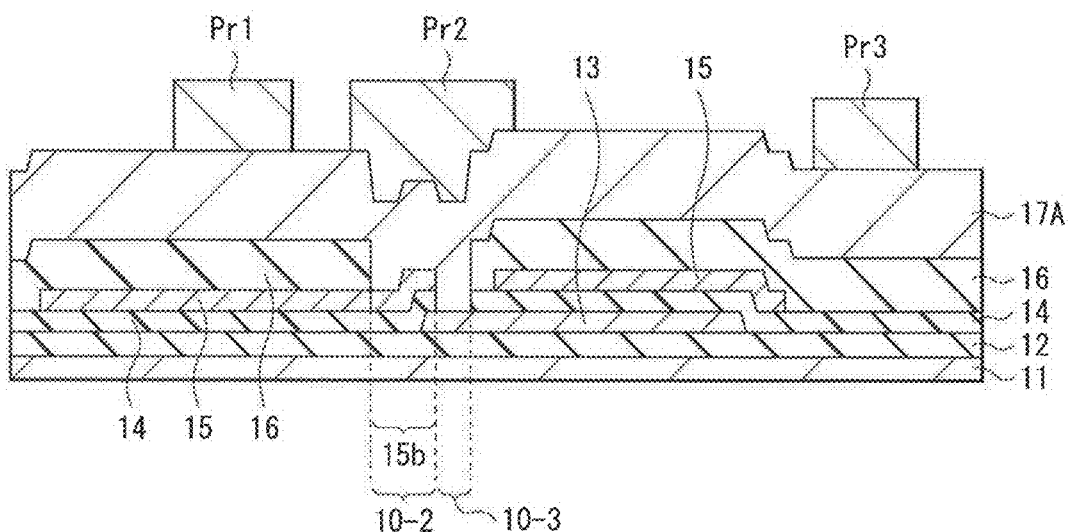

FIG. 4C is a schematic cross-sectional view of a process step subsequent to FIG. 4B.

Figure 5A:
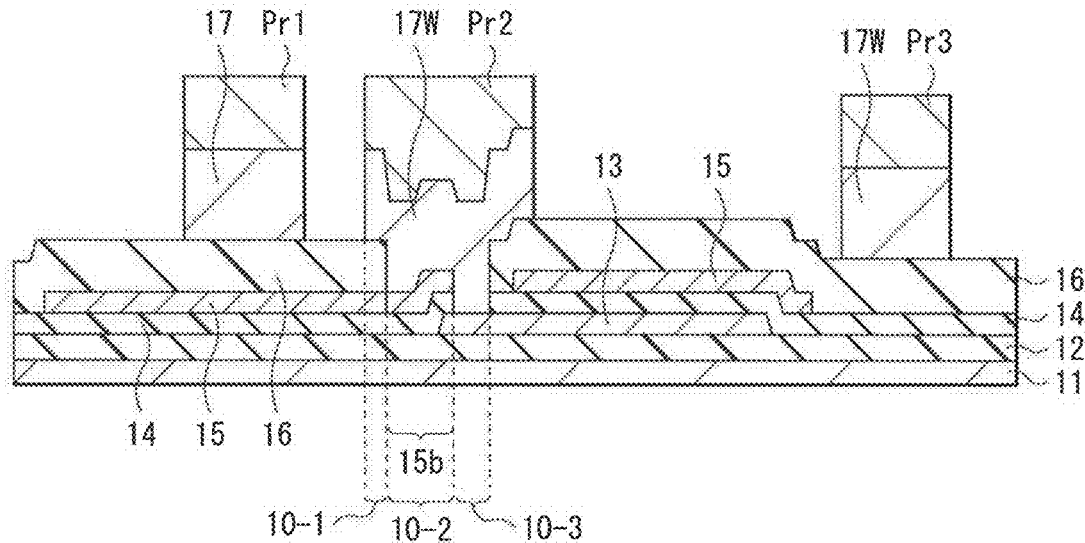

FIG. 5A is a schematic cross-sectional view of a process step subsequent to FIG. 4C.

Figure 5B:
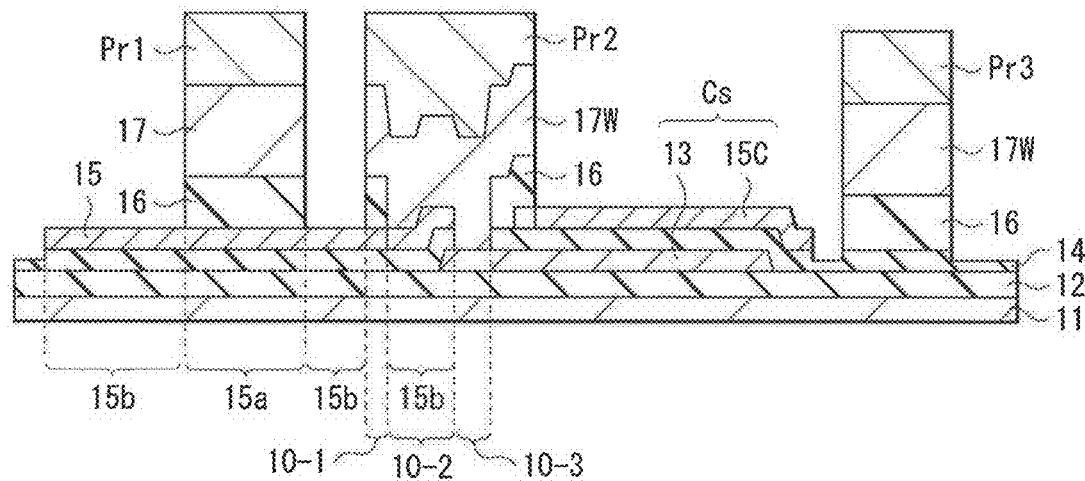

FIG. 5B is a schematic cross-sectional view of a process step subsequent to FIG. 5A.

Figure 6:
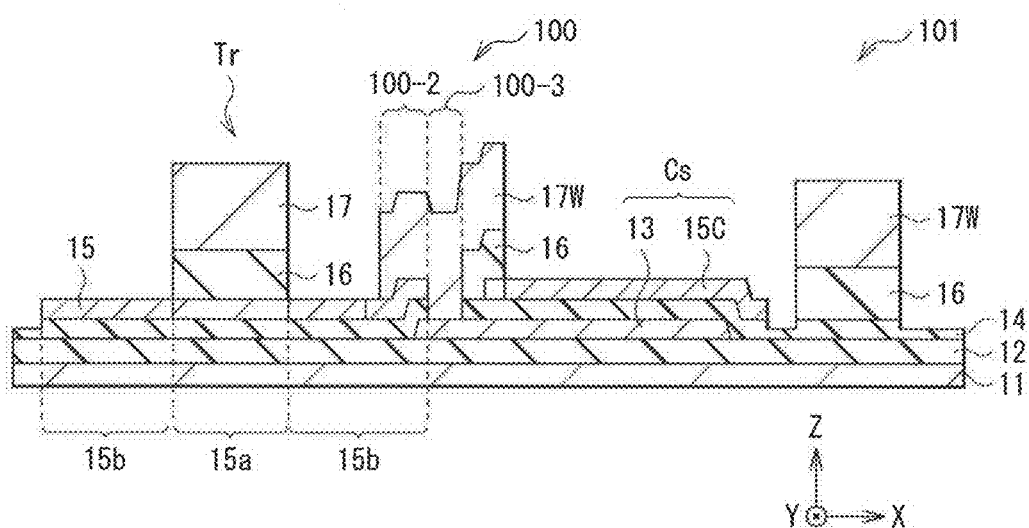

FIG. 6 is a schematic cross-sectional view of an outline configuration of a semiconductor device according to Comparative Example 1.

Figure 7A:
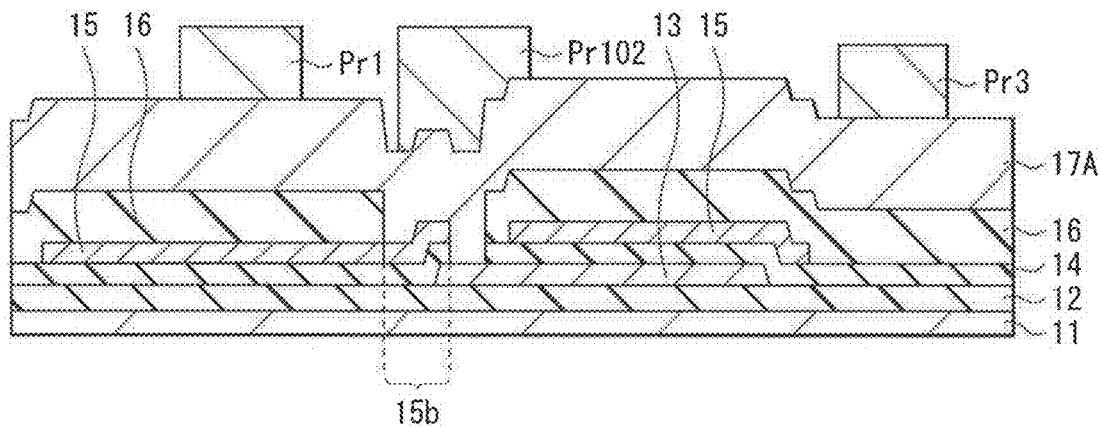

FIG. 7A is a schematic cross-sectional view of one process step of manufacture of the semiconductor device illustrated in FIG. 6.

Figure 7B:
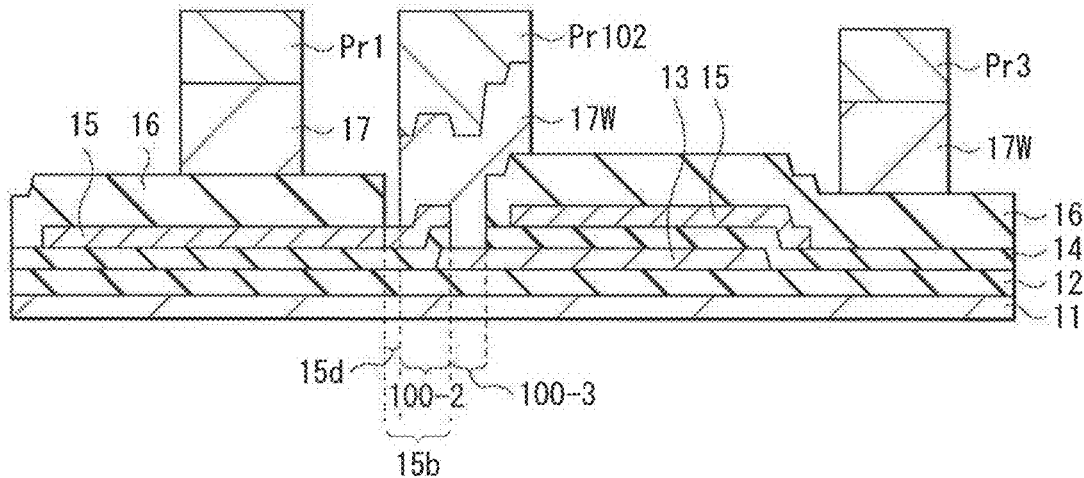

FIG. 7B is a schematic cross-sectional view of a process step subsequent to FIG. 7A.

Figure 7C:
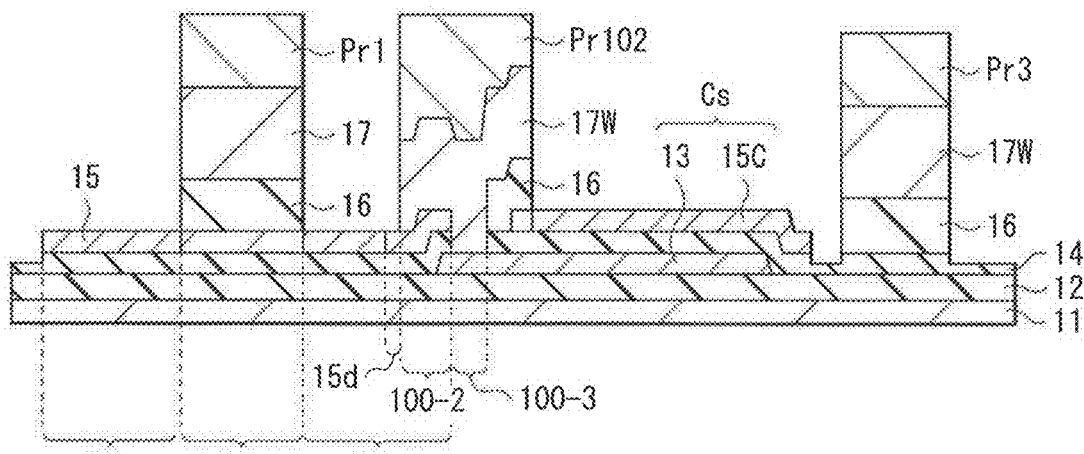

FIG. 7C is a schematic cross-sectional view of a process step subsequent to FIG. 7B.

Figure 8:
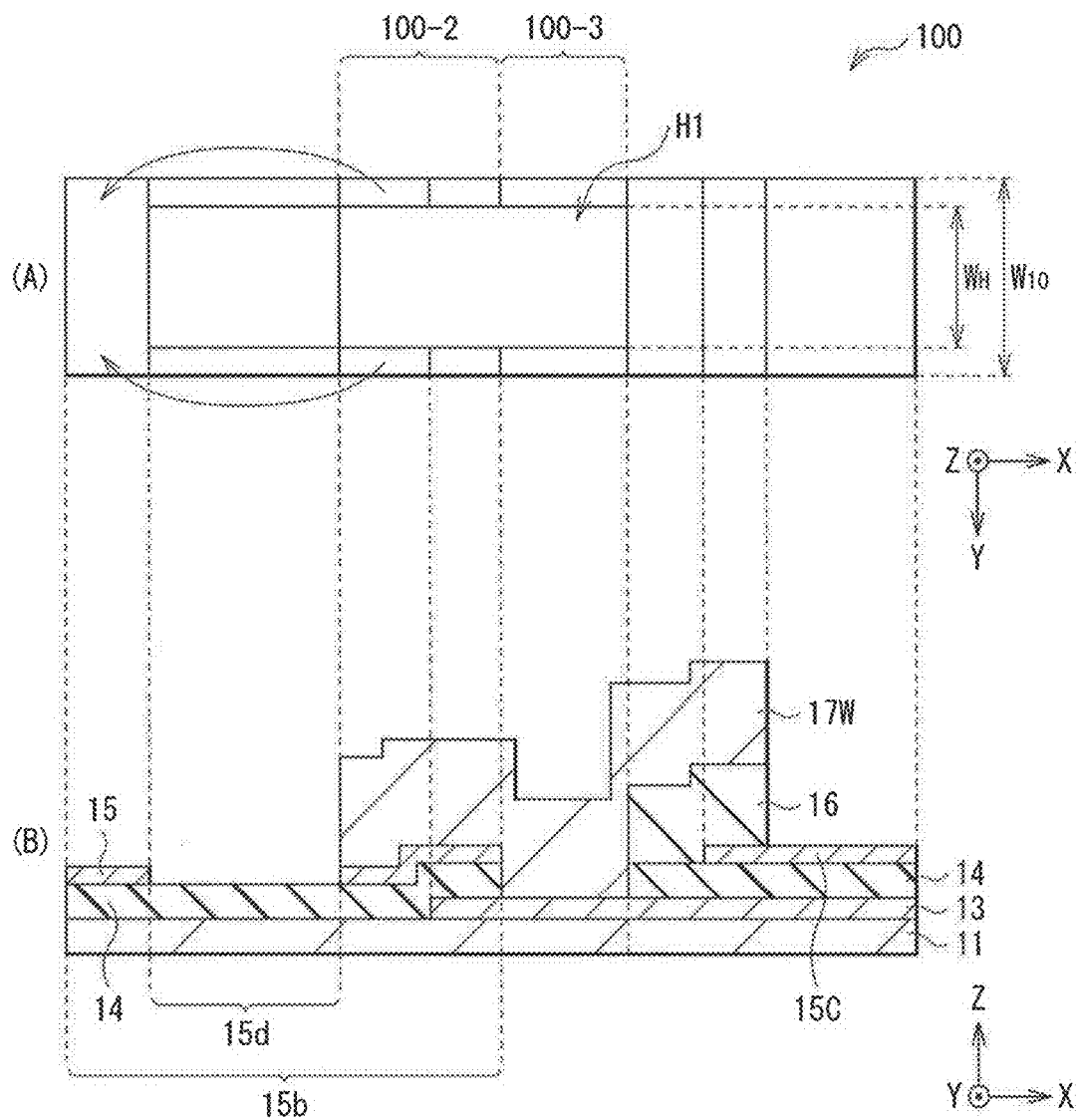

(A) of FIG. 8 is a plan view of a configuration of a contact formed through the process steps in FIGS. 7A to 7C, and (B) of FIG. 8 is a cross-sectional view thereof.

Figure 9:
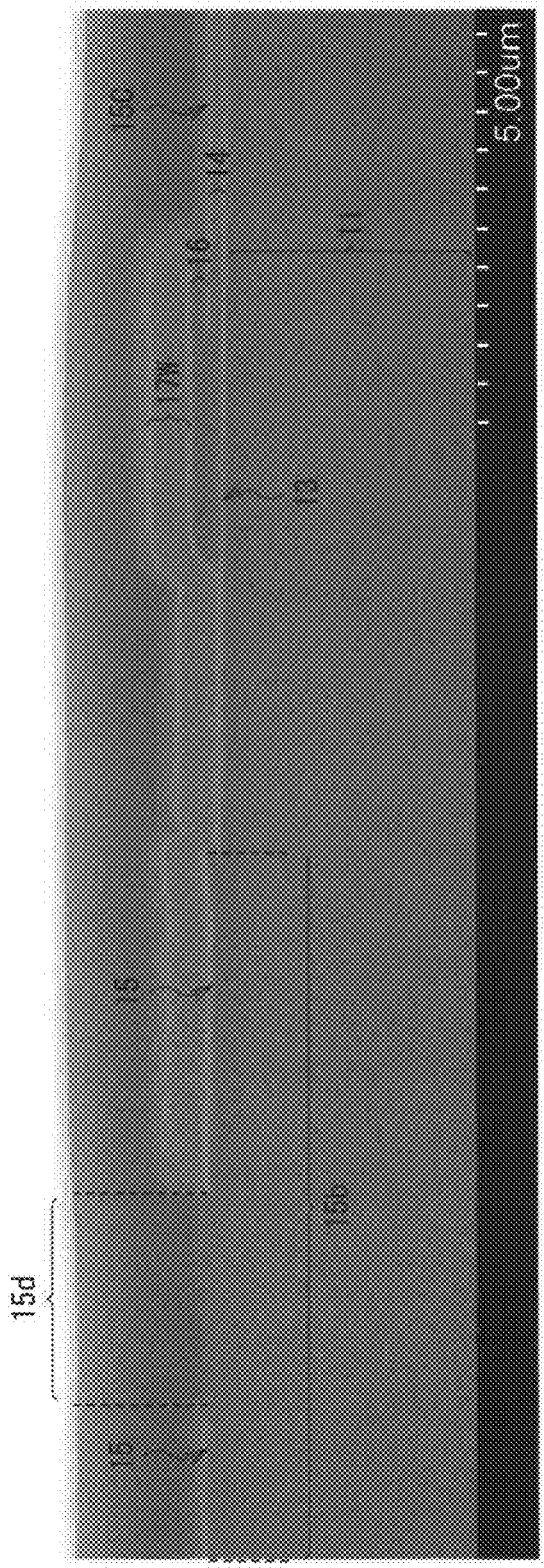

FIG. 9 illustrates an image of the contact illustrated in FIG. 8 by means of a scanning electron microscope.

Figure 10:
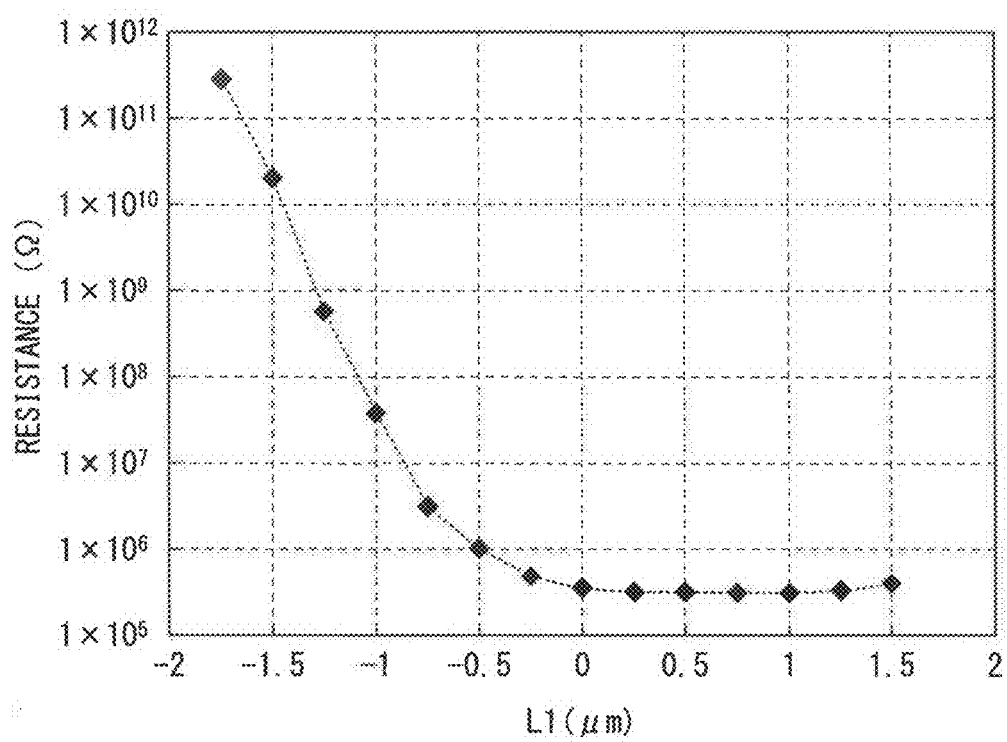

FIG. 10 illustrates a resistance value of a contact chain of each of the contact illustrated in FIG. 2 and the contact illustrated in FIG. 8.

Figure 11:
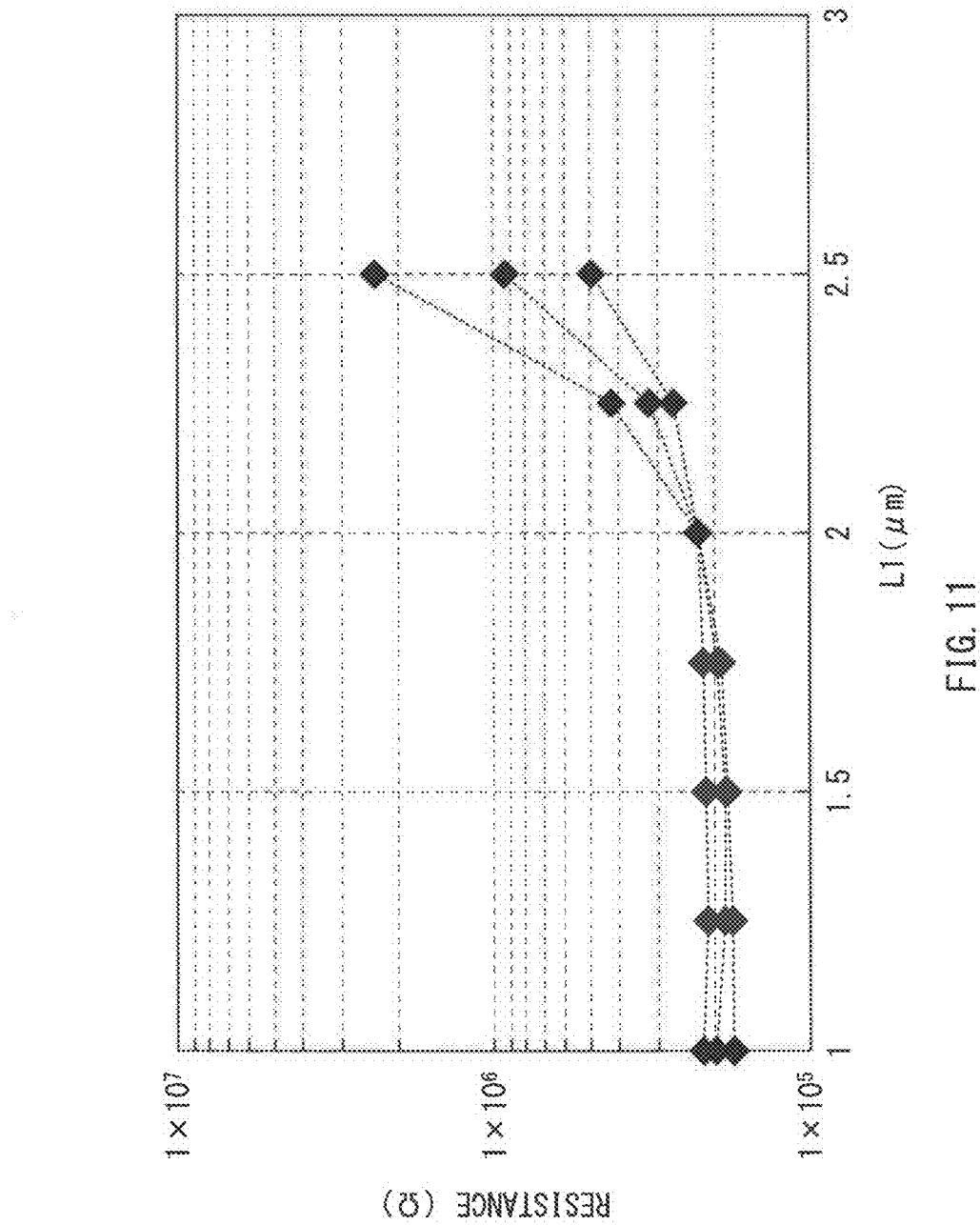

FIG. 11 illustrates a relationship between a length of a first region and a resistance value of the contact chain including the contact illustrated in FIG. 2.

Figure 12A:
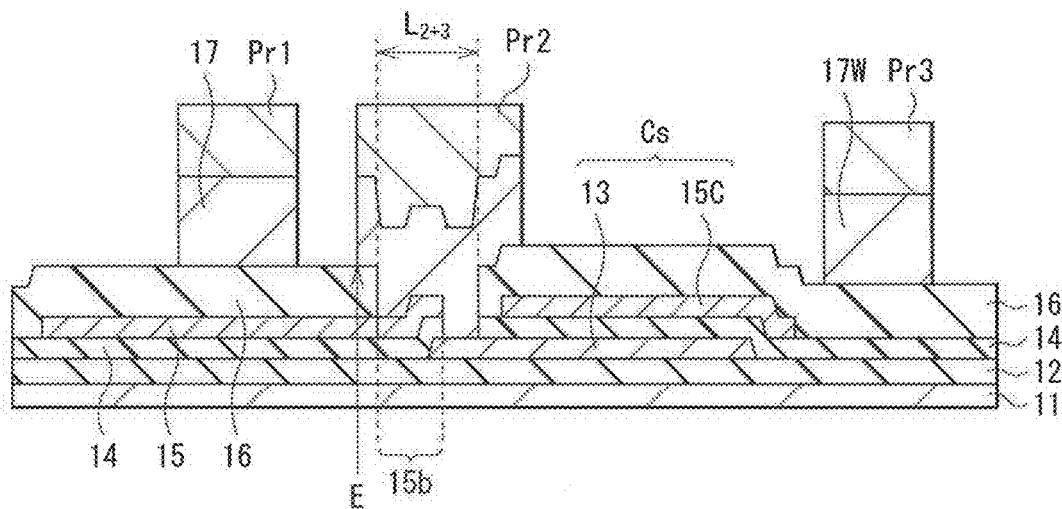

FIG. 12A is an explanatory schematic cross-sectional view of a size of a contact hole illustrated in FIG. 2.

Figure 12B:
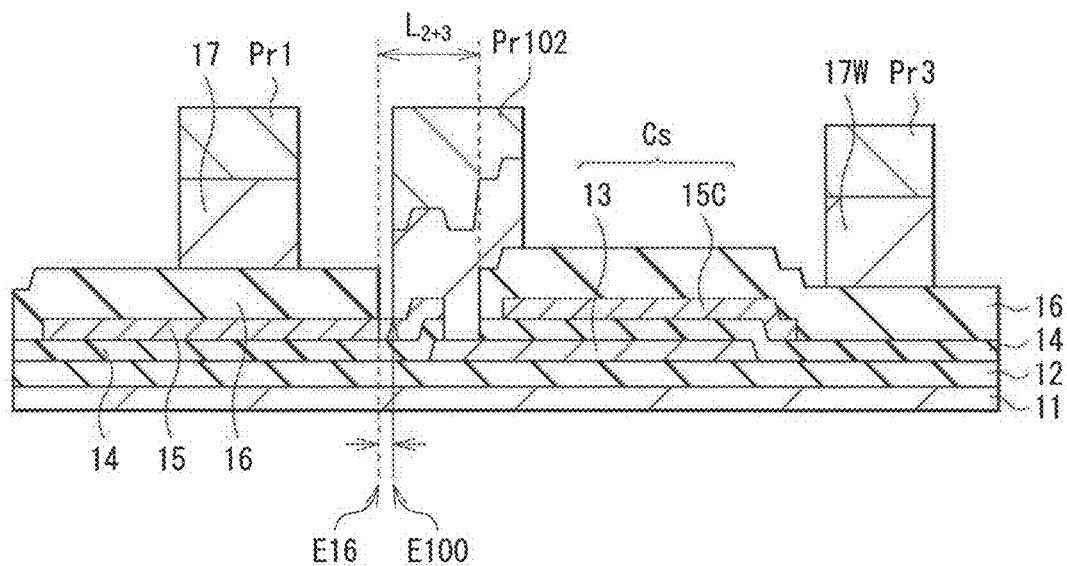

FIG. 12B is an explanatory schematic cross-sectional view of a size of a contact hole illustrated in FIG. 8.

Figure 13:
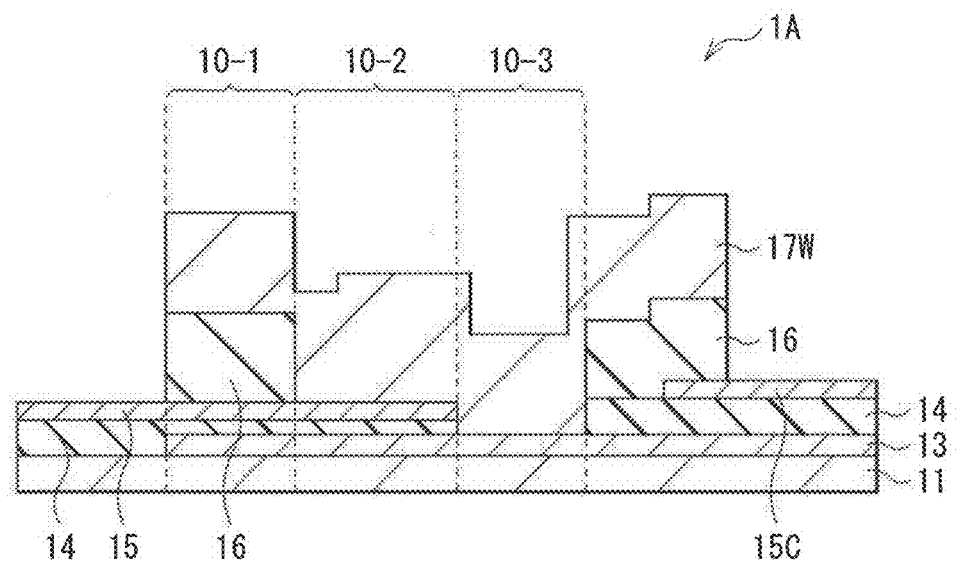

FIG. 13 is a schematic cross-sectional view of an outline configuration of a semiconductor device according to Modification Example 1.

Figure 14:
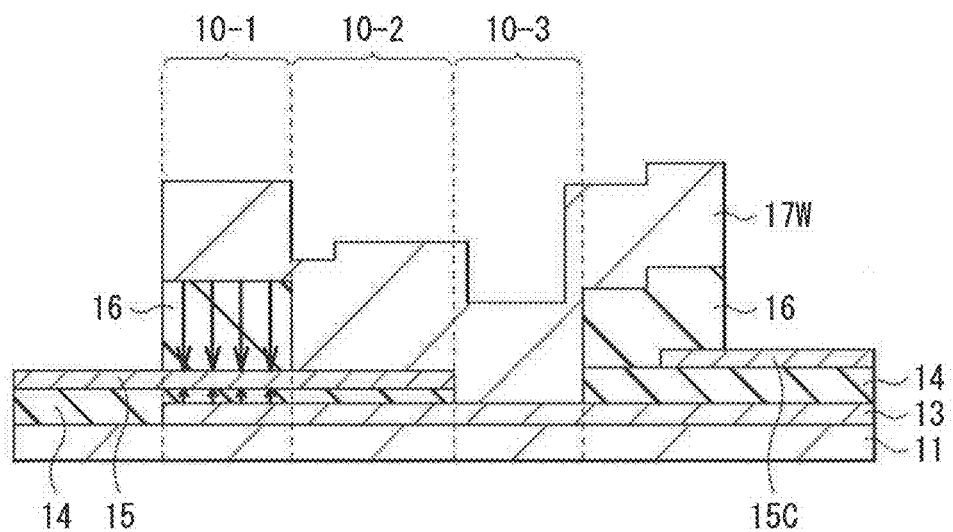

FIG. 14 is an explanatory schematic cross-sectional view of workings of the semiconductor device illustrated in FIG. 13.

Figure 15:
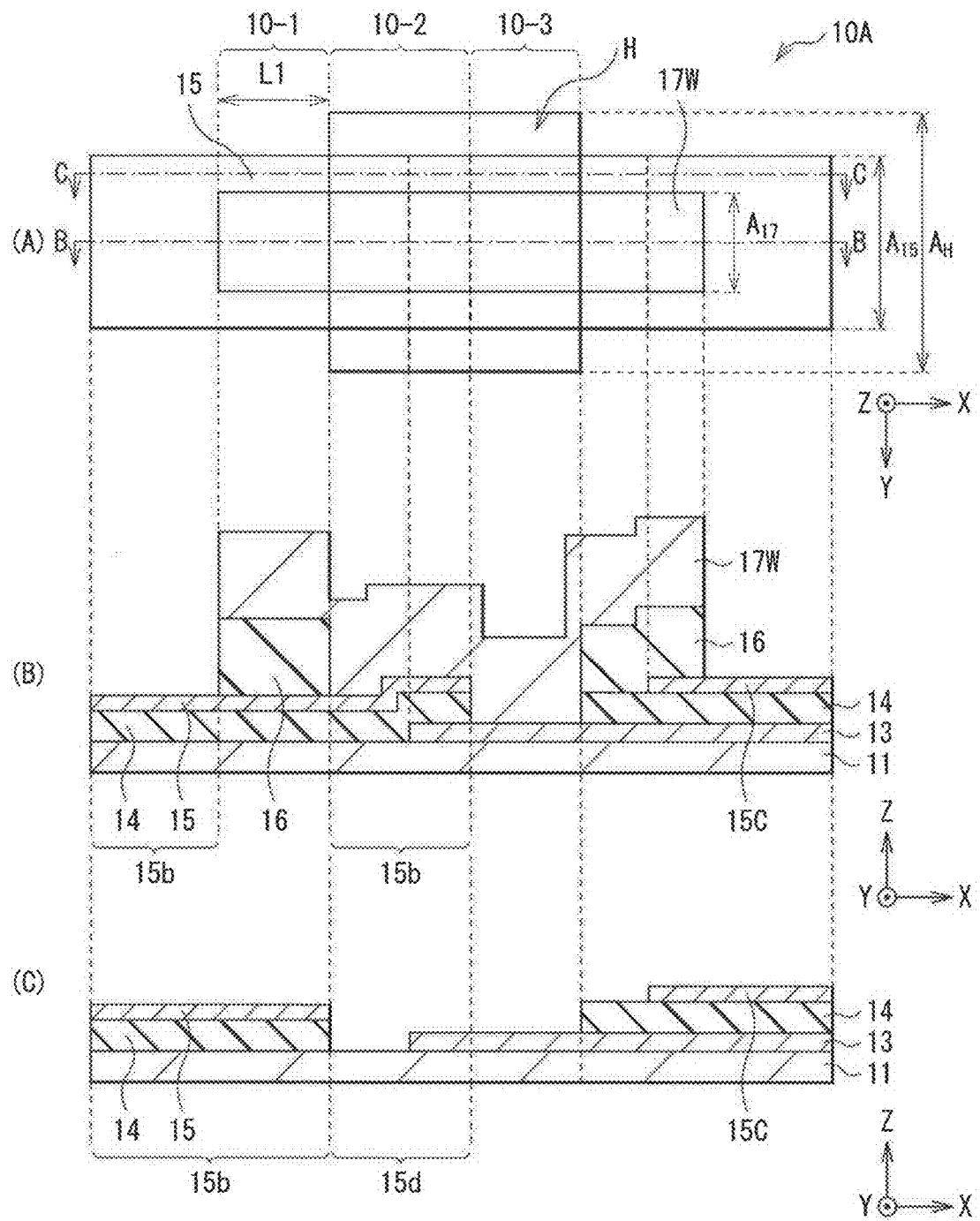

(A) of FIG. 15 is a schematic plan view of an outline configuration of a contact according to a second example embodiment, (B) of FIG. 15 is a schematic cross-sectional view thereof taken along a line B-B illustrated in (A) of FIG. 15, and (C) of FIG. 15 is a schematic cross-sectional view thereof taken along a line C-C illustrated in (A) of FIG. 15.

Figure 16:
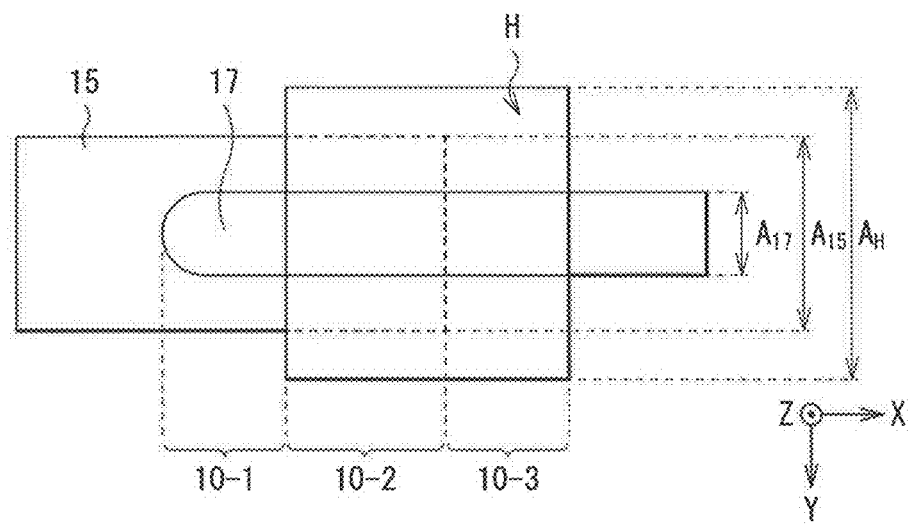

FIG. 16 is a schematic plan view of another example of a gate wiring line illustrated in (A) of FIG. 15.

Figure 17:
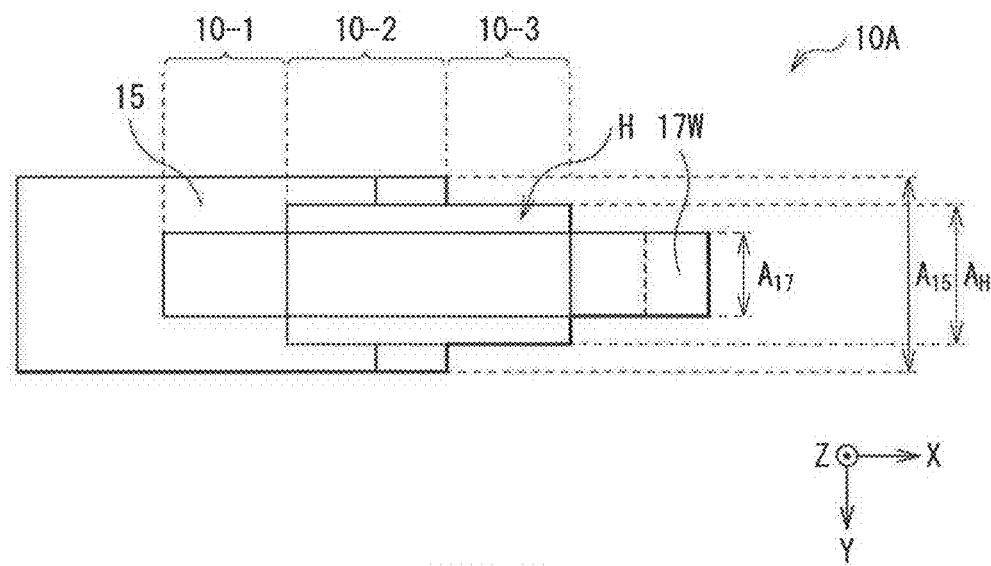

FIG. 17 is a schematic plan view of another example of a contact hole illustrated in (A) of FIG. 15.

Figure 18:
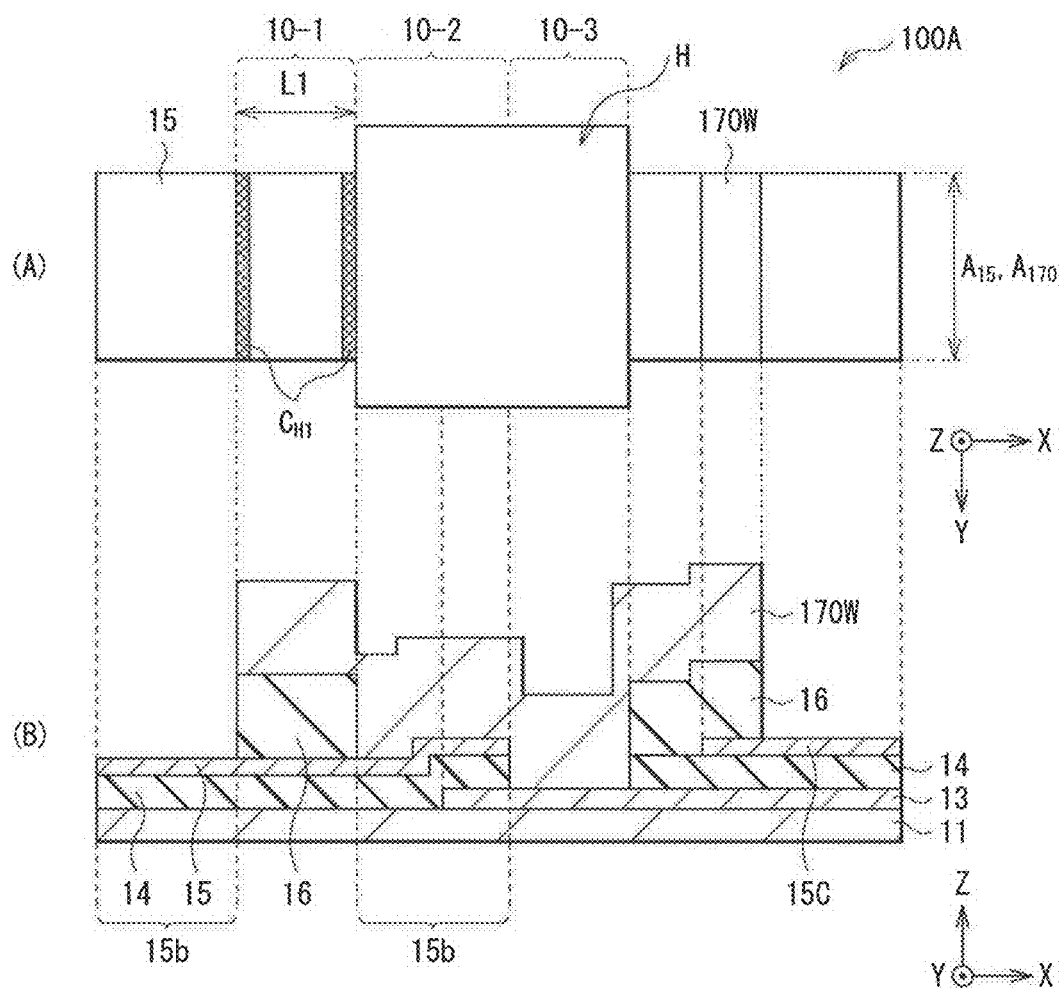

(A) of FIG. 18 is a schematic plan view of a configuration of a contact according to Comparative Example 2, and (B) of FIG. 18 is a schematic cross-sectional view thereof.

Figure 19A:
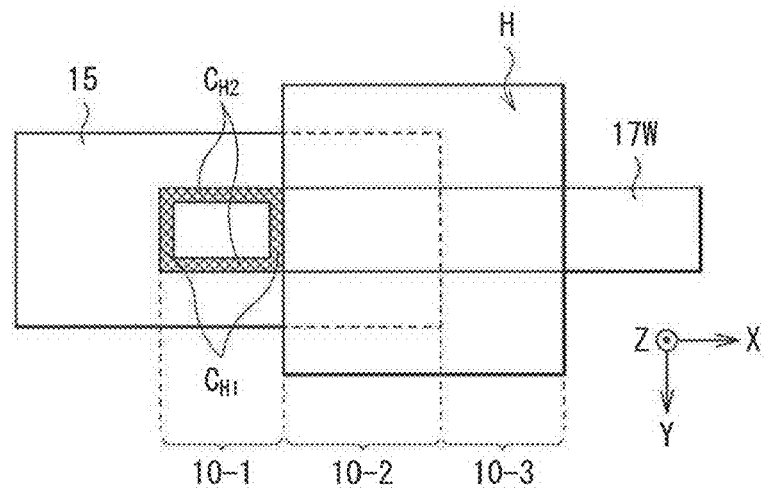

FIG. 19A is an explanatory schematic plan view of a high concentration region of carriers of a semiconductor film illustrated in FIG. 15A.

Figure 19B:
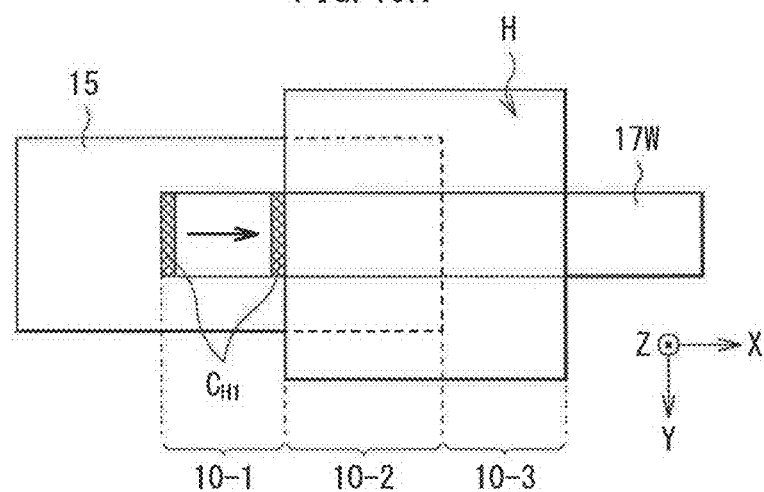

FIG. 19B is an explanatory schematic plan view of a current path (1) of the semiconductor film illustrated in FIG. 19A.

Figure 19C:
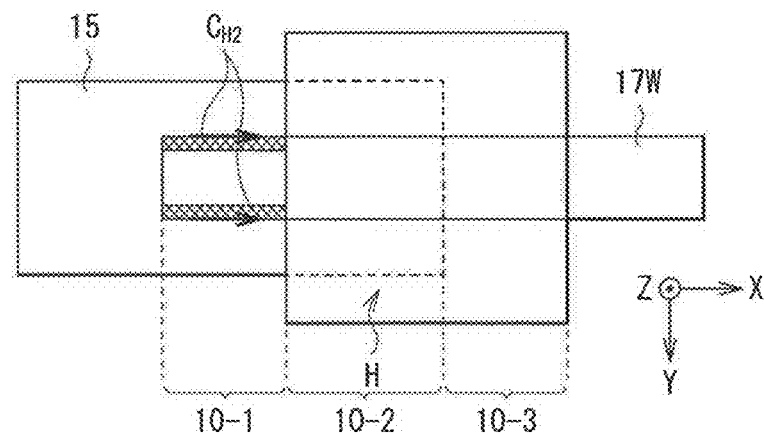

FIG. 19C is an explanatory schematic plan view of a current path (2) of the semiconductor film illustrated in FIG. 19A.

Figure 20:
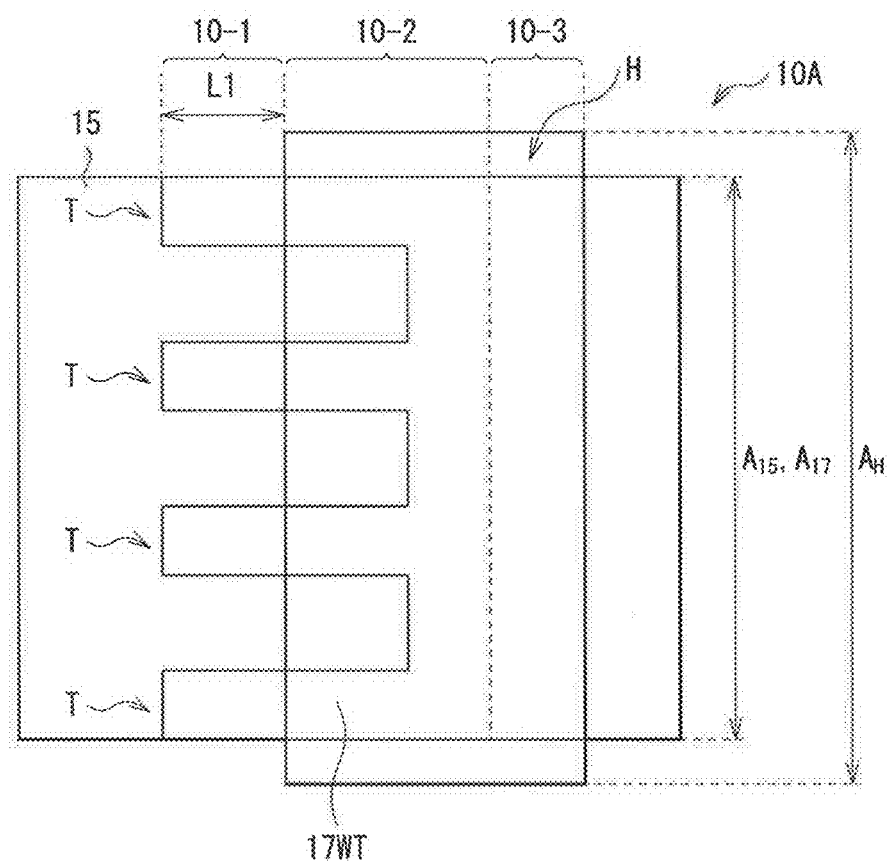

FIG. 20 is a schematic plan view of an outline configuration of a contact according to Modification Example 2.

Figure 21:
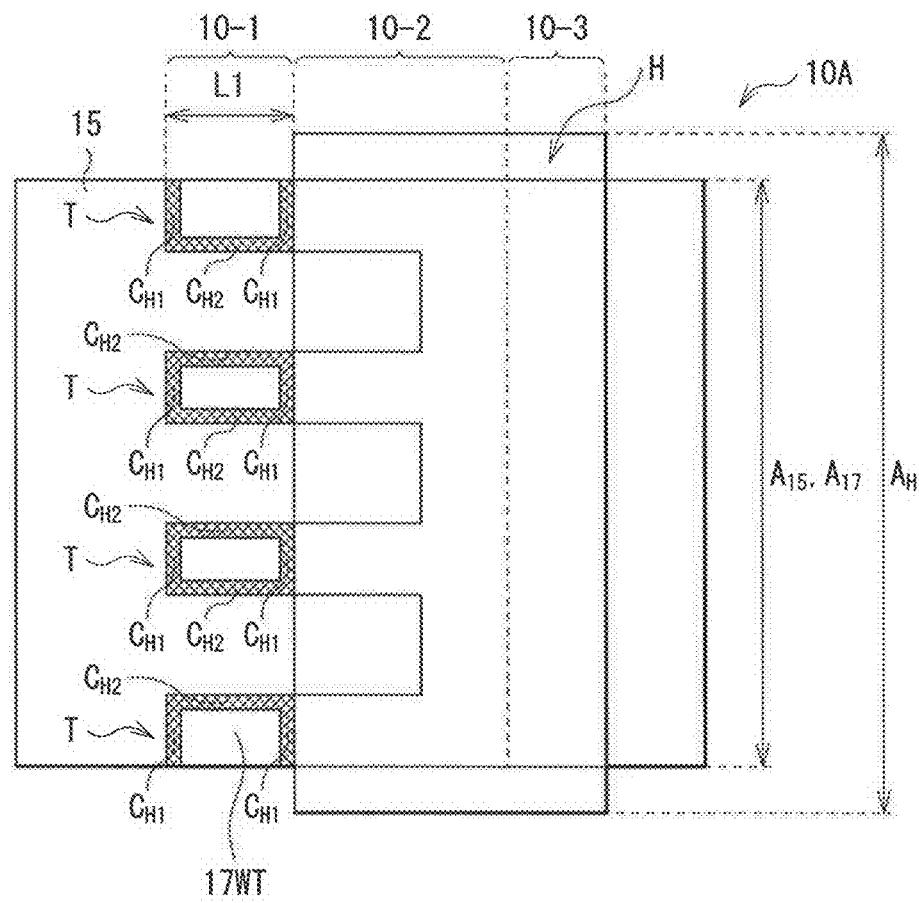

FIG. 21 is an explanatory schematic plan view of a high concentration region of carriers of a semiconductor film illustrated in FIG. 20.

Figure 22:
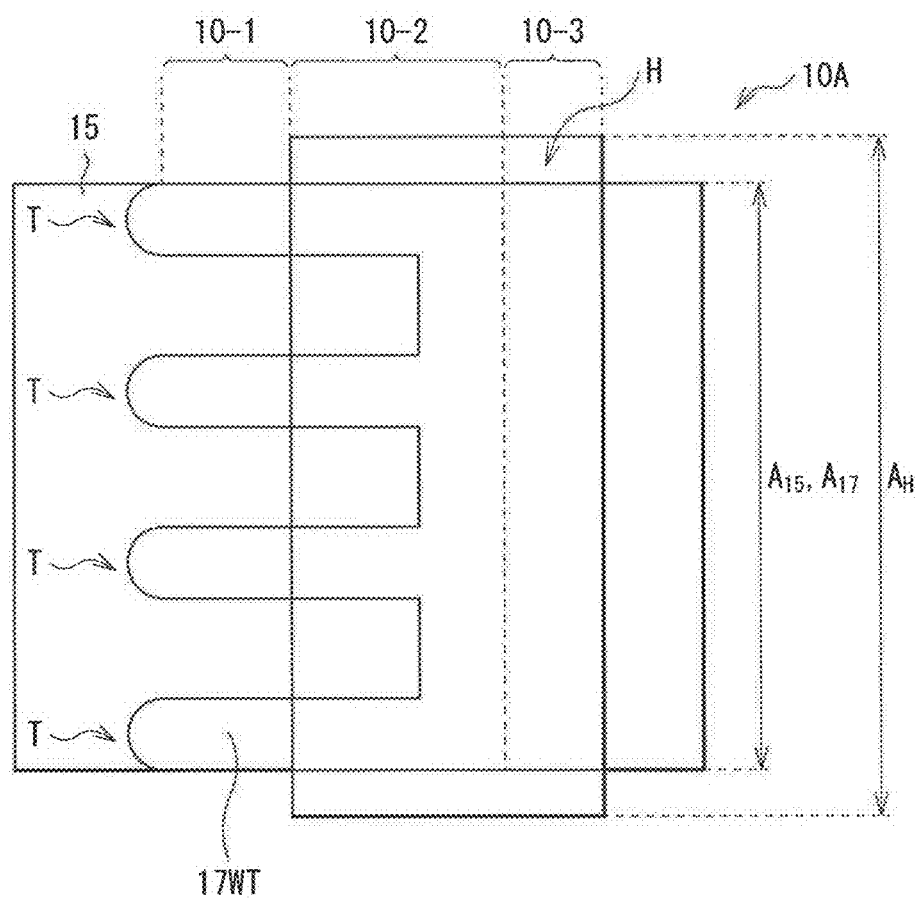

FIG. 22 is a schematic plan view of another example of a gate wiring line illustrated in FIG. 20.

Figure 23:
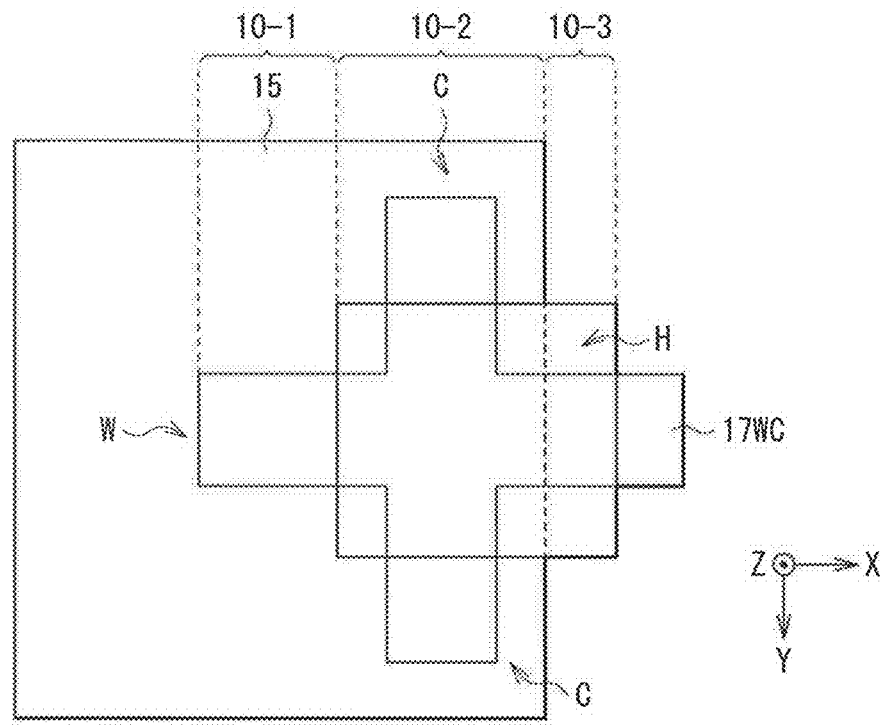

FIG. 23 is a schematic plan view of an outline configuration of a contact according to Modification Example 3.

Figure 24:
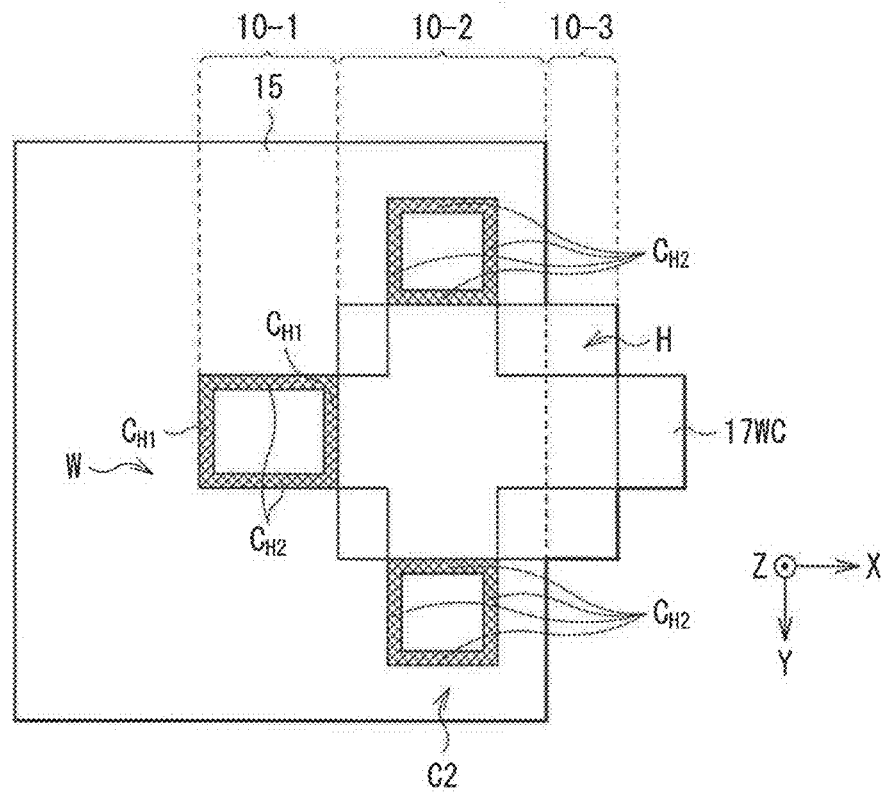

FIG. 24 is an explanatory schematic plan view of a high concentration region of carriers of a semiconductor film illustrated in FIG. 23.

Figure 25:
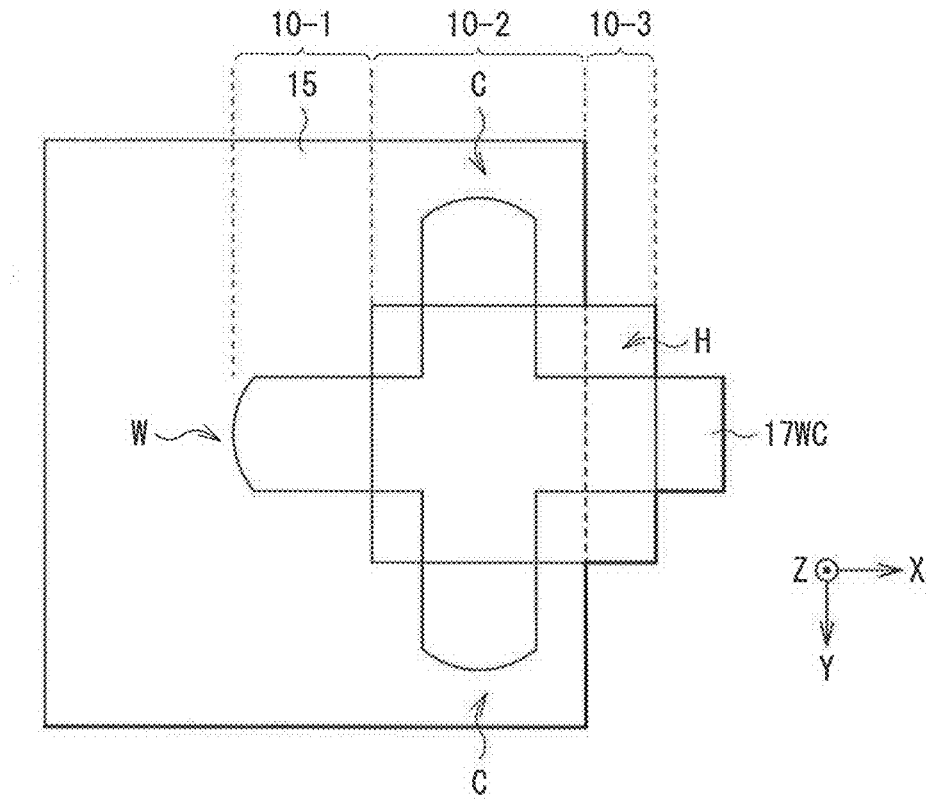

FIG. 25 is a schematic plan view of another example of a gate wiring line illustrated in FIG. 23.

Figure 26:
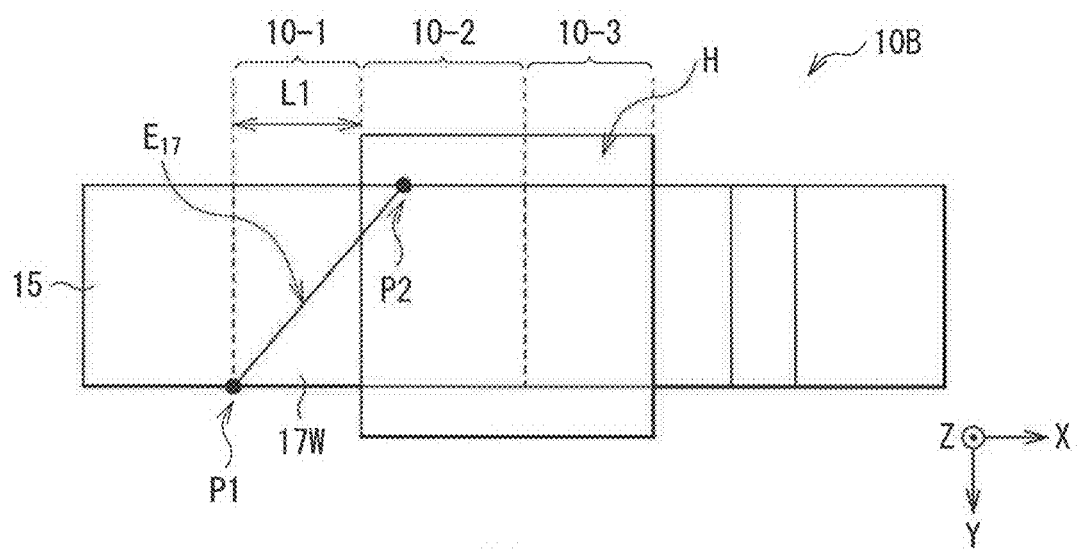

FIG. 26 is a schematic plan view of an outline configuration of a contact according to a third example embodiment.

Figure 27:
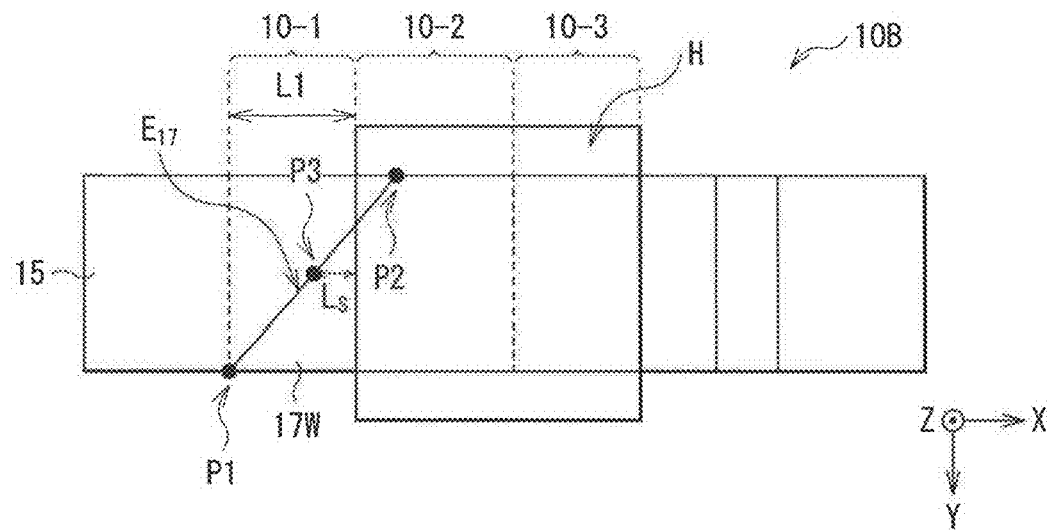

FIG. 27 is an explanatory schematic plan view of a distance from an end of a gate wiring line to a second region illustrated in FIG. 26.

Figure 28:
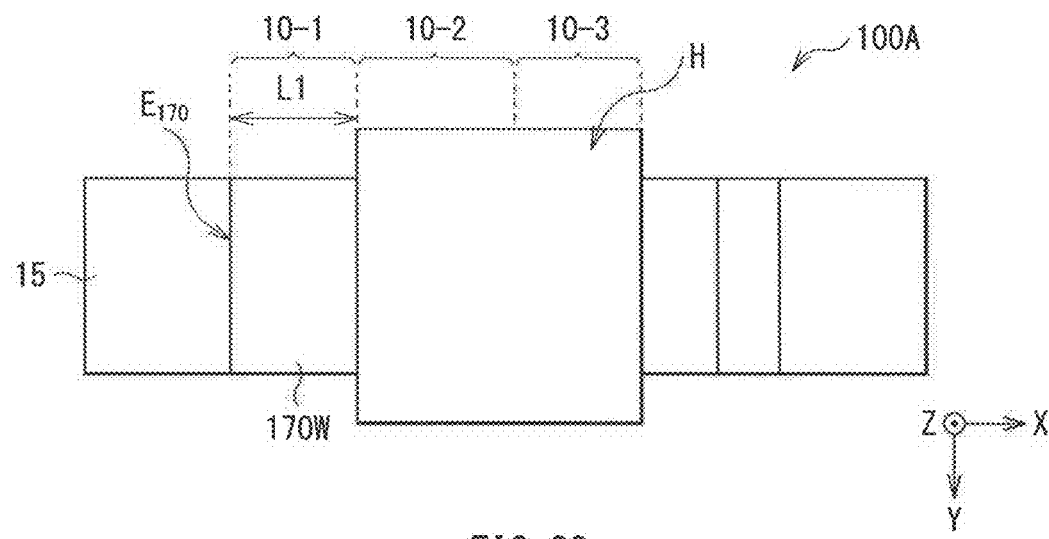

FIG. 28 is an explanatory schematic plan view of a distance from an end of a gate wiring line to a second region in the contact illustrated in FIG. 18.

Figure 29:
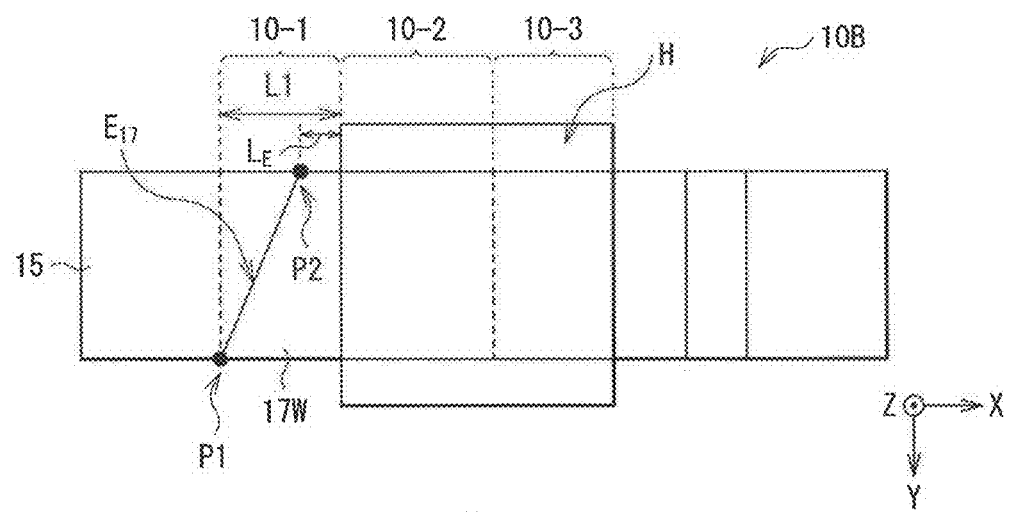

FIG. 29 is a schematic plan view of another example of the end of the gate wiring line illustrated in FIG. 26.

Figure 30:
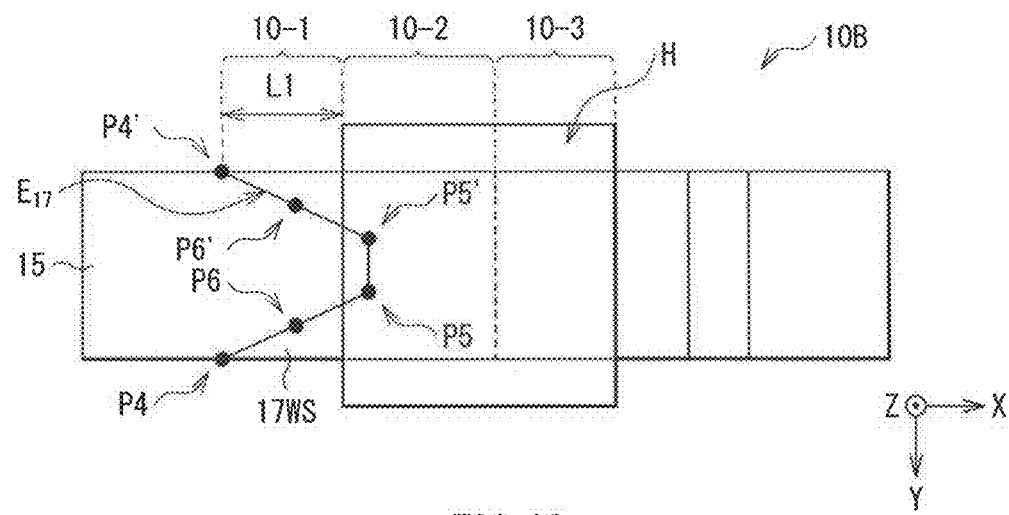

FIG. 30 is a schematic plan view of an outline configuration of a contact according to Modification Example 4.

Figure 31:
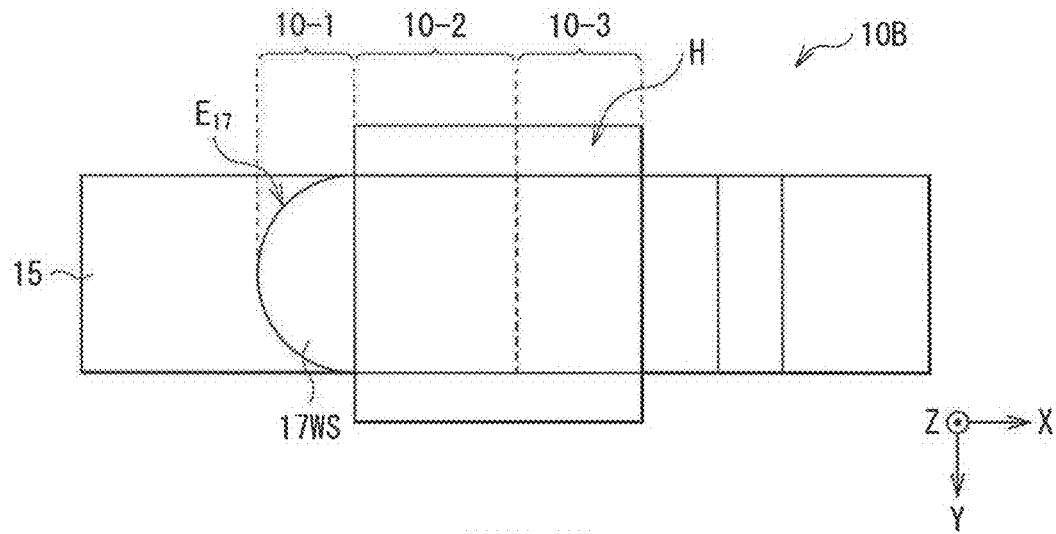

FIG. 31 is a schematic plan view of another example of a shape of an end of a gate wiring line illustrated in FIG. 30.

Figure 32:
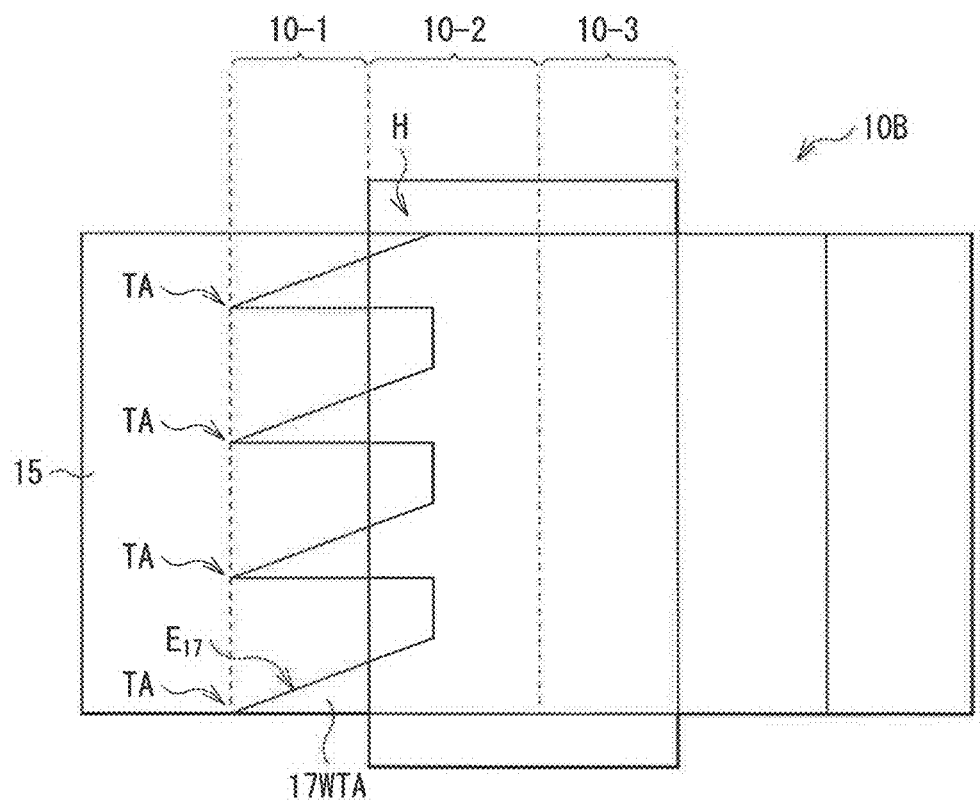

FIG. 32 is a schematic plan view of an outline configuration of a contact according to Modification Example 5.

Figure 33:
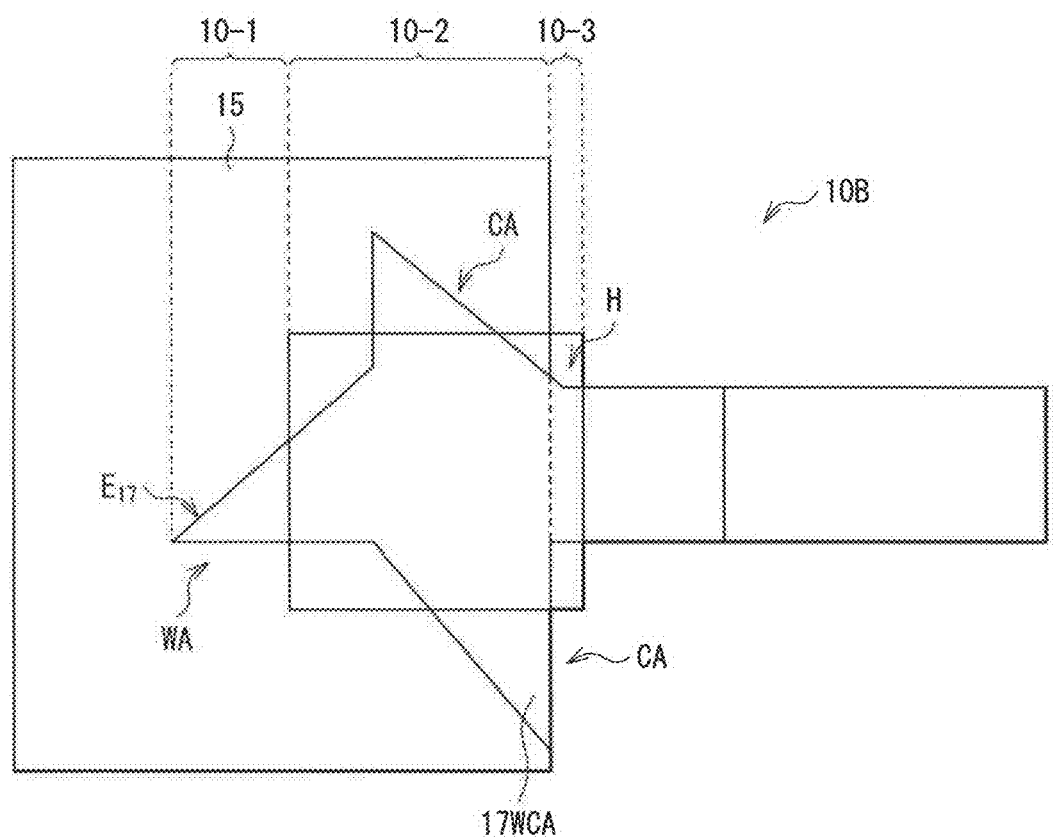

FIG. 33 is a schematic plan view of an outline configuration of a contact according to Modification Example 6.

Figure 34:
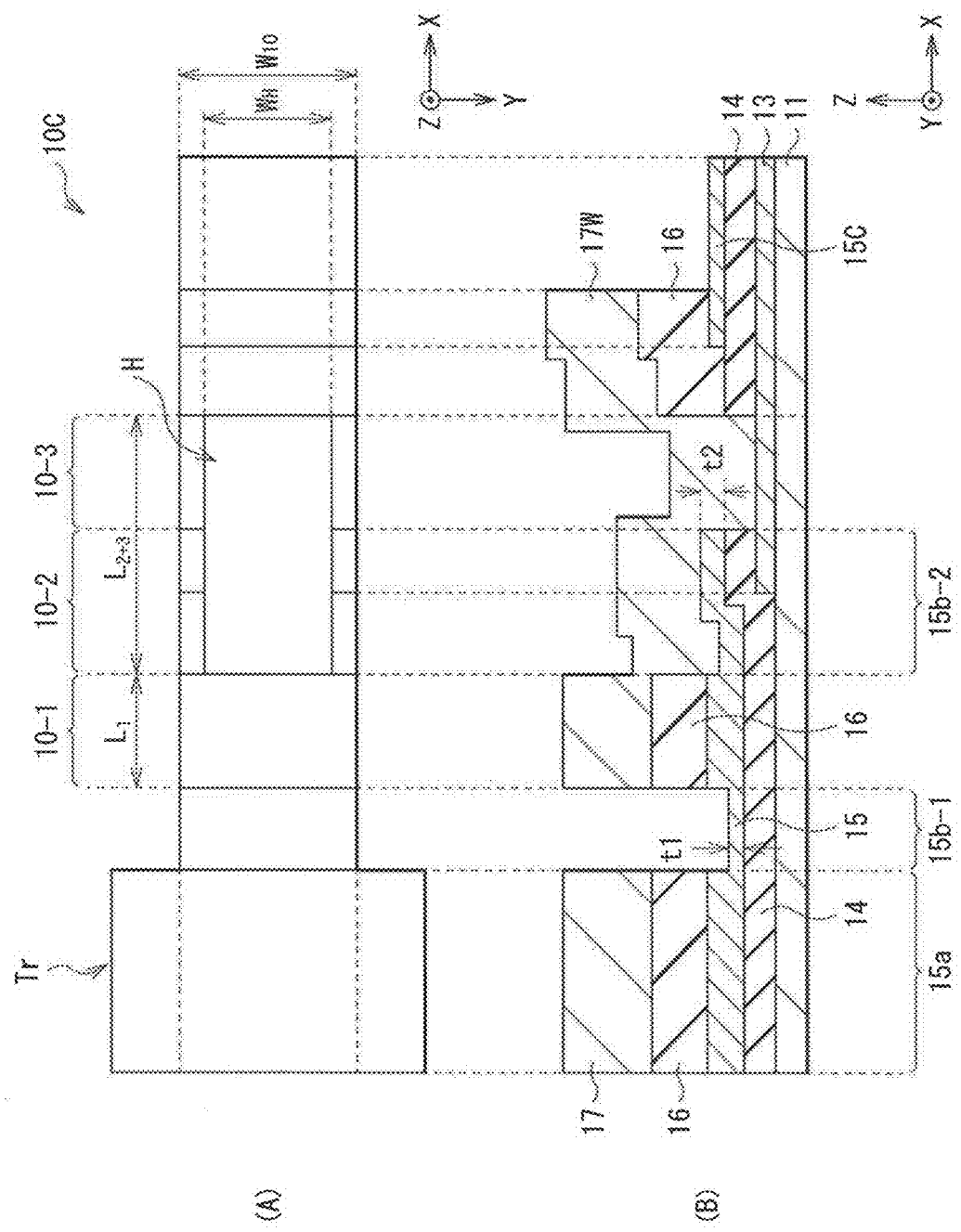

(A) of FIG. 34 is a plan view of a configuration of each of a transistor and a contact according to a fourth example embodiment, and (B) of FIG. 34 is a cross-sectional view thereof.

Figure 35:
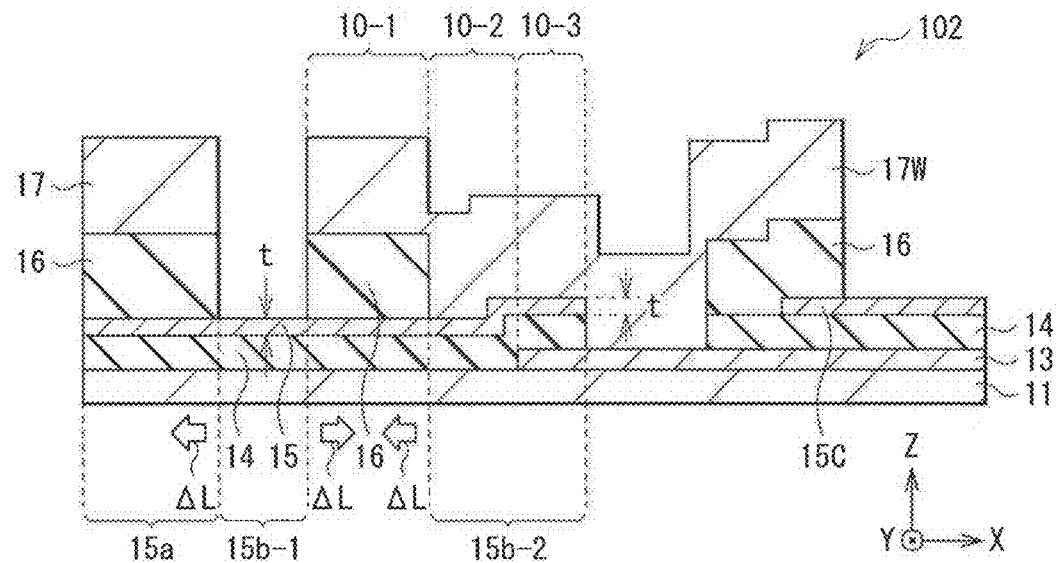

FIG. 35 is a schematic cross-sectional view of an outline configuration of a semiconductor device according to Comparative Example 3.

Figure 36:
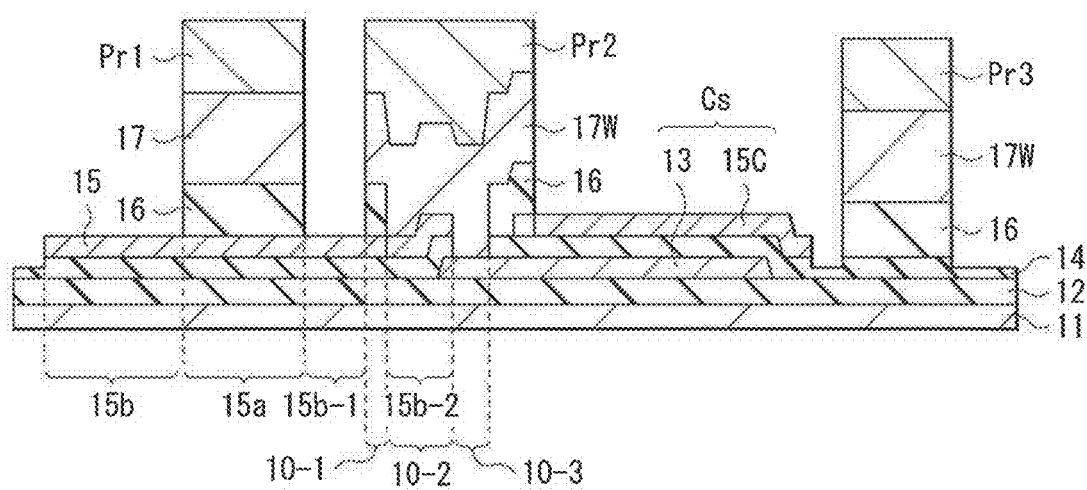

FIG. 36 is a schematic cross-sectional view of one process step of manufacture of the semiconductor device illustrated in FIG. 35.

Figure 37:
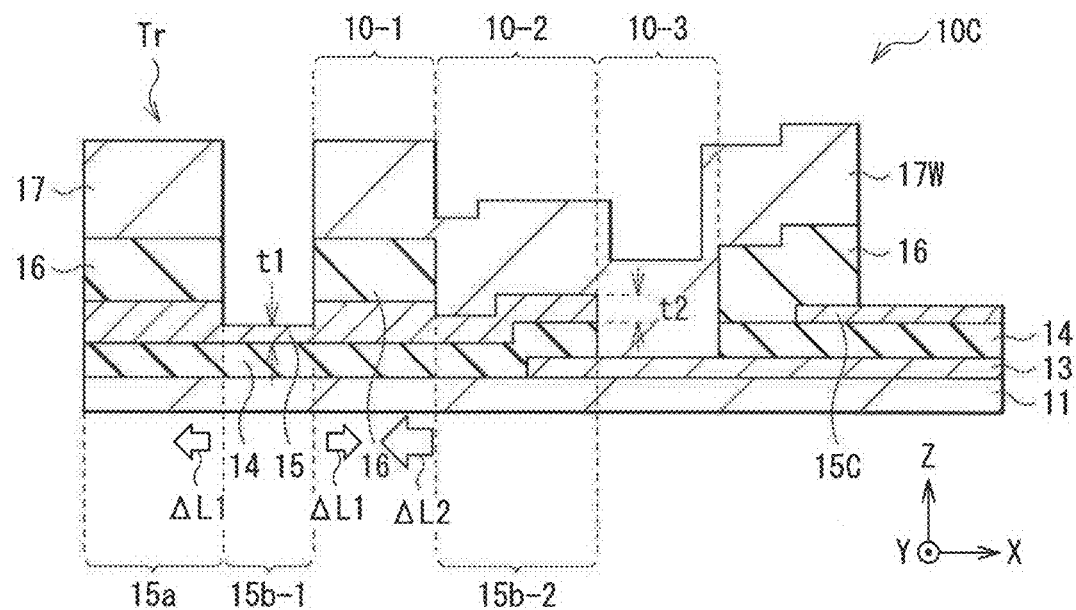

FIG. 37 is an explanatory schematic cross-sectional view of a diffusion distance of carriers of a semiconductor film illustrated in FIG. 34.

Figure 38:
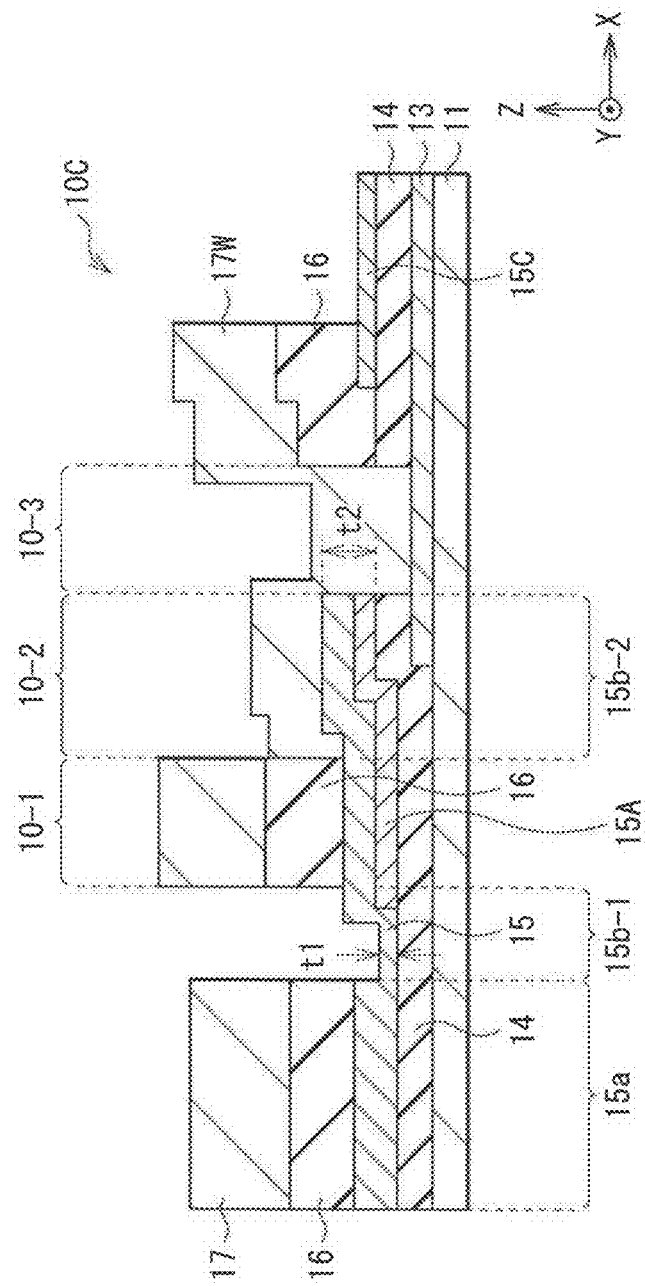

FIG. 38 illustrates a schematic cross-sectional view of an outline configuration of a contact according to Modification Example 7.

Figure 39:
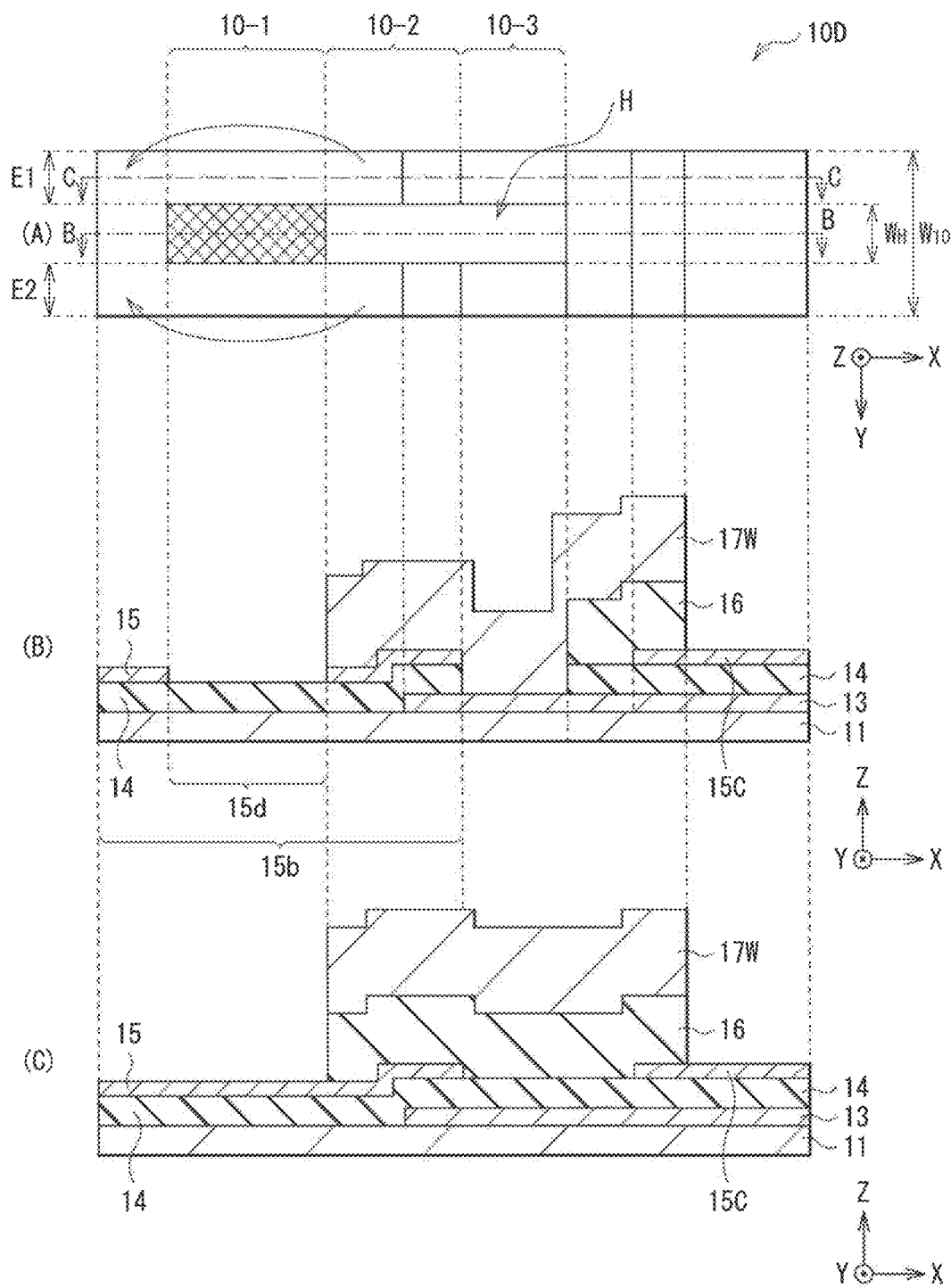

(A) of FIG. 39 is a plan view of a configuration of a contact according to a fifth example embodiment, (B) of FIG. 39 is a cross-sectional view thereof taken along a line B-B illustrated in (A) of FIG. 39, and (C) of FIG. 39 is a cross-sectional view thereof taken along a line C-C illustrated in (A) of FIG. 39.

Figure 40A:
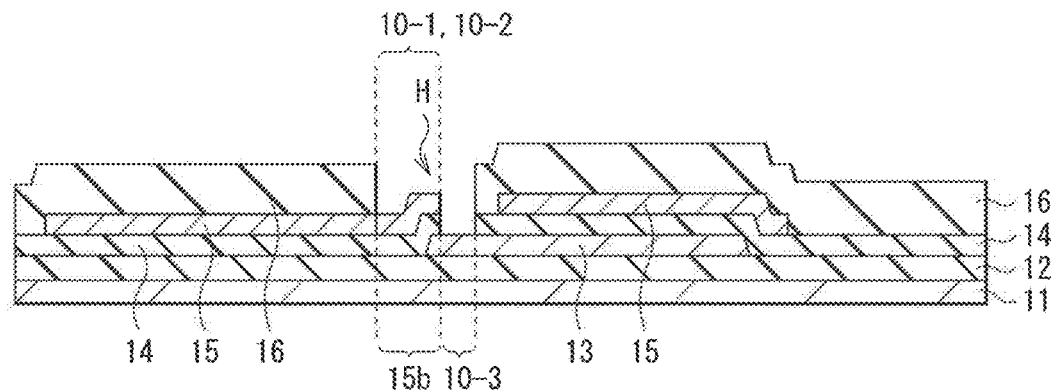

FIG. 40A is a schematic cross-sectional view of a process step subsequent to FIG. 3A.

Figure 40B:
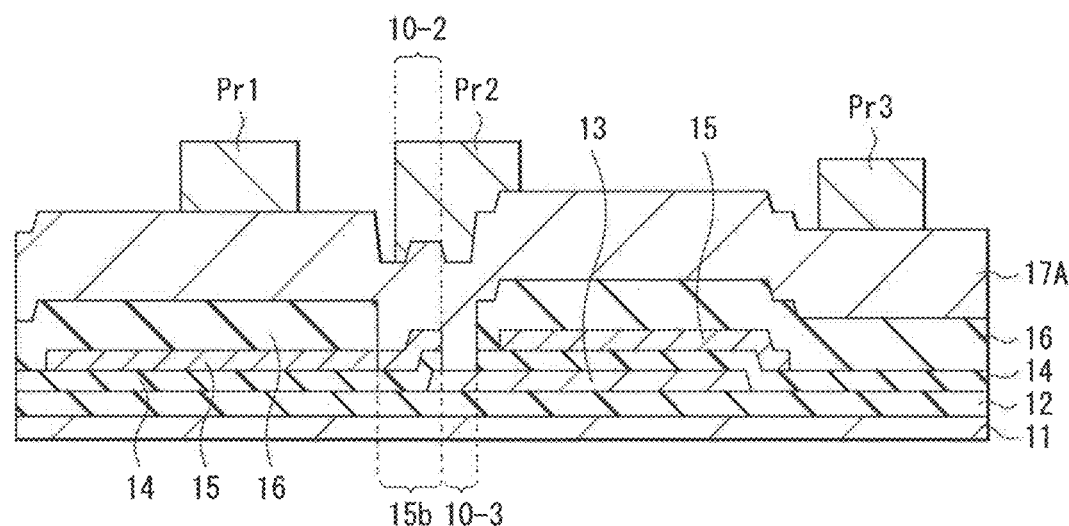

FIG. 40B is a schematic cross-sectional view of a process step subsequent to FIG. 40A.

Figure 41:
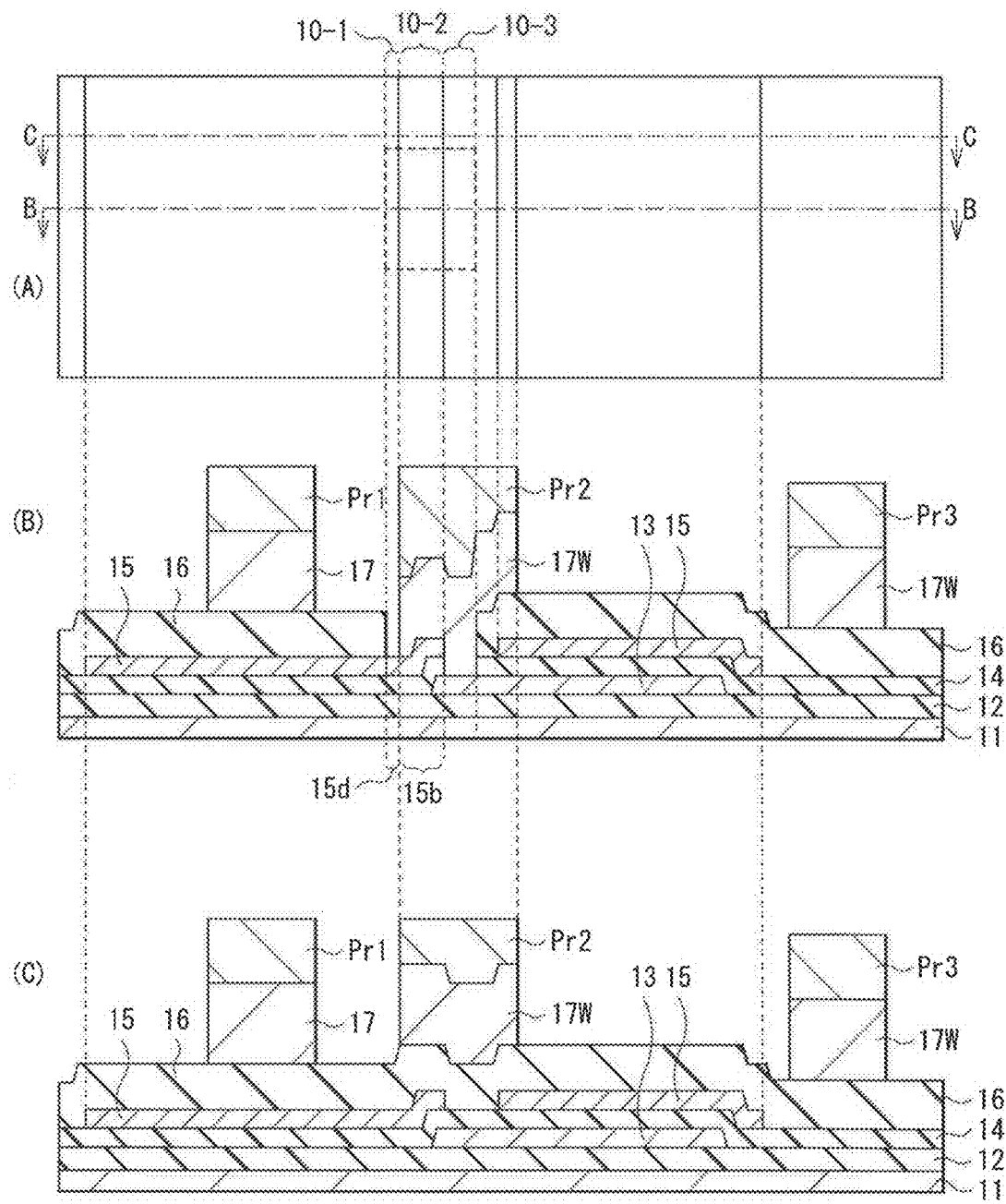

(A) of FIG. 41 is a schematic plan view of a process step subsequent to FIG. 40B, (B) of FIG. 41 is a cross-sectional view thereof taken along a line B-B illustrated in (A) of FIG. 41, and (C) of FIG. 41 is a cross-sectional view thereof taken along a line C-C illustrated in (A) of FIG. 41.

Figure 42:
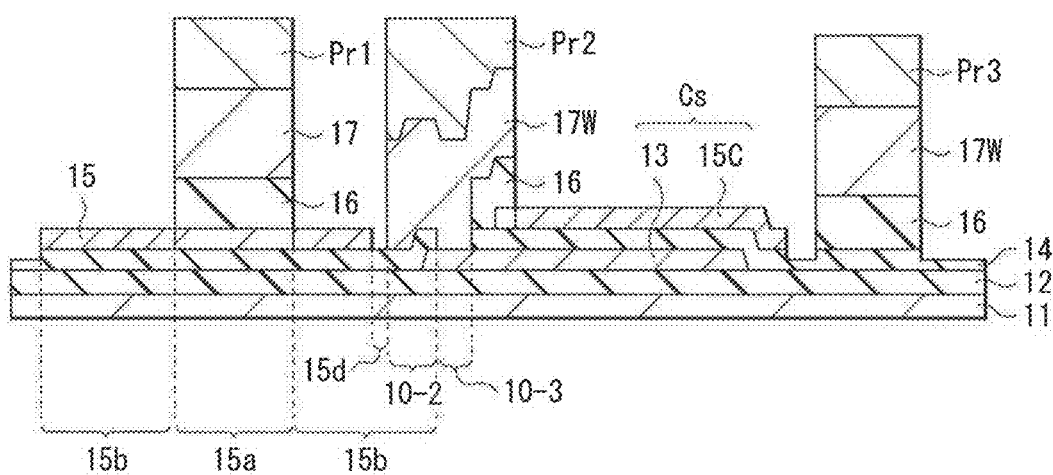

FIG. 42 is a schematic cross-sectional view of a process step subsequent to FIG. 41.

Figure 43:
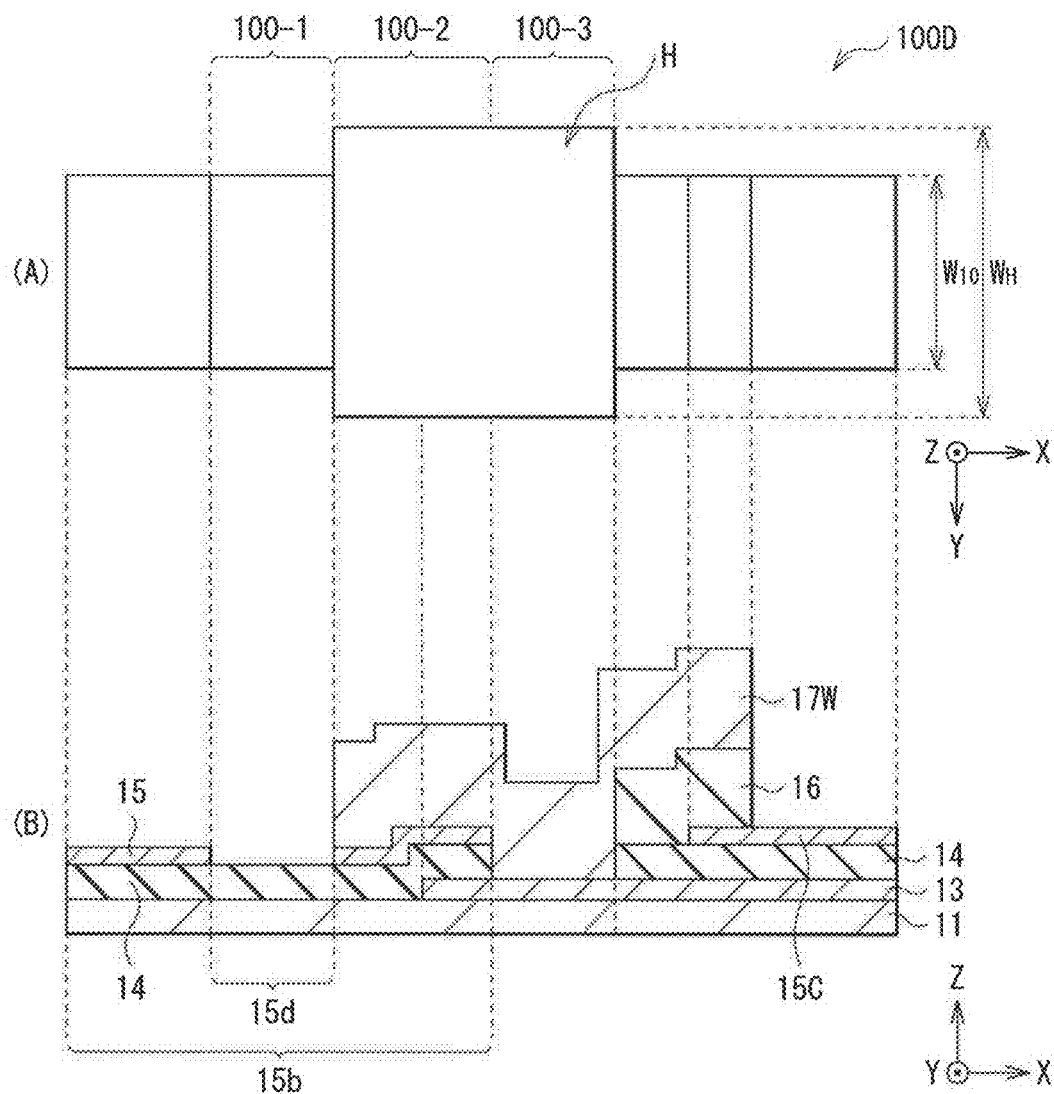

(A) of FIG. 43 is a schematic plan view of an outline configuration of a semiconductor device according to Comparative Example 4, and (B) of FIG. 43 is a schematic cross-sectional view thereof.

Figure 44:
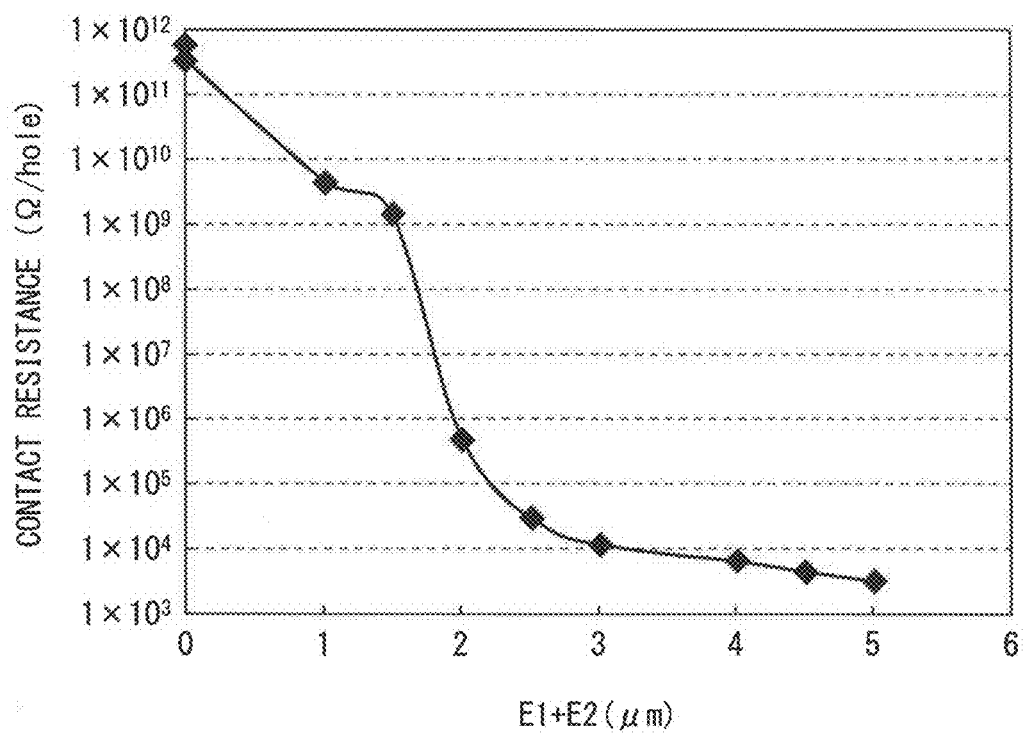

FIG. 44 illustrates a relationship between a size of paths of carriers illustrated in FIG. 39 and contact resistance.

Figure 45:
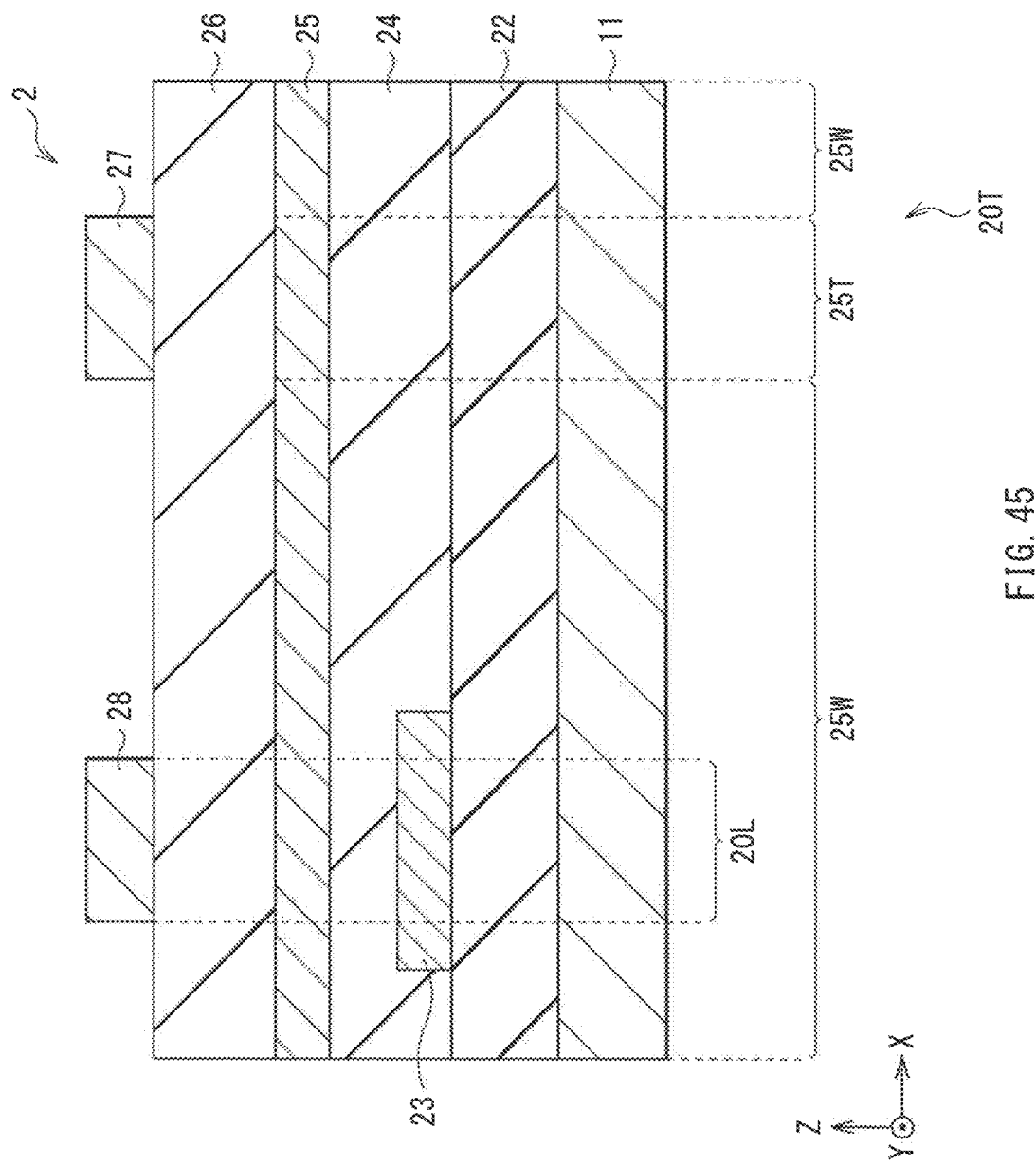

FIG. 45 is a schematic cross-sectional view of an outline configuration of a semiconductor device according to a sixth example embodiment of the technology.

Figure 46:
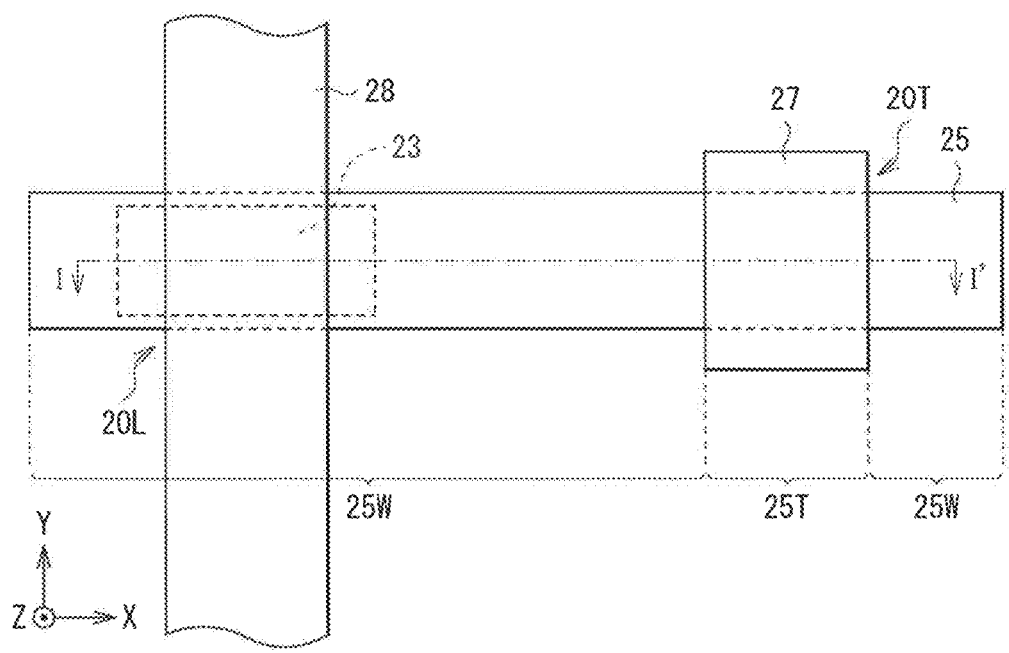

FIG. 46 is a schematic plan view of an outline configuration of the semiconductor device illustrated in FIG. 45.

Figure 47:
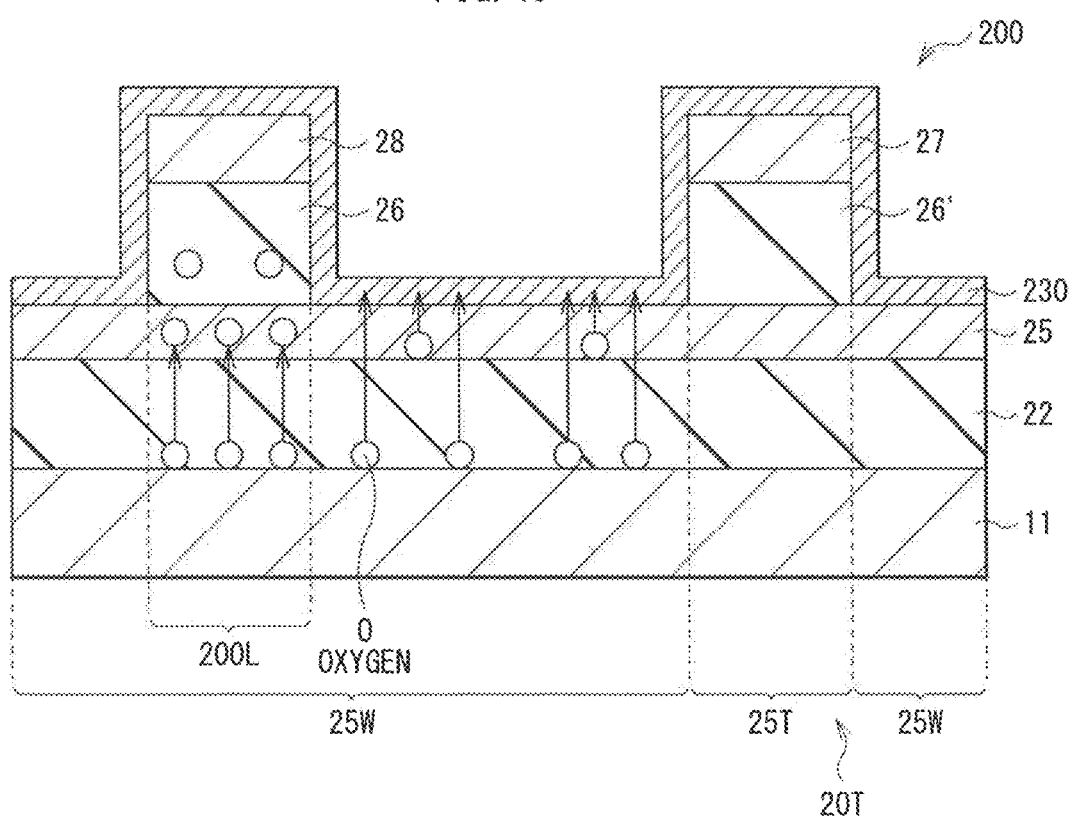

FIG. 47 is a schematic cross-sectional view of an outline configuration of a semiconductor device according to Comparative Example 5.

Figure 48:
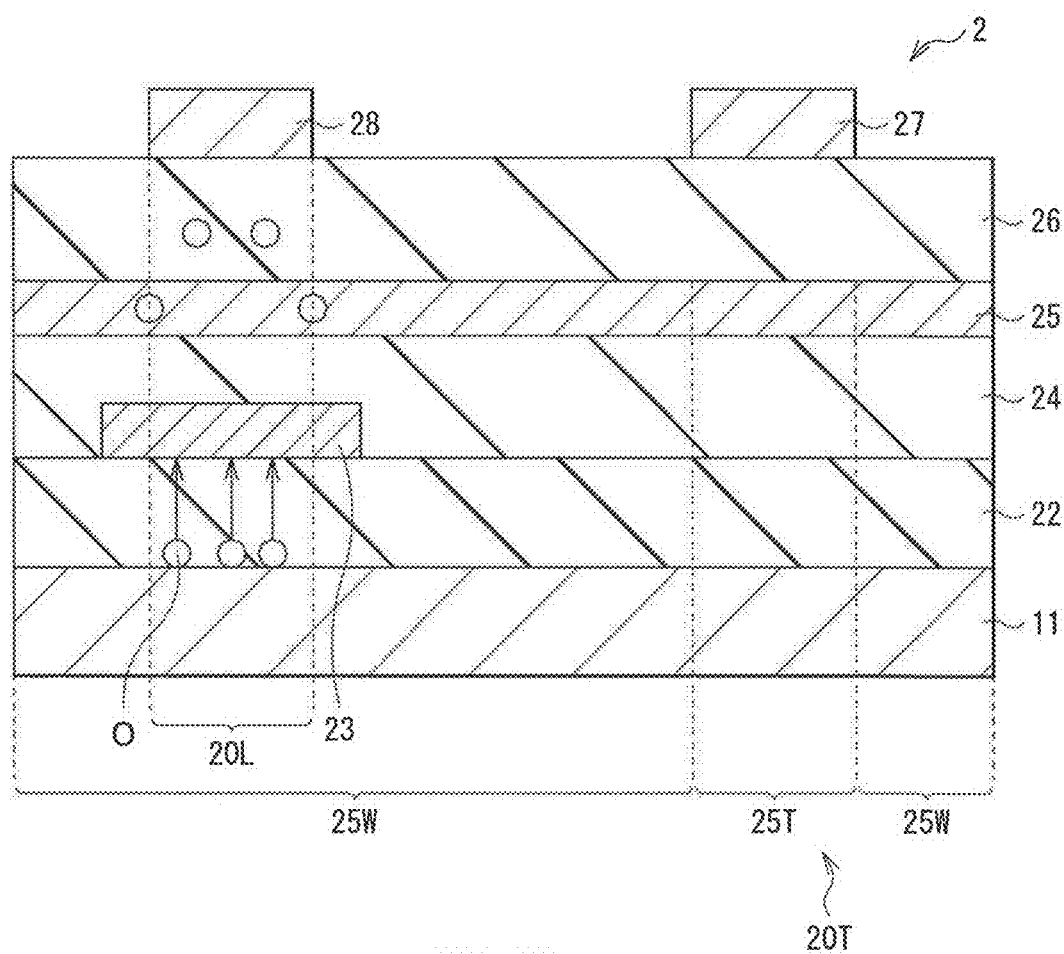

FIG. 48 is an explanatory schematic cross-sectional view of workings of the semiconductor device illustrated in FIG. 45.

Figure 49:
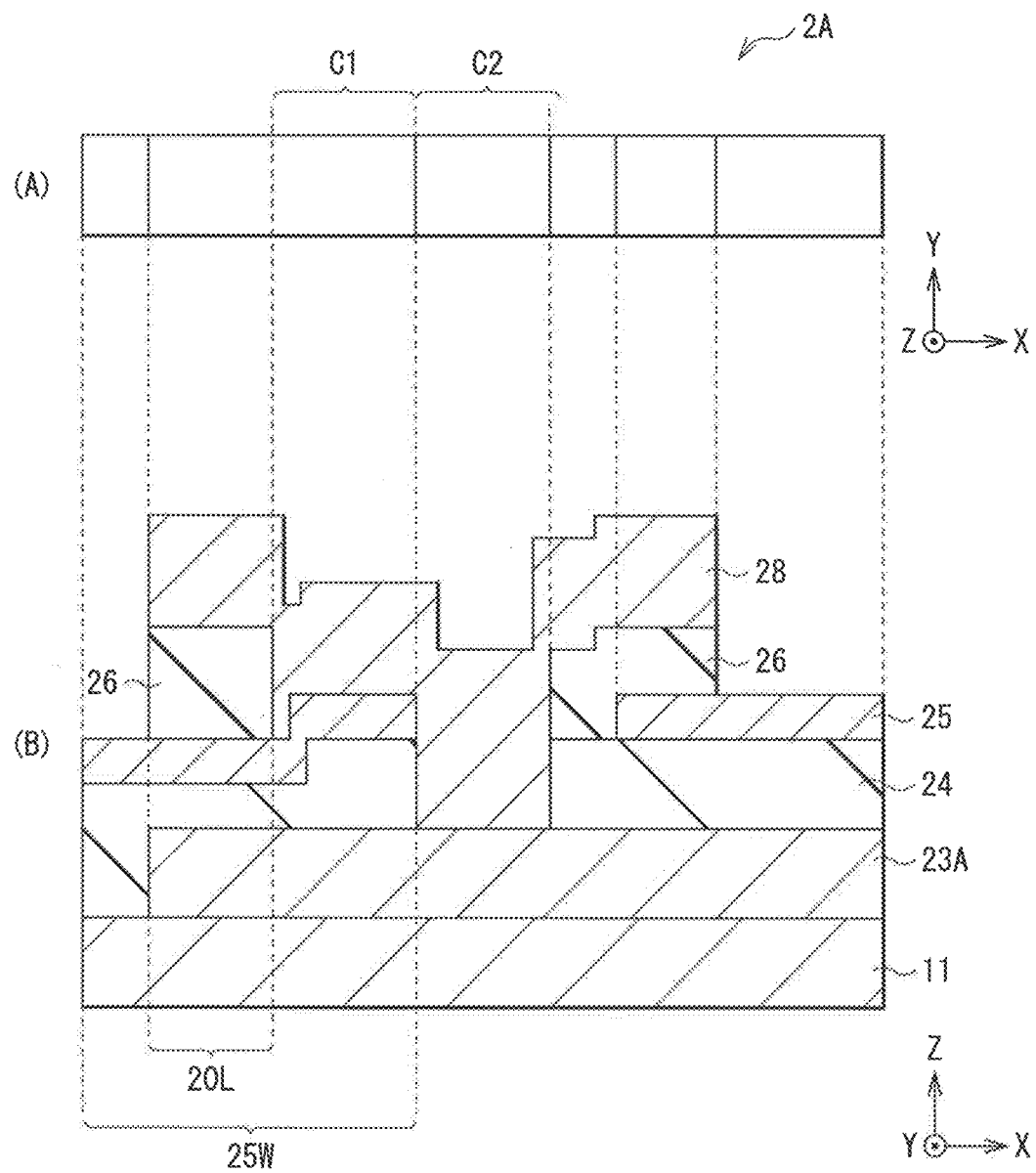

(A) of FIG. 49 is a schematic plan view of an outline configuration of a semiconductor device according to Modification Example 8, and (B) of FIG. 49 is a schematic cross-sectional view thereof.

Figure 50:
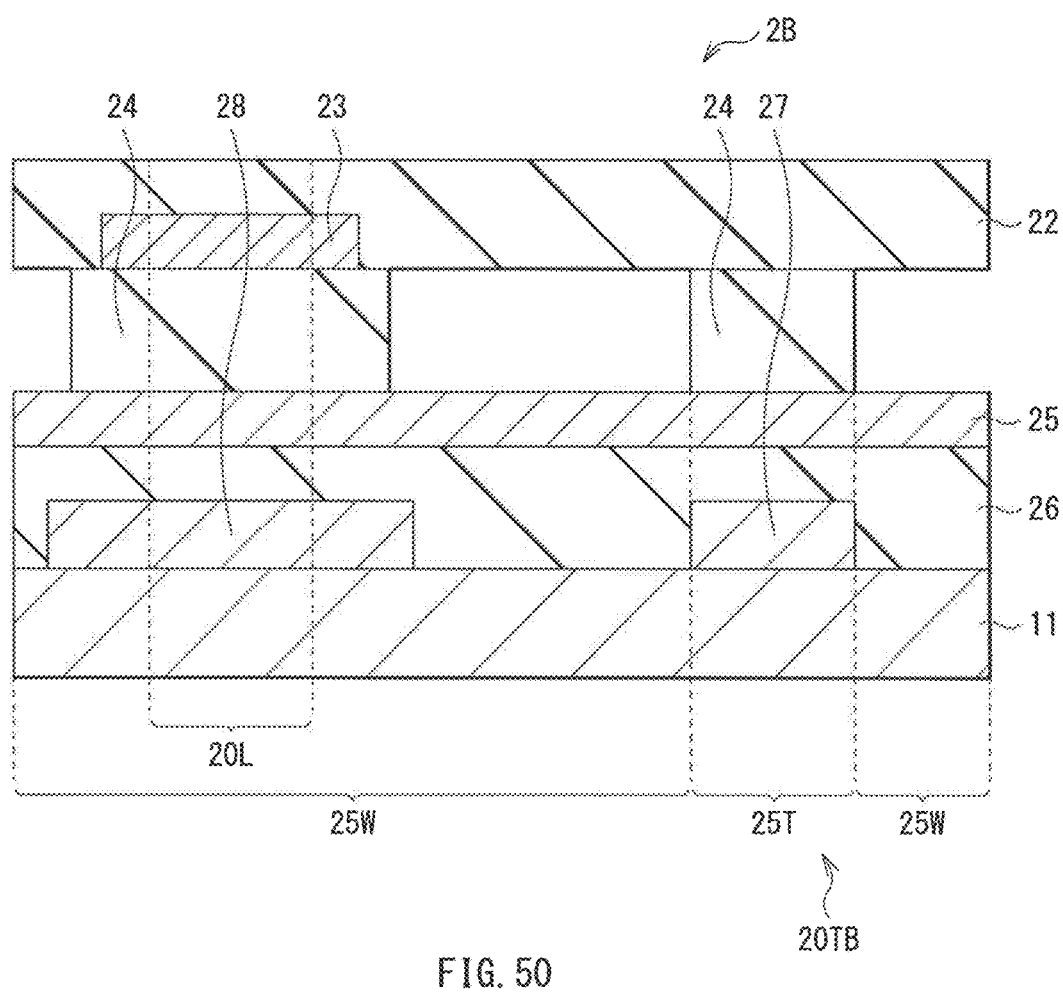

FIG. 50 is a schematic cross-sectional view of an outline configuration of a main part of a semiconductor device according to Modification Example 9.

Figure 51:
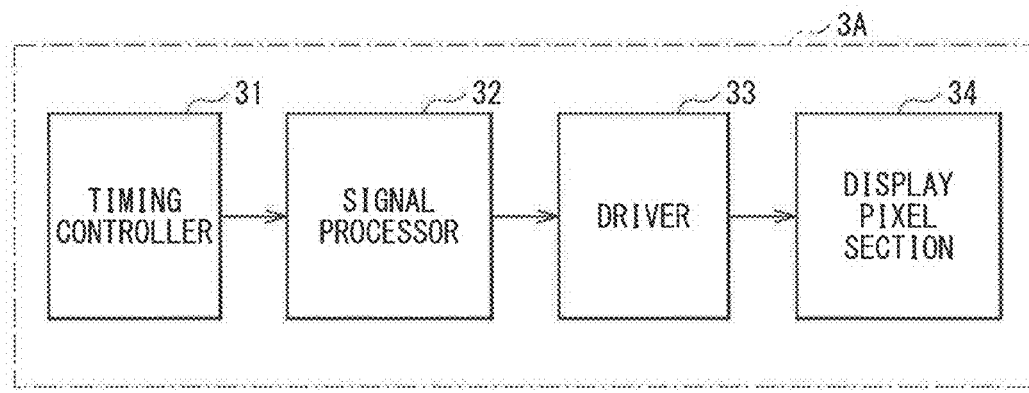

FIG. 51 is a block diagram illustrating a functional configuration of a display unit to which any one of the semiconductor devices illustrated in FIG. 1, etc. is applied.

Figure 52:
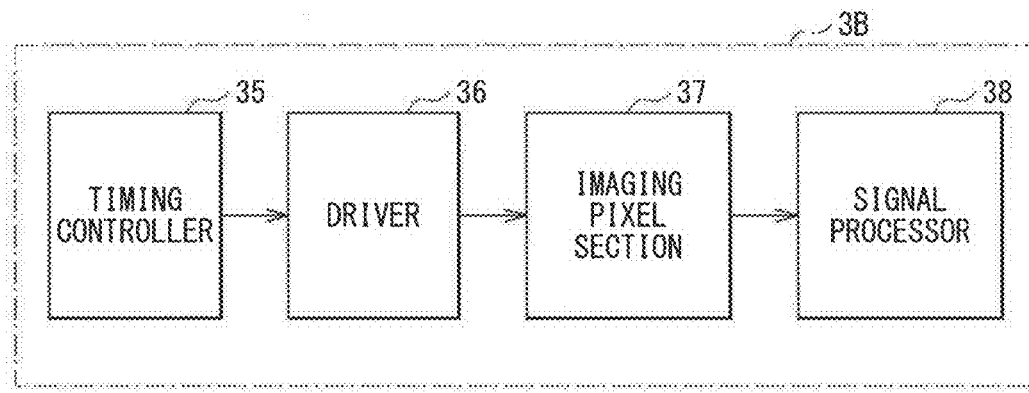

FIG. 52 is a block diagram illustrating a configuration of an imaging unit to which any one of the semiconductor devices illustrated in FIG. 1, etc. is applied.

Figure 53:
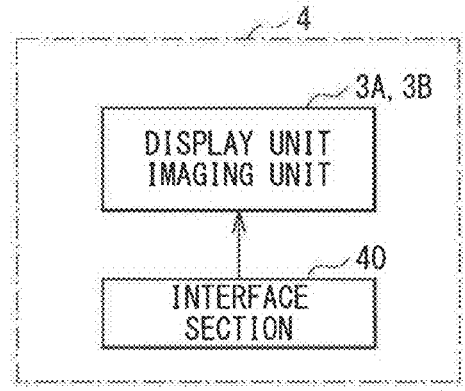

FIG. 53 is a block diagram illustrating a configuration of an electronic apparatus.

Figure 54:
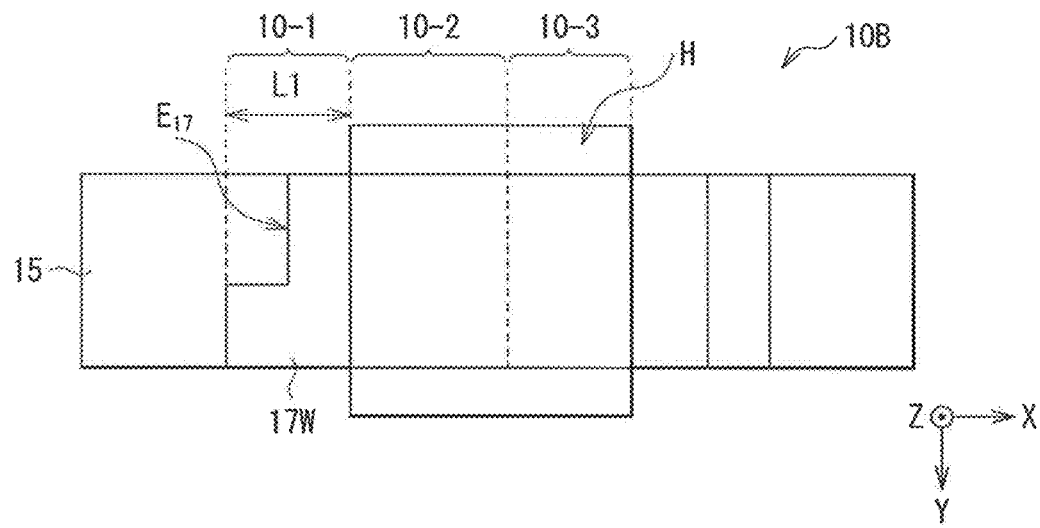

FIG. 54 is a schematic plan view of another example (1) of a shape of the end of the gate wiring line illustrated in FIG. 26.

Figure 55:
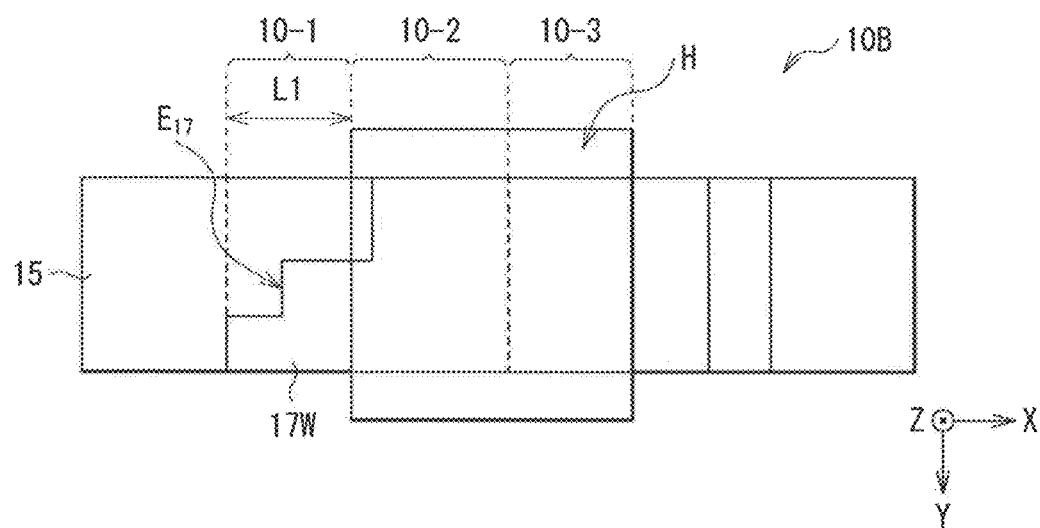

FIG. 55 is a schematic plan view of another example (2) of the shape of the end of the gate wiring line illustrated in FIG. 26.

Figure 56:
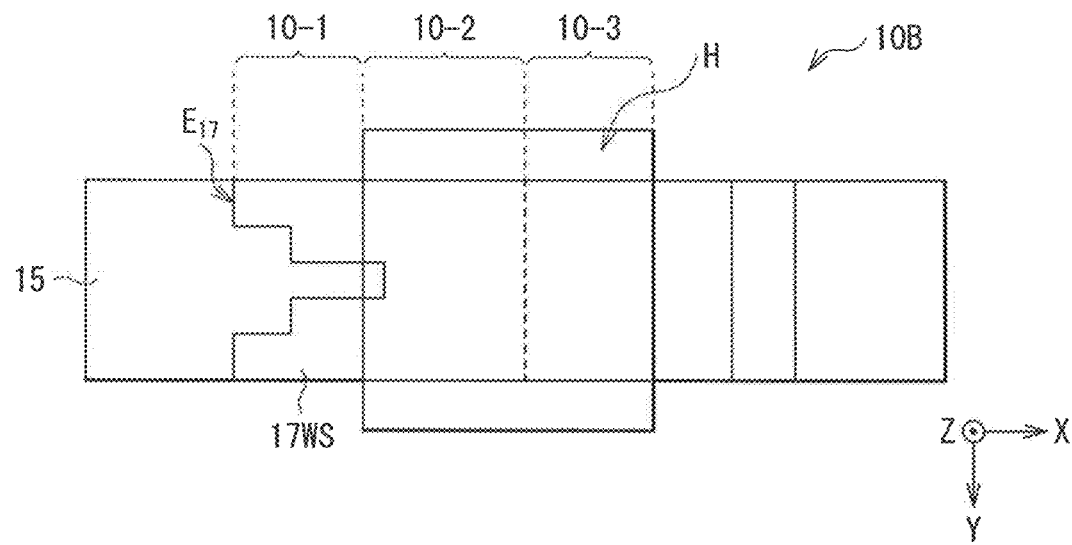

FIG. 56 is a schematic plan view of another example (3) of the shape of the end of the gate wiring line illustrated in FIG. 26.

Figure 57:
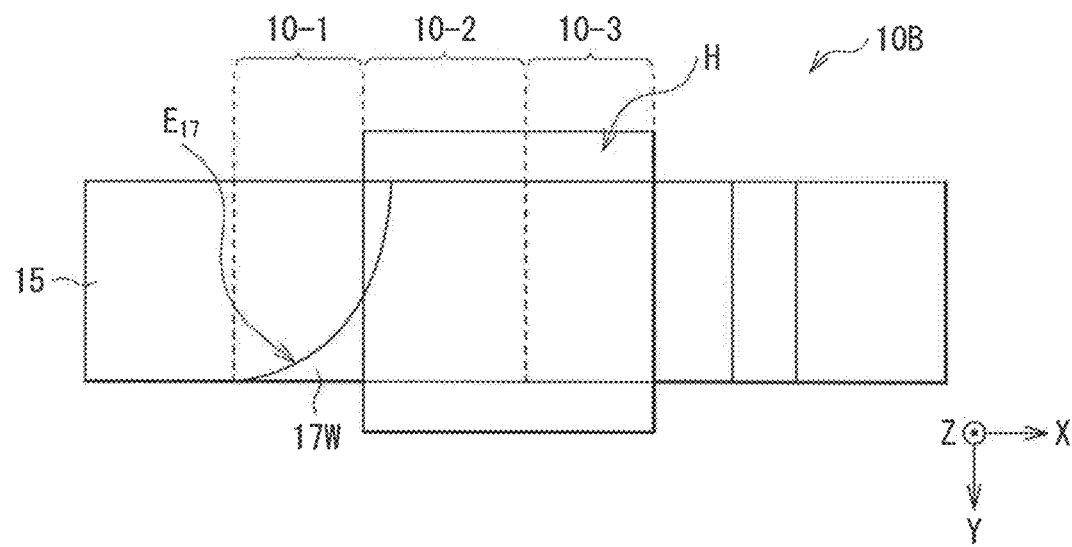

FIG. 57 is a schematic plan view of another example (4) of the shape of the end of the gate wiring line illustrated in FIG. 26.

Figure 58:
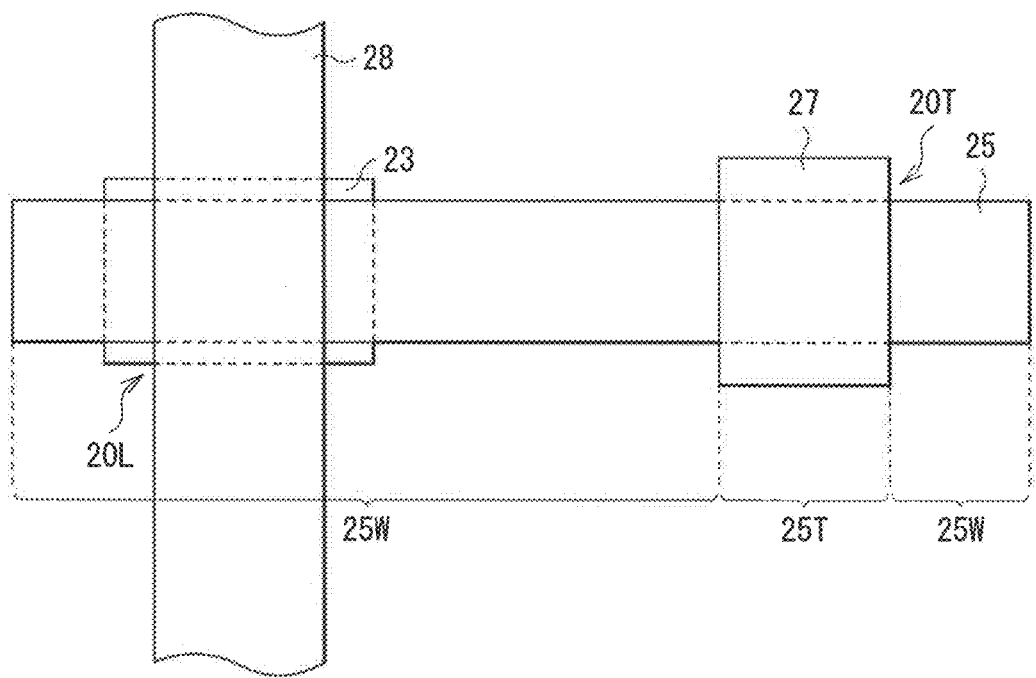

FIG. 58 is a schematic plan view of another example of the semiconductor device illustrated in FIG. 46.

DETAILED DESCRIPTION

Some example embodiments of the technology are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (An example of a semiconductor device including an insulating film between a first wiring line and a semiconductor film in a first region)

2. Modification Example 1 (An example in which a second wiring line extends to a first region)

3. Second Example Embodiment (An example of a semiconductor device in which a first wiring line has a width smaller than a width of a semiconductor film)

4. Modification Example 2 (An example in which a first wiring line has a comb-tooth-like planar shape)

5. Modification Example 3 (An example in which a first wiring line includes an added part outside a contact hole in a second region)

6. Third Example Embodiment (An example of a semiconductor device in which a distance from an end of a first wiring line to a second region varies continuously)

7. Modification Example 4 (An example in which every end of a first wiring line is disposed in a first region)

8. Modification Example 5 (An example in which a first wiring line in a first region has an axisymmetric planar shape)

9. Modification Example 6 (An example in which a first wiring line has a comb-tooth-like planar shape)

10. Modification Example 7 (An example in which a first wiring line includes an added part outside a contact hole in a second region)

11. Fourth Example Embodiment (An example of a semiconductor device in which a low-resistance region and a second region have a different thicknesses of a semiconductor film)

12. Modification Example 8 (An example in which a semiconductor film with a stacked structure is provided)

13. Fifth Example Embodiment (An example of a semiconductor device in which a second wiring line and a semiconductor film each have a width that is larger than a width of a contact hole)

14. Sixth Example Embodiment (An example of a semiconductor device in which an oxygen-permeation prevention film is provided in a stack)

15. Modification Example 9 (An example in which a portion of an oxygen-permeation prevention film constitutes a lower electrode of a storage capacitor element)

16. Modification Example 10 (An example in which a bottom-gate transistor is provided)

17. Application Example 1 (Examples of a display unit and an imaging unit)

18. Application Example 2 (An example of an electronic apparatus)

First Example Embodiment

[Configuration]

FIG. 1 schematically illustrates a cross-sectional configuration of a semiconductor device, i.e., a semiconductor device 1 according to an embodiment of the technology. The semiconductor device 1 may be used, for example, for a drive circuit of a unit such as a display unit and an imaging unit (e.g., a display unit 3A in FIG. 51 and an imaging unit 3B in FIG. 52 each described later). The semiconductor device 1 may be provided with a top-gate thin film transistor, i.e., a transistor Tr and a storage capacitor, i.e., a storage capacitor Cs. The transistor Tr and the storage capacitor Cs may be electrically coupled to each other by a contact 10.

The transistor Tr may include an undercoat (UC) film 12, a first insulating film 14, a semiconductor film 15, a second insulating film 16, and a gate electrode 17 in this order on a substrate 11. A source-drain electrode 21 may be electrically coupled to the semiconductor film 15, i.e., a low-resistance region 15b described later.

The storage capacitor Cs may include a lower electrode 13, i.e., a second wiring line and an upper electrode 15C on the substrate 11, with the UC film being interposed therebetween. The first insulating film 14 may be provided between the lower electrode 13 and the upper electrode 15C. The contact 10 may be provided with a gate wiring line 17W. The semiconductor film 15 and the lower electrode 13 may be electrically coupled via the gate wiring line 17W, i.e., a first wiring line. The semiconductor device 1 may include, on the gate electrode 17 and the gate wiring line 17W, a metal oxide film 18 and an interlayer insulating film 19 that are provided in this order. The source-drain electrode 21 may be provided on the interlayer insulating film 19, and may be coupled to the semiconductor film 15 via a contact hole that penetrates the interlayer insulating film 19 and the metal oxide film 18.

A region, of the semiconductor film 15, that faces the gate electrode 17 may be a channel region 15a of the transistor Tr. The low-resistance region 15b may be provided adjacent to the channel region 15a. The low-resistance region 15b has electric resistance lower than that of the channel region 15a.

The substrate 11 may be made of, for example, glass, quartz, and silicon. In an alternative embodiment, the substrate 11 may be made of, for example, a resin material such as polyethylene terephthalate (PET), polyimide (PI), polycarbonate (PC), and polyethylene naphthalate (PEN). Aside from these materials, a member in which a film made of an insulating material is formed on a metal substrate may be used as the substrate 11. The metal substrate may be a stainless steel (SUS) substrate without limitation.

The UC film 12 may be provided to prevent, for example, a substance such as a sodium ion from moving from the substrate 11 toward an upper layer. The UC film 12 may be made of an insulating material such as a silicon nitride (SiN) film and a silicon oxide (SiO) film. For example, in the UC film 12, a UC film 12A and a UC film 12B may be stacked in this order from a position close to the substrate 11. For example, the UC film 12A may be configured by a silicon nitride (SiN) film, and the UC film 12B may be configured by a silicon oxide (SiO) film. The UC film 12 may be provided throughout an entire surface of the substrate 11.

[Storage Capacitor Cs]

The lower electrode 13 may be provided in a selective region on the UC film 12. A portion of the lower electrode 13 may be exposed from the upper electrode 15C to extend to the contact 10. The lower electrode 13 may include metal such as molybdenum (Mo), tungsten (W), aluminum (Al), copper (Cu), silver (Ag), and titanium (Ti), for example. The lower electrode 13 may be made of an alloy, or may be configured by a stacked film including a plurality of metal films. The lower electrode 13 may be made of an electrically conductive material other than metal.

The first insulating film 14 may be interposed between the lower electrode 13 and the upper electrode 15C. The first insulating film 14 may be configured by, for example, an inorganic insulating film such as a silicon oxide ($SiO_x$) film, a silicon nitride ($SiN_x$) film, a silicon oxynitride (SiON) film, and an aluminum oxide ($AlO_x$) film.

The upper electrode 15C may face the lower electrode 13, with the first insulating film 14 being interposed therebetween. As described later, for example, the upper electrode 15C may be formed in the same process steps as those of the semiconductor film 15. The upper electrode 15C may include the same constituent material as that of the semiconductor film 15. The upper electrode 15C may have the same thickness as that of the low-resistance region 15b of the semiconductor film 15. For example, an oxide semiconductor material that is caused to have lower resistance may be used for the upper electrode 15C.

[Transistor Tr]

The semiconductor film 15 may be provided in a selective region on the first insulating film 14. The semiconductor film 15 may be configured by an oxide semiconductor that includes, as a main component, an oxide of one or more elements of indium (In), gallium (Ga), zinc (Zn), tin (Sn), titanium (Ti), and niobium (Nb) without limitation. Specific but non-limiting examples of the oxide that may be used for the semiconductor film 15 may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). The semiconductor film 15 may be made of another semiconductor material such as amorphous silicon, microcrystalline silicon, and polycrystalline silicon, or may be made of another semiconductor material of an organic semiconductor, for example. The semiconductor film 15 may have a thickness of 10 nm to 300 nm, for example, and, in one embodiment, may have a thickness of 60 nm or less. Decreased thickness of the semiconductor film 15 reduces an absolute amount of defect included in the semiconductor, thus suppressing a negative shift of a threshold voltage. Hence, it becomes possible to achieve superior transistor characteristics with a high ON/OFF ratio. Further, time necessary for film-formation of the semiconductor film 15 is reduced, thus allowing for enhancement in productivity.

The low-resistance region 15b of the semiconductor film 15 may be provided on both sides of the channel region 15a. The source-drain electrode 21 may be coupled to one of the low-resistance region 15b. The other of the low-resistance region 15 be may extend to the contact 10 to be coupled to the lower electrode 13 of the storage capacitor Cs via the gate wiring line 17W.

The second insulating film 16 provided between the semiconductor film 15 and the gate electrode 17 may serve as a gate insulating film. The second insulating film 16 may have the same shape, in a plan view, as that of the gate electrode 17. That is, the transistor Tr may be a thin film transistor having a self-aligned structure. The second insulating film 16 may be configured by, for example, a single film such as a silicon oxide ($SiO_x$) film, a silicon nitride ($SiN_x$) film, a silicon oxynitride (SiON) film, and an aluminum oxide ($AlO_x$) film, or may be configured by a stacked film of two or more thereof.

The gate electrode 17 on the second insulating film 16 may serve to control a carrier density in the channel region 15a by means of application of a gate voltage (Vg), and may serve as a wiring line that supplies an electric potential. Non-limiting examples of a constituent material of the gate electrode 17 may include a simple substance of one of titanium (Ti), tungsten (W), tantalum (Ta), aluminum (Al), molybdenum (Mo), silver (Ag), neodymium (Nd), and copper (Cu), and an alloy of any combination thereof. In an alternative embodiment, the gate electrode 17 may be a compound that includes one or more of the above-mentioned materials, or a stacked film that includes two or more thereof. Further, for example, a transparent electrically conductive film made of a material such as ITO may also be used.

The metal oxide film 18 may be provided throughout the entire surface of the substrate 11, for example. The metal oxide film 18 may cover the gate electrode 17 and the gate wiring line 17W, and may be in contact with the low-resistance region 15b of the semiconductor film 15. For example, an aluminum oxide ($Al_2O_3$) film may be used for the metal oxide film 18. Provision of such a metal oxide film 18 that is in contact with the low-resistance region 15b makes it possible to stably maintain electric resistance of the low-resistance region 15b.

The interlayer insulating film 19 may be provided throughout the entire surface of the substrate 11, for example. The interlayer insulating film 19 may be configured by, for example, a stacked film in which an interlayer insulating film 19A, an interlayer insulating film 19B, and an interlayer insulating film 19C are stacked in this order from a position close to the metal oxide film 18. For example, a silicon oxide ($SiO_2$) film may be used for the interlayer insulating film 19A. A film such as a silicon nitride (SiN) film and a silicon oxynitride (SiON) film may also be used for the interlayer insulating film 19A. For example, an aluminum oxide ($Al_2O_3$) film may be used for the interlayer insulating film 19B. For example, a photo-sensitive resin film may be used for the interlayer insulating film 19C. In a specific but non-limiting example, the interlayer insulating film 19C may be configured by a polyimide resin film, for example. A resin such as novolak resin or acrylic resin may also be used for the interlayer insulating film 19C.

The source-drain electrode 21 may serve as a source or a drain of the transistor Tr. The source-drain electrode 21 may include, for example, metal or a transparent electrically conductive film similar to those listed as a constituent material of the above-described gate electrode 17. In one embodiment, a material having good electrical conductivity may be selected as the source-drain electrode.

[Contact 10]

Description is given of a configuration of the contact 10 with reference to FIG. 2. (A) of FIG. 2 illustrates a planar configuration of the contact 10, and (B) of FIG. 2 illustrates a cross-sectional configuration of the contact 10. The contact 10 may include a first region 10-1, a second region 10-2, and a third region 10-3 that are provided adjacently in order from a position close to the transistor Tr, in a direction in which the wiring lines extend (i.e., in a direction in which the transistor Tr and the storage capacitor Cs are arranged; in X-direction in FIG. 2). A contact hole H may be provided in the second region 10-2 and the third region 10-3. The semiconductor film 15 and the gate wiring line 17W may be in contact with each other in the second region 10-2. The lower electrode 13 and the gate wiring line 17W may be in contact with each other in the third region 10-3. In FIG. 2, illustration of the UC film 12 is omitted.

The first region 10-1 may include, on the substrate 11, the UC film 12, the first insulating film 14, the semiconductor film 15, the second insulating film 16, and the gate wiring line 17W that are provided in this order. That is, in the first region 10-1, the semiconductor film 15 may be covered with the second insulating film 16. Although the detail is described later, in the present example embodiment, the provision of such a first region 10-1 suppresses an influence on the semiconductor film 15 upon formation of a layer above the semiconductor film 15, thus making it possible to enhance contact stability.

In the first region 10-1, the second insulating film 16 and the gate wiring line 17W may be provided on the semiconductor film 15, which appears to exhibit characteristics similar to those of the transistor. However, the semiconductor film 15 in the first region 10-1 serves as a conductor. One reason for this is that carriers with high concentration in the low-resistance region 15b are diffused to the first region 10-1 owing to the low-resistance region 15b provided in at least one portion of the semiconductor film 15. For example, in the semiconductor film 15, both regions adjacent to the first region 10-1, i.e., a region on side of the transistor Tr and the second region 10-2 may be the low-resistance region 15b. The semiconductor film 15 may be provided in the first region 10-1 and the second region 10-2, out of the contact 10.

The second insulating film 16 may be provided only in the first region 10-1 of the contact 10. In other words, a region in which the second insulating film 16 is provided may be the first region 10-1. The second insulating film 16 in the first region 10-1 may be formed in the same process steps as those of the second insulating film 16 of the transistor Tr. That is, the second insulating film 16 in the first region 10-1 may be made of the same material and may have the same thickness as those of the second insulating film 16 (i.e., the gate insulating film) of the transistor Tr. In one embodiment, a length L1 of the first region 10-1 in X-direction, i.e., a length of the second insulating film 16 in X-direction may be 2 µm or less, in order to enhance electric conductivity of the semiconductor film 15 in the first region 10-1.

The gate wiring line 17W may be provided throughout the first region 10-1, the second region 10-2, and the third region 10-3 of the contact 10. An end surface of the gate wiring line 17W in the first region 10-1 may be provided at the same position, in a plan view, as an end surface of the second insulating film 16. The gate wiring line 17W may be formed in the same process steps as those of the gate electrode 17 of the transistor Tr. That is, the gate wiring line 17W may be made of the same material and may have the same thickness as those of the gate electrode 17 of the transistor Tr.

The second region 10-2 may include, on the substrate 11, the UC film 12, the first insulating film 14, the semiconductor film 15, and the gate wiring line 17W that are provided in this order. That is, in the second region 10-2, the semiconductor film 15 and the gate wiring line 17W may be in contact with each other via the contact hole H provided in the second insulating film 16.

The third region 10-3 may include, on the substrate 11, the UC film 12, the lower electrode 13, and the gate wiring line 17W that are provided in this order. That is, in the third region 10-3, the lower electrode 13 and the gate wiring line 17W may be in contact with each other via the contact hole H provided in the first insulating film 14 and the second insulating film 16. The lower electrode 13 may extend to a portion of the second region 10-2 from the third region 10-3, for example. In the second region 10-2, the first insulating film 14 may be provided between the lower electrode 13 and the semiconductor film 15.

The lower electrode 13, the semiconductor film 15, and the gate wiring line 17W may each have a width (i.e., a size in Y-direction; a wiring line width $W_{10}$) of 5 µm or less, for example. The wiring line width $W_{10}$ denotes a size of each of the lower electrode 13, the semiconductor film 15, and the gate wiring line 17W in a direction orthogonal to a current flow. The contact hole H may have a width (i.e., a size in Y-direction; a width $W_H$) of 3 µm, for example. The contact hole H may have a length (i.e., a size in X-direction; a length $L_{2+3}$) of 4 µm, for example. The width $W_H$ denotes a size of the contact hole H in the direction orthogonal to the current flow, and the length $L_{2+3}$ denotes a size of the contact hole H in a direction parallel to the current flow.

As illustrated in FIG. 3, the width $W_H$ of the contact hole H may be larger than the wiring line width $W_{10}$. As described later, in the semiconductor device 1, reduction in film thickness of the semiconductor film 15 is suppressed in the contact 10, thus enabling the semiconductor film 15 and the lower electrode 13 to be stably coupled to each other even when the width $W_H$ of the contact hole H is larger than the wiring line width $W_{10}$. Hence, an embodiment of the technology is suitably applicable to a high-definition semiconductor device having the small wiring line width $W_{10}$.

The gate wiring line 17W may be provided, for example, in a region other than the contact 10. The second insulating film 16 having the same shape, in a plan view, as that of the gate wiring line 17W may be provided between the gate wiring line 17W and the first insulating film 14.

[Manufacturing Method]

The semiconductor device 1 as described above may be manufactured, for example, as follows, as illustrated in FIGS. 4A to 5B.

As illustrated in FIG. 4A, first, there may be formed, on the substrate 11, the UC film 12, the lower electrode 13, the first insulating film 14, the semiconductor film 15, and the second insulating film 16 that are provided in this order. In a specific but non-limiting example, formation may be performed as follows. First, the UC film 12 may be formed on the entire surface of the substrate 11. Next, for example, a metal film may be formed on the UC film 12. The metal film may be patterned into a predetermined shape by means of dry etching to form the lower electrode 13. Subsequently, the first insulating film 14 may be formed throughout the entire surface of the substrate 11 to cover the lower electrode 13. Next, for example, a film of an oxide semiconductor material may be formed on the first insulating film 14 by means of a sputtering method, for example, following which the film of the oxide semiconductor material may be patterned into a predetermined shape by means of photolithography and etching, for example, to form the semiconductor film 15. Thereafter, the second insulating film 16 may be formed throughout the entire surface of the substrate 11 to cover the semiconductor film 15.

After the formation of the second insulating film 16, the second insulating film 16, provided in the second region 10-2 and the third region 10-3, and the first insulating film 14, provided in the third region 10-3, may be removed selectively to form the contact hole H, as illustrated in FIG. 4B. The contact hole H may be formed using dry etching, for example. In this situation, the semiconductor film 15 in the second region 10-2 may be subjected to the dry etching, and thus the low-resistance region 15b may be formed in the second region 10-2.

After the formation of the contact hole H, an electrically conductive film 17A made of, for example, a metal material may be formed throughout the entire surface of the substrate 11. Subsequently, photoresists Pr1, Pr2, and Pr3 each having a predetermined pattern may be formed on the electrically conductive film 17A, as illustrated in FIG. 4C. The photoresist Pr1 may be provided to form the gate electrode 17 and the second insulating film 16 of the transistor Tr. The photoresist Pr2 may be provided to form the gate wiring line 17W and the second insulating film 16 (i.e., the first region 10-1) of the contact 10. The photoresist Pr3 may be provided to form the gate wiring line 17W and the second insulating film 16 in the region other than the contact 10.

The photoresists Pr1, Pr2, and Pr3 may be used to successively perform patterning of the electrically conductive film 17A and the second insulating film 16, as illustrated in FIGS. 5A and 5B. As illustrated in FIG. 5A, first, the electrically conductive film 17A may be patterned using dry etching to form the gate electrode 17 and the gate wiring line 17W. In the present example embodiment, the semiconductor film 15 in the first region 10-1 may be covered with the second insulating film 16 in this situation, and thus the semiconductor film 15 may not be subjected to the dry etching. Consequently, the semiconductor film 15 in the first region 10-1 may not undergo reduction in film thickness, and may be present to have a predetermined thickness. After the formation of the gate electrode 17 and the gate wiring line 17W, patterning of the second insulating film 16 may be performed subsequently. This allows for formation of the second insulating film 16 having the same shape, in a plan view, as that of the gate electrode 17, the second insulating film 16 in the first region 10-1, and the second insulating film 16 having the same shape, in a plan view, as that of the gate wiring line 17W. In this situation, a region, of the semiconductor film 15, that is exposed from the second insulating film 16 may be caused to have lower resistance by the dry etching to form the low-resistance region 15b of the transistor Tr and the upper electrode 15C of the storage capacitor Cs.

Thereafter, the metal oxide film 18 and the interlayer insulating film 19 may be formed throughout the entire surface of the substrate 11. Finally, the source-drain electrode 21 may be formed on the interlayer insulating film 19 to complete the semiconductor device 1 illustrated in FIG. 1.

Workings and Effects

In the semiconductor device 1 of the present example embodiment, when an ON voltage equal to or higher than a threshold voltage is applied to the gate electrode 17, the channel region 15a of the semiconductor film 15 may be activated. This causes a current to flow across a pair of low-resistance regions 15b. Accordingly, in the contact 10, the current flows from the semiconductor film 15 to the lower electrode 13 via the gate wiring line 17W to cause an electric charge to be stored in the storage capacitor Cs.

In the semiconductor device 1 of the present example embodiment, the first region 10-1 having the second insulating film 16 on the semiconductor film 15 may be provided in the contact 10. This allows for suppression of an influence on the semiconductor film 15 upon formation of a layer above the semiconductor film 15, as described below referring to a comparative example.

FIG. 6 is a schematic cross-sectional configuration of a semiconductor device, i.e., a semiconductor device 101 according to Comparative Example 1. A contact, i.e., a contact 100 of the semiconductor device 101 has a second region, i.e., a second region 100-2 and a third region, i.e., a third region 100-3 that are adjacent to each other. In the second region 100-2, the gate wiring line 17W and the semiconductor film 15 are in contact with each other. In the third region 100-3, the gate wiring line 17W and the lower electrode 13 are in contact with each other. In a region between the second region 100-2 and the gate electrode 17, the second insulating film 16 on the semiconductor film 15 is removed. In other words, no first region (e.g., the first region 10-1 in FIG. 2) is provided in the contact 100.

Such a semiconductor device 101 is formed, for example, as follows, as illustrated in FIGS. 7A to 7C.

In a manner similar to that described for the semiconductor device 1, first, there are formed, on the substrate 11, the UC film 12, the lower electrode 13, the first insulating film 14, the semiconductor film 15, the second insulating film 16, and the electrically conductive film 17A.

Next, photoresists Pr1, Pr102, and Pr3 each having a predetermined pattern are formed on the electrically conductive film 17A, as illustrated in FIG. 7A. The photoresist Pr102 is provided to form the gate wiring line 17W of the contact 10. The photoresists Pr1, Pr102, and Pr3 are used to perform patterning of the electrically conductive film 17A and the second insulating film 16, as illustrated in FIGS. 7B and 7C.

In the semiconductor device 101 in which no first region is provided, the semiconductor film 15 of a region adjacent to the second region 100-2 (i.e., an adjacent region on side opposite to the third region 100-3) is exposed (i.e., an exposed region 15d) from the second insulating film 16, when performing etching of the electrically conductive film 17A, as illustrated in FIG. 7B. The semiconductor film 15 in the exposed region 15d is not protected by the second insulating film 16, and is exposed to the etching.

FIG. 8 illustrates a configuration of a part near the thus-formed contact 100. (A) of FIG. 8 illustrates a planar configuration of the contact 100 and the exposed region 15d, and (B) of FIG. 8 illustrates a cross-sectional configuration thereof. As illustrated, there is a possibility that the semiconductor film 15 in the exposed region 15d may undergo reduction in film thickness, or may disappear. When the semiconductor film 15 in the exposed region 15d undergoes reduction in film thickness or is disappeared, a current flows to avoid the exposed region 15d, and thus the semiconductor film 15 has increased resistance, causing the coupling between the semiconductor film 15 and the lower electrode 13 to be unstable.

FIG. 9 is an image of the contact 100 by means of a scanning electron microscope. The semiconductor film 15 has a thickness of 60 nm. As illustrated, confirmation is made that the semiconductor film 15 undergoes reduction in film thickness or is disappeared in the exposed region 15d. As described above, the semiconductor film 15 may have a thickness of 60 nm or less in one embodiment. In the contact 100, however, the thin semiconductor film 15 undergoes reduction in film thickness or is disappeared, thus making it difficult to allow the semiconductor film 15 and the lower electrode 13 to be electrically coupled to each other.

In contrast, in the semiconductor device 1, the first region 10-1 may be provided in the contact 10, thus allowing no exposed region (e.g., the exposed region 15d in FIG. 8) to be formed in the semiconductor film 15, causing the semiconductor film 15 to be protected by the second insulating film 16. This allows for suppression of reduction in film thickness and disappearance of the semiconductor film 15, thus enabling in-plane uniformity of the semiconductor film 15 to be maintained. This allows the semiconductor film 15 and the lower electrode 13 to be electrically coupled to each other stably. Thus, the thin semiconductor film 15 makes it possible to achieve superior transistor characteristics and high productivity, and to electrically couple the semiconductor film 15 and the lower electrode 13 to each other stably.

FIG. 10 illustrates a resistance value (S2) of a contact chain in which 50 contacts 10 (or contacts 100) are coupled in series. In FIG. 10, a horizontal axis indicates the length L1 (μm) of the first region 10-1, and a vertical axis indicates the resistance value (Ω). A negative part in the length L1 (μm) of the first region 10-1 indicates the semiconductor device 101 in which no first region is provided in the contact. As illustrated, the provision of the first region 10-1 (i.e., the second insulating film 16) in the contact 10 allows for suppression of increase in resistance.

Further, as illustrated in FIG. 11, by setting the length L1 of the first region 10-1 to 2 μm or less, it becomes possible to enhance the electrical conductivity of the semiconductor film 15 in the first region 10-1. FIG. 11 reviews a relationship between the length L1 of the first region 10-1 and the resistance value (S2) in terms of the contact chain including a plurality of contacts 10. The contact chain includes 50 contacts 10 that are coupled in series. As illustrated in FIG. 11, setting the length L1 of the first region 10-1 to 2 μm or less allows carriers with high concentration to be diffused sufficiently to the first region 10-1 from the near low-resistance region 15b. Thus, it becomes possible to enhance the stability of the coupling between the semiconductor film 15 and the lower electrode 13.

As described hereinabove, in the present example embodiment, the provision of the second insulating film 16 between the gate wiring line 17W and the semiconductor film 15 in the first region 10-1 allows for suppression of reduction in film thickness, for example, of the semiconductor film 15, thus enabling the semiconductor film 15 and the lower electrode 13 to be stably coupled to each other. Hence, it becomes possible to enhance the stability of the contact 10.

Furthermore, setting the length L1 of the first region 10-1 to 2 μm or less allows the electrical conductivity of the semiconductor film 15 in the first region 10-1 to be enhanced, thus making it possible to further enhance stability of the contact 10.

For example, when the semiconductor device 1 is applied to a display unit, i.e., the display unit 3A in FIG. 51 described later, increase in resistance of the contact 10 is suppressed, thus making it possible to prevent, for example, voltage drop, an error in signal writing into a pixel, and an error in gradation. Hence, it becomes possible to enhance display quality of the display unit.

Moreover, the provision of the first region 10-1 in the contact 10 makes it possible to allow the contact hole H to be smaller, as described below.

FIG. 12A illustrates one process step of manufacturing the semiconductor device 1 (the process step in FIG. 5A). FIG. 12B illustrates a process step corresponding to FIG. 12A in a situation where the semiconductor device 101 is manufactured (the process step in FIG. 7B). In this process step, an end part E100 (i.e., an end on side of the transistor Tr) of the photoresist Pr102 is disposed to be spaced apart from an end part E16 (i.e., an end on side of the storage capacitor Cs) of the second insulating film 16, as illustrated in FIG. 12B. As a result, it is necessary to secure a distance, to a certain degree, between the end part E16 of the second insulating film 16 and the end part E100 of the photoresist Pr102, thus making it difficult to decrease the length $L_{2+}3$ of the contact hole H.

In contrast, the end part E of the photoresist Pr2 may be provided at a position overlapping the second insulating film 16 in a plan view, thus making it unnecessary to secure the distance between the end part E of the photoresist Pr2 and the end of the second insulating film 16. Thus, it is possible to decrease the length $L_{2+}3$ to narrow the contact hole H. This makes it possible to decrease an occupation area of the contact 10, and thus to enhance a degree of definition.

Description is given below of modification examples of the present example embodiment. In the following description, the same components as those of the foregoing example embodiment are denoted with the same reference numerals, and descriptions thereof are omitted where appropriate.

Modification Example 1

FIG. 13 illustrates a schematic cross-sectional configuration of a main part of a semiconductor device, i.e., a semiconductor device 1A according to a modification example of the foregoing first example embodiment. In the semiconductor device 1A, the lower electrode 13 may extend to the first region 10-1. That is, in the first region 10-1, the lower electrode 13 and the gate wiring line 17W may face each other, with the semiconductor film 15 being interposed therebetween. Except this point, the semiconductor device 1A has a configuration similar to that of the semiconductor device 1 of the foregoing first example embodiment, and also has workings and effects similar to those of the semiconductor device 1 of the foregoing first example embodiment.

FIG. 14 illustrates electric fields that affect the semiconductor film 15 using arrows. As illustrated, in the semiconductor device 1A, an electric field effect may be obtained on both surfaces, i.e., an upper surface (i.e., a surface facing the gate wiring line 17W) and a lower surface (i.e., a surface facing the lower electrode 13) of the semiconductor film 15. This causes carriers of the semiconductor film 15 to be further induced, thus allowing for enhancement in the electrical conductivity of the semiconductor film 15 in the first region 10-1. Hence, it becomes possible for the semiconductor device 1A to further enhance the stability of the contact 10.

Second Example Embodiment

FIG. 15 schematically illustrates a configuration of a contact, i.e., a contact 10A according to a second example embodiment of the technology. (A) of FIG. 15 illustrates a planar configuration of the contact 10A. (B) of FIG. 15 illustrates a cross-sectional configuration of the contact 10A taken along a line B-B in (A) of FIG. 15. (C) of FIG. 15 illustrates a cross-sectional configuration of the contact 10A taken along a line C-C in (A) of FIG. 15.

The contact 10A may include, adjacently, the first region 10-1, the second region 10-2, and the third region 10-3, in order from a position close to the transistor Tr, in a current-flowing direction (i.e., in a direction in which the transistor Tr and the storage capacitor Cs are arranged; in X-direction in FIG. 15). The contact hole H may be provided in the second region 10-2 and the third region 10-3. The semiconductor film 15 and the gate wiring line 17W may be in contact with each other in the second region 10-2. The lower electrode 13 and the gate wiring line 17W may be in contact with each other in the third region 10-3. In FIG. 15, illustration of the UC film 12 is omitted.

In the contact 10A, a portion of the semiconductor film 15 may be exposed from the second insulating film 16. The contact 10A differs from the contact 10 of the foregoing first example embodiment in this point.

The first region 10-1 may include, on the substrate 11, the UC film 12, the first insulating film 14, the semiconductor film 15, the second insulating film 16 (i.e., an insulating film), and the gate wiring line 17W that are provided in this order. The gate wiring line 17W may have a width (i.e., a width $A_{17}$; a size of the gate wiring line 17W in Y-direction in (A) of FIG. 15) that is smaller than a width (i.e., a width $A_{15}$; a size of the semiconductor film 15 in Y-direction in (A) of FIG. 15) of the semiconductor film 15. A portion, of the semiconductor film 15, that is extended in Y-direction from the gate wiring line 17W may be exposed from the second insulating film 16 and the gate wiring line 17W. That is, the first region 10-1 may include a portion in which the semiconductor film 15, the second insulating film 16, and the gate wiring line 17W are stacked (as illustrated in (B) of FIG. 15) and a portion in which the semiconductor film 15 is exposed from the second insulating film 16 and the gate wiring line 17W (as illustrated in (C) of FIG. 15). The width $A_{17}$ of the gate wiring line 17W and the width $A_{15}$ of the semiconductor film 15 denote, respectively, a size of the gate wiring line 17W and a size of the semiconductor film 15 in the direction orthogonal to the current-flowing direction (i.e., X-direction in FIG. 15).

In the portion in which the second insulating film 16 and the gate wiring line 17W are stacked on the semiconductor film 15 as illustrated in (B) of FIG. 15, the semiconductor film 15 appears to exhibit characteristics similar to those of the transistor. However, the semiconductor film 15 may serve as an electric conductor. One reason for this is diffusion of carriers with high concentration in the low-resistance region 15b provided in at least one portion of the semiconductor film 15. For example, in the semiconductor film 15, both regions adjacent to the first region 10-1, i.e., a region on side of the transistor Tr and the second region 10-2 may be the low-resistance region 15b.

In the portion, of the first region 10-1, that is exposed from the second insulating film 16 and the gate wiring line 17W as illustrated in (C) of FIG. 15, the semiconductor film 15 may also be caused to have lower resistance (i.e., the semiconductor film 15 may have the low-resistance region 15b).

In the present example embodiment, in the first region 10-1, there may be the portion in which the semiconductor film 15, the second insulating film 16, and the gate wiring line 17W are stacked, and the portion in which the semiconductor film 15 is exposed from the second insulating film 16 and the gate wiring line 17W, as described above. Although the detail is described later, this configuration allows for protection of the semiconductor film 15 in the first region 10-1 in the manufacturing step, and allows for increase in a high concentration region (i.e., a high concentration region $C_{H2}$ in FIG. 19A described later) of carriers. Hence, it becomes possible to suppress the influence on the semiconductor film 15 upon formation of a layer above the semiconductor film 15, and to allow the semiconductor film 15 in the first region 10-1 to sufficiently serve as the electric conductor.

The semiconductor film 15 may be provided continuously in the first region 10-1 and the second region 10-2 of the contact 10A, and may have the width $A_{15}$ of 2 μm to 50 μm, for example. The semiconductor film 15 in the second region 10-2 may be the low-resistance region 15b, and may be in contact with the gate wiring line 17W. In the second region 10-2, the portion, of the semiconductor film 15, that is extended in Y-direction from the gate wiring line 17W may disappear (as in an exposed region 15d in (C) of FIG. 15).

The second insulating film 16 between the semiconductor film 15 and the gate wiring line 17W may be provided only in the first region 10-1 of the contact 10A. As described above, the second insulating film 16 in the first region 10-1 may be provided to protect the semiconductor film 15 when the gate wiring line 17W is patterned. The second insulating film 16 in the first region 10-1 may be formed in the same process steps as those of the second insulating film 16 of the transistor Tr. That is, the second insulating film 16 in the first region 10-1 may be made of the same material and may have the same thickness as those of the second insulating film 16 (i.e., the gate insulating film) of the transistor Tr. In one embodiment, the length of the first region 10-1 (i.e., the length L1) in the current-flowing direction (i.e., X-direction in FIG. 15), i.e., the length of the second insulating film 16 in X-direction may be 2 μm or less, in order to enhance the electric conductivity of the semiconductor film 15 in the first region 10-1.

The gate wiring line 17W may be provided continuously throughout the first region 10-1, the second region 10-2, and the third region 10-3 of the contact 10A. The end surface of the gate wiring line 17W in the first region 10-1 may be provided at the same position, in a plan view, as the end surface of the second insulating film 16.

An end of the gate wiring line 17W in the first region 10-1 may be linear in a plan view as illustrated in (A) of FIG. 15. In an alternative embodiment, the end of the gate wiring line 17W in the first region 10-1 may have a curved round shape as illustrated in FIG. 16.

As described above, the gate wiring line 17W may have the width $A_{17}$ that is smaller than the width $A_{15}$ of the semiconductor film 15. For example, the gate wiring line 17W may be disposed at a substantially middle part of the semiconductor film 15 in a width direction (i.e., Y-direction). The gate wiring line 17W may be disposed close to one side of the semiconductor film 15 in the width direction (i.e., Y-direction) to allow the other side of the semiconductor film 15 in the width direction to be exposed. In other words, both ends of the gate wiring line 17W in the width direction may be provided on inner side of both ends of the semiconductor film 15 in the width direction. In an alternative embodiment, one end of the gate wiring line 17W in the width direction may be aligned with one end of the semiconductor film 15 in the width direction to allow the other end of the gate wiring line 17W to be provided on inner side of the other end of the semiconductor film 15. In one embodiment, the gate wiring line 17W may have the width $A_{17}$ that is smaller than the width $A_{15}$ of the semiconductor film 15 by 2 μm or more. Such a gate wiring line 17W may be formed in the same process steps as those of the gate electrode 17 of the transistor Tr. That is, the gate wiring line 17W may be made of the same material and may have the same thickness as those of the gate electrode 17 of the transistor Tr.

The second region 10-2 may include, on the substrate 11, the UC film 12, the first insulating film 14, the semiconductor film 15, and the gate wiring line 17W that are provided in this order. That is, in the second region 10-2, the semiconductor film 15 and the gate wiring line 17W may be in contact with each other via the contact hole H provided in the second insulating film 16.

The third region 10-3 may include, on the substrate 11, the UC film 12, the lower electrode 13, and the gate wiring line 17W that are provided in this order. That is, in the third region 10-3, the lower electrode 13 and the gate wiring line 17W may be in contact with each other via the contact hole H provided in the first insulating film 14 and the second insulating film 16. The lower electrode 13 may extend to a portion of the second region 10-2 from the third region 10-3, for example; however, it is sufficient that the lower electrode 13 may be provided at least in the third region 10-3. In the second region 10-2, the first insulating film 14 may be provided between the lower electrode 13 and the semiconductor film 15. The lower electrode 13 may have the same width as the width $A_{15}$ of the semiconductor film 15, for example.

The contact hole H may have a width (i.e., a size in Y-direction; a width $A_H$) that is larger than the width $A_{15}$ of the semiconductor film 15, for example. As described later, in the semiconductor device 1, it is possible to cause the semiconductor film 15 in the first region 10-1 to serve as the electric conductor, while suppressing reduction in film thickness, for example, of the semiconductor film 15 in the first region 10-1. Thus, it becomes possible to stably couple the semiconductor film 15 and the lower electrode 13 to each other even when the contact hole H has the width $A_H$ that is larger than the width $A_{15}$ of the semiconductor film 15. That is, it becomes possible to decrease the width $A_{15}$ of the semiconductor film 15, and thus to allow the semiconductor device 1 to have higher definition.

As illustrated in FIG. 17, the contact hole H may have the width $A_H$ that is larger than the width $A_{17}$ of the gate wiring line 17W and is smaller than the width $A_{15}$ of the semiconductor film 15. When the second insulating film 16 remains in the second region 10-2 and the third region 10-3, there is a possibility that contact resistance may be increased. Thus, in one embodiment, the contact hole H may have the width $A_H$ that is larger than the width $A_{17}$ of the gate wiring line 17W. The contact hole H may have the width $A_H$ that is larger than the width $A_{17}$ of the gate wiring line 17W by 2 μm or more, for example.

The gate wiring line 17W may be provided, for example, in a region other than the contact 10A. The second insulating film 16 having the same shape, in a plan view, as that of the gate wiring line 17W may be provided between the gate wiring line 17W and the first insulating film 14.

The semiconductor device 1 that includes the above-described contact 10A may be manufactured in a manner similar to that described in the foregoing first example embodiment as illustrated in FIGS. 4A to 5B.

Workings and Effects

In the contact 10A of the present example embodiment, a portion of the semiconductor film 15 in the first region 10-1 may be exposed from the second insulating film 16 and the gate wiring line 17W, thus causing the semiconductor film 15 near the exposed portion to have high carrier concentration. This enables the semiconductor film 15 in the first region 10-1 to serve as the electric conductor more securely, as described later.

FIG. 18 illustrates an outline configuration of a contact, i.e., a contact 100A according to Comparative Example 2. (A) of FIG. 18 illustrates a schematic planar configuration of the contact 100A, and (B) of FIG. 18 illustrates a schematic cross-sectional configuration of the contact 100A. The contact 100A is provided with a gate wiring line, i.e., a gate wiring line 170W having a width $A_{170}$ that is equal to the width $A_{15}$ of the semiconductor film 15. The contact 100A differs from the contact 10A in this point.

In the contact 100A, the semiconductor film 15 in the first region 10-1 is covered with the second insulating film 16, similarly to the contact 10A. Thus, the semiconductor film 15 is protected when the gate wiring line 170W is patterned (reference is made to FIG. 5A). Hence, it is possible to suppress occurrence of reduction in film thickness and disappearance, for example, of the semiconductor film 15, caused by exposure of the semiconductor film 15 to multiple dry etching. That is, it is possible to electrically couple the semiconductor film 15 and the lower electrode 13 to each other stably even when a thin semiconductor film 15 is used.

As described above, in the first region 10-1, the second insulating film 16 and the gate wiring line 170W are stacked on the semiconductor film 15; however, carriers with high concentration are diffused from the adjacent low-resistance region 15b to form a high concentration region $C_{H1}$ of carriers also in the first region 10-1. Thus, the semiconductor film 15 in the first region 10-1 also serves as the electric conductor.

As described above, the electric conductivity of the semiconductor film 15 in the first region 10-1 depends on the diffusion of carriers with high concentration from the low-resistance region 15b, thus leading to a possibility that the semiconductor film 15 may not serve as the electric conductor in a case where the diffusion of carriers is insufficient. For example, when there is misalignment between the contact hole H and the gate wiring line 170W, for example, to cause the first region 10-1 to have an increased length L1, there is a possibility that carriers with high concentration may not be diffused sufficiently. Further, even when the length L1 of the first region 10-1 is exactly as designed, there is a possibility that some errors may occur to the diffusion of carriers with high concentration.

In contrast, in the contact 10A, the gate wiring line 17W may have the width $A_{17}$ that is smaller than the width $A_{15}$ of the semiconductor film 15, and thus the portion of the semiconductor film 15 in the first region 10-1 may be exposed from the second insulating film 16 and the gate wiring line 17W. This allows for formation of a high concentration region (i.e., the high concentration region $C_{H2}$ in FIG. 19A described later) derived from the exposed portion, in addition to formation of the high concentration region $C_{H1}$.

FIG. 19A illustrates the high concentration regions $C_{H1}$ and $C_{H2}$ to be formed in the contact 10A. FIG. 19B illustrates, using an arrow, a path of current conduction provided by the high concentration region $C_{H1}$. FIG. 19C illustrates, using arrows, paths of current conduction provided by the high concentration region $C_{H2}$. The high concentration region $C_{H2}$ may be formed at two locations on both sides of the semiconductor film 15 in the width direction, for example. The thus-formed high concentration region $C_{H2}$, in addition to the formation of the high concentration region $C_{H1}$, enables the carrier concentration of the semiconductor film 15 in the first region 10-1 to be sufficiently enhanced, thus allowing for increase in the number of the path of current conduction. That is, a portion, of the semiconductor film 15, that is stacked by the gate wiring line 17W allows for secure conduction between the first region 10-1 and the second region 10-2. Hence, it becomes possible to allow the semiconductor film 15 in the first region 10-1 to serve as the electric conductor more securely while suppressing an influence of possible occurrence of misalignment and an error in the diffusion of carriers with high concentration.

As described hereinabove, in the present example embodiment, the provision of the second insulating film 16 between the gate wiring line 17W and the semiconductor film 15 in the first region 10-1 allows for protection of the semiconductor film 15 in the first region 10-1 upon formation of the gate wiring line 17W. Further, causing the portion of the semiconductor film 15 in the first region 10-1 to be exposed from the second insulating film 16 and the gate wiring line 17W allows for formation of the high concentration region $C_{H2}$ in addition to the formation of the high concentration region $C_{H2}$. Consequently, it becomes possible to sufficiently enhance the carrier concentration of the semiconductor film 15 in the first region 10-1, thus allowing the semiconductor film 15 in the first region 10-1 to securely serve as the electric conductor. That is, it becomes possible for the semiconductor device 1 including the contact 10A to enhance contact stability.

Further, the enhancement in the carrier concentration of the semiconductor film 15 in the first region 10-1 makes it possible to reduce contact resistance.

Moreover, even when there occurs misalignment between the contact hole H and the gate wiring line 17W, for example, it is possible to electrically couple the semiconductor film 15 and the lower electrode 13 to each other stably, thus allowing for improvement in manufacturing yield. Further, as described above, the lowering in the contact resistance enables a necessary contact resistance value to be easily obtained. That is, it is possible to enhance the manufacturing yield also in the contact resistance.

In addition, it is possible, in this manner, to manufacture the contact 10A that couples the semiconductor film 15 and the lower electrode 13 to each other via the gate wiring line 17W in the above-described simple method. Further, the second region 10-2 that couples the semiconductor film 15 and the gate wiring line 17W to each other and the third region 10-3 that couples the gate wiring line 17W and the lower electrode 13 to each other are disposed adjacently, thus making it possible to achieve higher definition of the semiconductor device 1.

Modification Example 2

FIG. 20 illustrates a schematic planar configuration of the contact 10A according to a modification example of the foregoing second example embodiment (i.e., Modification Example 2). A gate wiring line (a gate wiring line 17WT) provided in the contact 10A may have a comb-tooth-like planar shape. Except this point, the contact 10A of Modification Example 2 has a configuration similar to that of the contact 10A of the foregoing second example embodiment, and also has workings and effects similar to those of the contact 10A of the foregoing second example embodiment.

The gate wiring line 17WT may have a plurality of teeth (teeth T). A tooth tip may be disposed in the first region 10-1, and a tooth base may be disposed in the second region 10-2. Each of the teeth T may have a rectangular planar shape, for example. At a part, of the first region 10-1, that overlaps each of the teeth T in a plan view, there may be stacked the semiconductor film 15, the second insulating film 16, and the gate wiring line 17WT in this order. In a (gap) part between the adjacent teeth T, the semiconductor film 15 may be exposed from the second insulating film 16 and the gate wiring line 17WT. The gate wiring line 17WT may have the width $A_{17}$ that is equal to the width $A_{15}$ of the semiconductor film 15, for example. The gate wiring line 17WT may have the width $A_{17}$ that is smaller than the width $A_{15}$ of the semiconductor film 15. In an alternative embodiment, the gate wiring line 17WT may have the width $A_{17}$ that is larger than the width $A_{15}$ of the semiconductor film 15. The contact hole H may have the width $A_H$ that is larger than both the width $A_{17}$ of the gate wiring line 17WT and the width $A_{15}$ of the semiconductor film 15, for example.

FIG. 21 illustrates, together with the gate wiring line 17WT, the high concentration regions $C_{H1}$ and $C_{H2}$ to be formed on the semiconductor film 15. In the contact 10A, the high concentration region $C_{H2}$ may be formed, in addition to the high concentration region $C_{H1}$. The high concentration region $C_{H2}$ may be derived from the semiconductor film 15 that is exposed at the gap between the adjacent teeth T. This allows for enhancement in the carrier concentration of the semiconductor film 15 in the first region 10-1, in a manner similar to that described in the foregoing second example embodiment. Further, the provision of the plurality of teeth T allows for increase in the number of the path of current conduction, as compared with the contact 10A of the second example embodiment. Hence, it becomes possible to allow the semiconductor film 15 in the first region 10-1 to serve as the electric conductor more securely.

Moreover, the increase in the number of the high concentration region $C_{H2}$ without changing the length L1 of the first region 10-1 makes it possible to achieve the semiconductor device 1 with higher definition.

The tip of each of the teeth T of the gate wiring line 17WT may be linear as illustrated in FIG. 20. In an alternative embodiment, the tip of each of the teeth T of the gate wiring line 17WT may have a curved round shape as illustrated in FIG. 22.

Modification Example 3

FIG. 23 illustrates a schematic planar configuration of the contact 10A according to a modification example of the foregoing second example embodiment (i.e., Modification Example 3). A gate wiring line (i.e., a gate wiring line 17WC) provided in the contact 10A may have a cross-like planar shape. Except this point, the contact 10A of Modification Example 3 has a configuration similar to that of the contact 10A of the foregoing second example embodiment, and also has workings and effects similar to those of the contact 10A of the foregoing second example embodiment.

The gate wiring line 17WC may include a base part (a base part W) extending in the current-flowing direction (i.e., X-direction in FIG. 23) and two added parts (added parts C) coupled to the base part W. A part coupling the base part W and the added parts C may be disposed in the contact hole H in the second region 10-2. The two added parts C may be provided in a direction that intersects an extending direction of the base part W (e.g., Y-direction in FIG. 23). The two added parts C may extend in directions opposite to each other (i.e., vertical direction in FIG. 23). The two added parts C may each have, for example, a rectangular planar shape, and may each extend from the contact hole H in the second region 10-2 toward the outside of the contact hole H. In an alternative embodiment, the number of the added part C may be either one, or three or more.

The semiconductor film 15 may have a width larger than that of the gate wiring line 17WC that includes the two added parts C. In other words, the added parts C of the gate wiring line 17WC may be provided on the semiconductor film 15 also outside the contact hole H in the second region 10-2. Thus, the semiconductor film 15 may be exposed from the added parts C in its extending direction (i.e., Y-direction in FIG. 23) and in its width direction (i.e., X-direction in FIG. 23). The second insulating film 16 may be interposed between the semiconductor film 15 and the added part C. That is, a stacked structure of the semiconductor film 15, the second insulating film 16, and the gate wiring line 17WC (i.e., the added part C) may be provided outside the contact hole H in the second region 10-2. Thus, a portion of the semiconductor film 15 may be exposed from the second insulating film 16 and the gate wiring line 17WC.

FIG. 24 illustrates, together with the gate wiring line 17WC, the high concentration regions $C_{H1}$ and $C_{H2}$ to be formed on the semiconductor film 15. In the contact 10A, the high concentration region $C_{H2}$ may be formed, in addition to the high concentration region $C_{H1}$. The high concentration region $C_{H2}$ may be derived from the semiconductor film 15 that is exposed outside the contact hole H in the second region 10-2. This allows for enhancement in the carrier concentration of the semiconductor film 15 outside the contact hole H in the first region 10-2, thus allowing for formation of a path of current conduction to the contact hole H from the outside of the contact hole H in the second region 10-2. In such a contact 10A, increase in the number of the path of current conduction makes it possible to allow the semiconductor film 15 of the contact 10A to serve as the electric conductor more securely.

Moreover, the increase in the number of the high concentration region $C_{H2}$ without changing the length L1 of the first region 10-1 makes it possible to achieve the semiconductor device 1 with higher definition.

An end of the base part W and an end of the added part C may be each linear as illustrated in FIG. 23. In an alternative embodiment, the end of the base part W and the end of the added part C may each have a curved round shape as illustrated in FIG. 25.

Third Example Embodiment

FIG. 26 illustrates a schematic planar configuration of a contact, i.e., a contact 10B according to a third example embodiment of the technology. An end, i.e., an end $E_{17}$ in an extending direction of the gate wiring line 17W (i.e., X-direction in FIG. 26) disposed in the first region 10-1 of the contact 10B may be provided obliquely with respect to the extending direction. Except this point, the contact 10B of the third example embodiment has a configuration similar to that of the contact 10A of the foregoing second example embodiment, and also has workings and effects similar to those of the contact 10A of the foregoing second example embodiment. The contact 10B has a cross-sectional configuration similar to that of the cross-sectional configuration of the contact 10A illustrated in (B) and (C) of FIG. 15.

The gate wiring line 17W in the first region 10-1 may have a substantially right-triangle planar shape, for example. An oblique side of the right triangle forms the end $E_{17}$. The end $E_{17}$ of such a gate wiring line 17W may be provided to cross the first region 10-1 linearly and to cut into the second region 10-2, in a plan view. For example, the end $E_{17}$ may be disposed most distant from the second region 10-2 (i.e., a starting point of the first region 10-1) at a position P1 that is one end of the gate wiring line 17W in the width direction (Y-direction in FIG. 26). The end $E_{17}$ may be disposed in the second region 10-2 at a position P2 that is the other end of the gate wiring line 17W in the width direction. In a part, of the first region 10-1, where the gate wiring line 17W is provided (a lower right part in FIG. 26), the second insulating film 16 may be interposed between the semiconductor film 15 and the gate wiring line 17W as illustrated in (B) of FIG. 15. A portion of the semiconductor film 15 (an upper left part in FIG. 26) provided in the first region 10-1 may be exposed from the second insulating film 16 and the gate wiring line 17W as illustrated in (C) of FIG. 15. In such a gate wiring line 17W, a distance from the end $E_{17}$ to the second region 10-2 may have a plurality of values that are different from one another.

Description is given of the distance from the end $E_{17}$ of the gate wiring line 17W to the second region 10-2, with reference to FIG. 27. For example, at the position P1, the distance from the end $E_{17}$ to the second region 10-2 may be equal to the length L1 of the first region 10-1. Meanwhile, at a position P3 between the position P1 and the position P2, i.e., at a location near a middle part of the gate wiring line 17W in the width direction, the distance from the end $E_{17}$ to the second region 10-2 may be a distance (i.e., a length Ls) that is shorter than the length L1. As a position comes closer to the position P3 (or the position P2) from the position P1, the distance from the end $E_{17}$ to the second region 10-2 continuously becomes smaller. In other words, in the gate wiring line 17W, there may be a position where the distance from the end $E_{17}$ to the second region 10-2 is smaller than the length L1 of the first region 10-1 (e.g., the position P3). Thus, even when the diffusion of carriers with high concentration is not sufficiently performed at a distance of the length L1, the carriers with high concentration may be diffused efficiently to the semiconductor film 15, as described later.

FIG. 28 illustrates a schematic planar configuration of the contact 100A according to Comparative Example 2 similar to that illustrated in FIG. 18. An end, i.e., an end $E_{170}$ of the gate wiring line 170W provided in the contact 100A is provided in a direction orthogonal (i.e., Y-direction in FIG. 28) to an extending direction of the gate wiring line 170W (i.e., X-direction in FIG. 28). Thus, the distance from the end $E_{170}$ of the gate wiring line 170W to the second region 10-2 is equal to the length L1 of the first region 10-1 irrespective of the position. In such a contact 100A, in a case where it is unable for carriers with high concentration to be diffused sufficiently to the semiconductor film 15 at the distance of the length L1, the semiconductor film 15 fails to serve as the electric conductor, thus leading to a possibility that contact between the semiconductor film 15 and the lower electrode 13 may be unstable.

In contrast, in the contact 10B, there may be a position where the distance from the end $E_{17}$ of the gate wiring line 17W to the second region 10-2 is shorter (e.g., the position P3). This enables carriers with high concentration to be diffused efficiently to the semiconductor film 15 in a shorter distance (e.g., the distance Ls) even in a case where it is unable for carriers with high concentration to be diffused sufficiently to the semiconductor film 15 at the distance of the length L1. Hence, it is possible to sufficiently enhance the carrier concentration of the semiconductor film 15 in the first region 10-1.

As described hereinabove, in the present example embodiment, the distance from the end $E_{17}$ of the gate wiring line 17W to the second region 10-2 may have a plurality of values that are different from one another. Thus, at the position where the distance from the end $E_{17}$ of gate wiring line 17W to the second region 10-2 is shorter (e.g., the position P3), it becomes possible to efficiently diffuse carriers with high concentration to the semiconductor film 15 in the first region 10-1. Hence, it becomes possible to sufficiently enhance the carrier concentration of the semiconductor film 15 in the first region 10-1, thus allowing the semiconductor film 15 in the first region 10-1 to serve as the conductor more securely. That is, the semiconductor device 1 including the contact 10B makes it possible to enhance the contact stability. Further, in a manner similar to that described for the contact 10A of the foregoing second example embodiment, the provision of the second insulating film 16 between the gate wiring line 17W and the semiconductor film 15 in the first region 10-1 allows for protection of the semiconductor film 15 in the first region 10-1 upon formation of the gate wiring line 17W.

Modification Example 4

As illustrated in FIG. 29, the entire end $E_{17}$ of the gate wiring line 17W may be provided in the first region 10-1 instead of cutting into the second region 10-2 (Modification Example 4). In one embodiment, the minimum distance from the end $E_{17}$ of the gate wiring line 17W to the second region 10-2 (i.e., a distance at the position P2 in FIG. 29; a length $L_E$) may be smaller than 5 μm in this situation, in order to sufficiently diffuse carriers with high concentration.

Modification Example 5

FIG. 30 illustrates a schematic planar configuration of the contact 10B according to a modification example of the foregoing third example embodiment (i.e., Modification Example 5). The gate wiring line (i.e., a gate wiring line 17WS) provided in the contact 10B may have an axisymmetric planar shape in a plan view. Except this point, the contact 10B of Modification Example 5 has a configuration similar to that of the contact 10B of the foregoing third example embodiment, and also has workings and effects similar to those of the contact 10B of the foregoing third example embodiment.

The gate wiring line 17WS may have a symmetrical axis in its extending direction (X-direction in FIG. 30). At both ends (positions P4 and P4') of the gate wiring line 17WS in the width direction (Y-direction in FIG. 30), the end $E_{17}$ may be disposed at positions most distant from the second region 10-2. At a middle part (positions P5 and P5') of the gate wiring line 17WS in the width direction, the end $E_{17}$ may be disposed in the second region 10-2. Positions P6 and P6' may be provided, respectively, between the positions P4 and P5 and between the positions P4' and P5'. A point corresponding to the position P6 may be the position P6'. The distances from the end $E_{17}$ to the second region 10-2 at positions P6 and P6' are equal to each other, and may be smaller than the length L1 of the first region 10-1.

In this manner, the distances from the end $E_{17}$ at two positions (e.g., at the positions P6 and P6') of the gate wiring line 17WS to the second region 10-2 may be equal to each other. Further, it is not necessary for the gate wiring line 17WS to have the axisymmetric planar shape; the distances from the end $E_{17}$ at two positions or more of the gate wiring line 17WS to the second region 10-2 may be equal to one another. In a manner similar to that described in the foregoing third example embodiment, it is also possible for such a gate wiring line 17WS to efficiently diffuse carriers with high concentration to the semiconductor film 15 in the first region 10-1 at a position where the distance from the end $E_{17}$ of the gate wiring line 17WS to the second region 10-2 is shorter (e.g., the positions P6 and P6'). Hence, it is possible to enhance the carrier concentration of the semiconductor film 15 in the first region 10-1, thus allowing the semiconductor film 15 in the first region 10-1 to serve as the conductor more securely.

FIG. 31 illustrates another example of the gate wiring line 17WS having an axisymmetric shape in a plan view. As illustrated, the end $E_{17}$ of the gate wiring line 17WS may have a curved round shape.

Modification Example 6

FIG. 32 illustrates a schematic planar configuration of the contact 10B according to a modification example of the foregoing third example embodiment (i.e., Modification Example 6). The gate wiring line (i.e., a gate wiring line 17WTA) provided in the contact 10B may have a comb-tooth-like planar shape. Except this point, the contact 10B of Modification Example 6 has a configuration similar to that of the contact 10B of the foregoing third example embodiment, and also has workings and effects similar to those of the contact 10B of the foregoing third example embodiment.

The gate wiring line 17WTA may have a plurality of teeth (teeth TA). Each of the teeth TA has a substantially right-triangle planar shape, for example. An apex of each of the teeth TA, i.e., a tooth tip may be disposed in the first region 10-1, and a bottom side of each of the teeth TA, i.e., a tooth base may be disposed in the second region 10-2. Thus, an oblique side of each of the teeth TA may be provided from the first region 10-1 toward the second region 10-2. The oblique side of each of the teeth TA causes the distance from the end $E_{17}$ of the gate wiring line 17WTA to the second region 10-2 to vary.

In a manner similar to that described in the foregoing third example embodiment, it is also possible for such a gate wiring line 17WTA to efficiently diffuse carriers with high concentration to the semiconductor film 15 in the first region 10-1 at a position where the distance from the end $E_{17}$ of the gate wiring line 17WTA to the second region 10-2 is shorter. Further, the provision of the plurality of the teeth TA allows for increase in the number of the path of current conduction, as compared with the contact 10B of the third example embodiment. Hence, it becomes possible to allow the semiconductor film 15 in the first region 10-1 to serve as the electric conductor more securely.

Moreover, the increase in the number of the path of current conduction without changing the length L1 of the first region 10-1 makes it possible to achieve the semiconductor device 1 with high definition.

Modification Example 7

FIG. 33 illustrates a schematic planar configuration of the contact 10B according to a modification example of the foregoing third example embodiment (i.e., Modification Example 7). The gate wiring line (i.e., a gate wiring line 17WCA) provided in the contact 10B may have a substantially star-like planar shape. Except this point, the contact 10B of Modification Example 7 has a configuration similar to that of the contact 10B of the foregoing third example embodiment, and also has workings and effects similar to those of the contact 10B of the foregoing third example embodiment.

The gate wiring line 17WCA may include a base part (a base part WA) extending in the current-flowing direction (i.e., X-direction in FIG. 33) and two added parts (added parts CA) coupled to the base part WA. A part coupling the base part WA and the added parts CA may be disposed in the contact hole H in the second region 10-2. The two added parts CA may be provided in a direction that intersects an extending direction of the base part WA (e.g., Y-direction in FIG. 33). The two added parts CA may extend in directions opposite to each other (i.e., vertical direction in FIG. 33). The two added parts CA may each have, for example, a substantially right-triangle planar shape, and may be provided in the second region 10-2. A bottom side of the added part CA may be disposed in the contact hole H, and an apex of the added part CA may be disposed outside the contact hole H. That is, the end $E_{17}$ of the gate wiring line 17WCA (i.e., the added part CA) may be provided outside the contact hole H in the second region 10-2. The oblique side of the added part CA causes the distance from the end $E_{17}$ to the contact hole H to vary. In an alternative embodiment, the number of the added part CA may be either one, or three or more.

The semiconductor film 15 may have a width larger than that of the gate wiring line 17WCA that includes the two added parts CA. In other words, the added parts CA of the gate wiring line 17WCA may be provided on the semiconductor film 15 also outside the contact hole H in the second region 10-2. The second insulating film 16 may be interposed between the semiconductor film 15 and the added part CA. A portion of the semiconductor film 15 may be exposed from the second insulating film 16 and the added part CA (i.e., the gate wiring line 17WCA).

In the contact 10B, the distance from the end $E_{17}$ of the gate wiring line 17WCA (i.e., the added part CA) provided outside the contact hole H in the second region 10-2 to the contact hole H may vary, thus allowing carriers with high concentration to be diffused in a shorter distance also from the outside of the contact hole H in the second region 10-2. This allows for enhancement in the carrier concentration of the semiconductor film 15 outside the contact hole H in the second region 10-2, thus allowing for formation of the path of current conduction to the contact hole H from the outside of the contact hole H in the second region 10-2. In such a contact 10B, increase in the number of the path of current conduction makes it possible to allow the semiconductor film 15 of the contact 10B to serve as the electric conductor more securely.

Moreover, the increase in the number of the path of current conduction without changing the length L1 of the first region 10-1 makes it possible to achieve the semiconductor device 1 with high definition.

Fourth Example Embodiment

FIG. 34 schematically illustrates a configuration of a contact (i.e., a contact 10C) according to a fourth example embodiment of the technology. (A) of FIG. 34 illustrates a planar configuration of the contact 10C, and (B) of FIG. 34 illustrates a cross-sectional configuration of the contact 10C.

The contact 10C may include, adjacently, the first region 10-1, the second region 10-2, and the third region 10-3, in order from a position close to the transistor Tr, in a direction in which the wiring lines extend (i.e., in a direction in which the transistor Tr and the storage capacitor Cs are arranged; in X-direction in FIG. 34). The contact hole H may be provided in the second region 10-2 and the third region 10-3. The semiconductor film 15 and the gate wiring line 17W may be in contact with each other in the second region 10-2. The lower electrode 13 and the gate wiring line 17W may be in contact with each other in the third region 10-3. In FIG. 34, illustration of the UC film 12 is omitted.

In the contact 10C, the semiconductor film 15 in the low-resistance region 15b-1 may have a thickness (i.e., a thickness t1 described later) that is smaller than a thickness (i.e., a thickness t2 described later) of the semiconductor film 15 in the second region 10-2. The contact 10C differs from the contact 10 of the foregoing first example embodiment in this point.

The first region 10-1 may include, on the substrate 11, the UC film 12, the first insulating film 14, the semiconductor film 15, the second insulating film 16, and the gate wiring line 17W that are provided in this order. That is, in the first region 10-1, the semiconductor film 15 may be covered with the second insulating film 16. Although the detail is described later, in the present example embodiment, the provision of such a first region 10-1 allows for suppression of an influence on the semiconductor film 15 upon formation of a layer above the semiconductor film 15, thus making it possible to enhance contact stability.

In the first region 10-1, the second insulating film 16 and the gate wiring line 17W may be provided on the semiconductor film 15, which appears to exhibit characteristics similar to those of the transistor. However, the semiconductor film 15 in the first region 10-1 may serve as the conductor. One reason for this is that the semiconductor film 15 is provided with low-resistance regions, i.e., the low-resistance region 15b-1 and a low-resistance region 15b-2 that are adjacent to respective both sides of the first region 10-1. This causes carriers with high concentration of the low-resistance regions 15b-1 and 15b-2 to be diffused to the first region 10-1 as illustrated in diffusion distances AL1 and AL2 in FIG. 37 described later. The low-resistance region 15b-1 may be disposed between the channel region 15a and the first region 10-1. That is, the low-resistance region 15b-1 may be disposed on side of the transistor Tr with respect to the first region 10-1. The low-resistance region 15b-2 may be disposed in the second region 10-2. The low-resistance regions 15b-1 and 15b-2 may be each exposed from the second insulating film 16.

In the semiconductor film 15, the low-resistance region 15b-1 on side of the transistor Tr may have a thickness, i.e., the thickness t1 that is smaller than a thickness, i.e., the thickness t2 of the second region 10-2 (i.e., the low-resistance region 15b-2). Although the detail is described later, this configuration allows the diffusion distance of carriers from the low-resistance region 15b-1 (i.e., the diffusion distance $\Delta L1$) to be short while maintaining the diffusion distance of carriers from the low-resistance region 15b-2 (i.e., the diffusion distance $\Delta L2$). The semiconductor film 15 may extend from the transistor Tr, and may have the low-resistance region 15b-1 between the transistor Tr and the contact 10C (i.e., the first region 10-1). The semiconductor film 15 may be disposed in the first region 10-1 and the second region 10-2 of the contact 10C. The semiconductor film 15 in the low-resistance region 15b-1 may have the thickness t1 of 10 nm to 40 nm, for example. The semiconductor film 15 in the second region 10-2 may have the thickness t2 of 20 nm to 60 nm, for example.

The second insulating film 16 may be provided only in the first region 10-1 of the contact 10C. In other words, a region in which the second insulating film 16 is provided may be the first region 10-1. The second insulating film 16 in the first region 10-1 may be formed in the same process steps as those of the second insulating film 16 of the transistor Tr. That is, the second insulating film 16 in the first region 10-1 may be made of the same material and may have the same thickness as those of the second insulating film 16 (i.e., the gate insulating film) of the transistor Tr. In one embodiment, the length L1 of the first region 10-1 in X-direction, i.e., the length of the second insulating film 16 in X-direction may be 2 µm or less, in order to enhance the electric conductivity of the semiconductor film 15 in the first region 10-1.

The gate wiring line 17W may be provided throughout the first region 10-1, the second region 10-2, and the third region 10-3 of the contact 10C. The end surface of the gate wiring line 17W in the first region 10-1 may be provided at the same position, in a plan view, as the end surface of the second insulating film 16. The gate wiring line 17W may be formed in the same process steps as those of the gate electrode 17 of the transistor Tr. That is, the gate wiring line 17W may be made of the same material and may have the same thickness as those of the gate electrode 17 of the transistor Tr.

The second region 10-2 may include, on the substrate 11, the UC film 12, the first insulating film 14, the semiconductor film 15, and the gate wiring line 17W that are provided in this order. That is, in the second region 10-2, the semiconductor film 15 and the gate wiring line 17W may be in contact with each other via the contact hole H provided in the second insulating film 16.

The third region 10-3 may include, on the substrate 11, the UC film 12, the lower electrode 13, and the gate wiring line 17W that are provided in this order. That is, in the third region 10-3, the lower electrode 13 and the gate wiring line 17W may be in contact with each other via the contact hole H provided in the first insulating film 14 and the second insulating film 16. The lower electrode 13 may extend to a portion of the second region 10-2 from the third region 10-3, for example. In the second region 10-2, the first insulating film 14 may be provided between the lower electrode 13 and the semiconductor film 15. The lower electrode 13 may be disposed at a position closer to the substrate 11 than the semiconductor film 15.

The lower electrode 13, the semiconductor film 15, and the gate wiring line 17W may each have a width (i.e., a size in Y-direction; the wiring line width $W_{10}$) of 5 µm, for example. The wiring line width $W_{10}$ denotes a size of each of the lower electrode 13, the semiconductor film 15, and the gate wiring line 17W in a direction orthogonal to a current flow. The contact hole H may have a width (i.e., a size in Y-direction; the width $W_H$) of 3 µm, for example. The contact hole H may have a length (i.e., a size in X-direction; the length $L_{2+3}$) of 4 µm, for example. The width $W_H$ denotes a size of the contact hole H in the direction orthogonal to the current flow, and the length $L_{2+3}$ denotes a size of the contact hole H in a direction parallel to the current flow.

The width $W_H$ of the contact hole H may be larger than the wiring line width $W_{10}$ as illustrated in FIG. 3. As described later, in the semiconductor device 1, reduction in film thickness of the semiconductor film 15 is suppressed in the contact 10C, thus enabling the semiconductor film 15 and the lower electrode 13 to be stably coupled to each other even when the width $W_H$ of the contact hole H is larger than the wiring line width $W_{10}$. Hence, an embodiment of the technology is suitably applicable to a high-definition semiconductor device having the small wiring line width $W_{10}$.

The gate wiring line 17W may be provided in a region other than the contact 10C. The second insulating film 16 having the same shape, in a plan view, as that of the gate wiring line 17W may be provided between the gate wiring line 17W and the first insulating film 14.

[Manufacturing Method]

The semiconductor device 1 including the contact 10C as described above may be manufactured in a manner similar to that described in the foregoing first example embodiment as illustrated in FIGS. 4A to 5B.

As illustrated in FIG. 4A, first, there may be formed, on the substrate 11, the UC film 12, the lower electrode 13, the first insulating film 14, the semiconductor film 15, and the second insulating film 16 in this order. In a specific but non-limiting example, formation may be performed as follows. First, the UC film 12 may be formed on the entire surface of the substrate 11. Next, for example, a metal film may be formed on the UC film 12. The metal film may be patterned into a predetermined shape by means of dry etching to form the lower electrode 13. Subsequently, the first insulating film 14 may be formed throughout the entire surface of the substrate 11 to cover the lower electrode 13. Next, for example, a film of an oxide semiconductor material may be formed on the first insulating film 14 by means of a sputtering method, for example, following which the film of the oxide semiconductor material may be patterned into a predetermined shape by means of photolithography and etching, for example, to form the semiconductor film 15. Thereafter, the second insulating film 16 may be formed throughout the entire surface of the substrate 11 to cover the semiconductor film 15.

After the formation of the second insulating film 16, the second insulating film 16 in the second region 10-2 and the third region 10-3 and the first insulating film 14 in the third region 10-3 may be removed selectively to form the contact hole H, as illustrated in FIG. 4B. The contact hole H may be formed using dry etching, for example. In this situation, the semiconductor film 15 in the second region 10-2 may be subjected to the dry etching, and thus the low-resistance region 15b-2 may be formed in the second region 10-2. The semiconductor film 15 in the low-resistance region 15b-2 may be formed to have the thickness t2.

After the formation of the contact hole H, the electrically conductive film 17A made of, for example, a metal material may be formed throughout the entire surface of the substrate 11. Subsequently, photoresists Pr1, Pr2, and Pr3 each having a predetermined pattern may be formed on the electrically conductive film 17A, as illustrated in FIG. 4C. The photoresist Pr1 may be provided to form the gate electrode 17 and the second insulating film 16 of the transistor Tr. The photoresist Pr2 may be provided to form the gate wiring line 17W and the second insulating film 16 (i.e., the first region 10-1) of the contact 10. The photoresist Pr3 may be provided to form the gate wiring line 17W and the second insulating film 16 in the region other than the contact 10.

The photoresists Pr1, Pr2, and Pr3 may be used to successively perform patterning of the electrically conductive film 17A and the second insulating film 16, as illustrated in FIGS. 5A and 5B. As illustrated in FIG. 5A, first, the electrically conductive film 17A may be patterned using dry etching to form the gate electrode 17 and the gate wiring line 17W. In the present example embodiment, the semiconductor film 15 in the first region 10-1 may be covered with the second insulating film 16 in this situation, and thus the semiconductor film 15 may not be subjected to the dry etching. Consequently, the semiconductor film 15 in the first region 10-1 may not undergo reduction in film thickness, and may be present to have a predetermined thickness.

After the formation of the gate electrode 17 and the gate wiring line 17W, patterning of the second insulating film 16 may be performed subsequently, as illustrated in FIG. 5B. This allows for formation of the second insulating film 16 having the same shape, in a plan view, as that of the gate electrode 17, the second insulating film 16 in the first region 10-1, and the second insulating film 16 having the same shape, in a plan view, as that of the gate wiring line 17W. In this situation, a region, of the semiconductor film 15, that is exposed from the second insulating film 16 may be caused to have lower resistance by the dry etching to form the low-resistance region 15b-1 and the upper electrode 15C of the storage capacitor Cs. In this dry etching, overetching may be performed to allow the semiconductor film 15 in the low-resistance region 15b-1 to have the thickness t1 that is smaller than the thickness t2 of the semiconductor film 15 in the low-resistance region 15b-2. Wet etching may also be performed instead of the dry etching.

Thereafter, the metal oxide film 18 and the interlayer insulating film 19 may be formed throughout the entire surface of the substrate 11. Finally, the source-drain electrode 21 may be formed on the interlayer insulating film 19 to complete the semiconductor device 1.

Workings and Effects

In the contact 10C of the present example embodiment, the low-resistance region 15b-1 may have the thickness t1 that is smaller than the thickness t2 of the second region 10-2 (i.e., the low-resistance region 15b-2). This makes it possible to sufficiently diffuse carriers from the second region 10-2 to the first region 10-1, and to suppress diffusion of carriers from the low-resistance region 15b-1 to the channel region 15a, as described below referring to Comparative Example 3.

FIG. 35 schematically illustrates a cross-sectional configuration of a main part of a semiconductor device, i.e., a semiconductor device 102 according to Comparative Example 3. The semiconductor device 102 is provided with the first region 10-1, thus suppressing reduction in film thickness and disappearance, for example, of the semiconductor film 15. The semiconductor film 15 has the low-resistance region 15b-1 and the low-resistance region 15b-2. The low-resistance region 15b-1 is provided between the channel region 15a and the first region 10-1. The low-resistance region 15b-2 is provided in the second region 10-2. The low-resistance regions 15b-1 and 15b-2 have the same thickness (a thickness t).

FIG. 36 illustrates one process step of manufacture of the semiconductor device 102. For the manufacture of the semiconductor device 102, the photoresists Pr1, Pr2, and Pr3 may be used to adjust etching of the semiconductor film 15 (i.e., the low-resistance region 15b-1) upon patterning of the second insulating film 16. Avoiding excessive etching allows for formation of the semiconductor film 15 in the low-resistance region 15b-1 to have the same thickness t as that of the semiconductor film 15 in the second region 10-2 (i.e., the low-resistance region 15b-2).

The semiconductor film 15 in the first region 10-1 serves as the conductor because of the diffusion of carriers from the low-resistance region 15b-1 and the second region 10-2 that are adjacent to the first region 10-1. As described above, in the semiconductor device 102, the semiconductor film 15 is formed to have the same thickness t in the low-resistance region 15b-1 and the second region 10-2. As a result, when carriers diffuse from the second region 10-2 to the adjacent first region 10-1 at the diffusion distance ΔL, the carriers also diffuse from the low-resistance region 15b-1 to the first region 10-1 and the channel region 15a that are adjacent to the low-resistance region 15b-1 at the same diffusion distance (i.e., the diffusion distance ΔL), as illustrated in FIG. 35.

The larger the diffusion distance ΔL of the carriers is, the more the carriers diffuse sufficiently from the low-resistance region 15b-1 and the second region 10-2, thus allowing the semiconductor film 15 in the first region 10-1 to stably serve as the conductor. However, the carriers also diffuse to the channel region 15a from the low-resistance region 15b-1, thus leading to a possibility that TFT characteristics of the transistor Tr may be influenced when the diffusion distance ΔL of the carriers is large. For example, the TFT characteristics is more likely to be unstable.

In contrast, in the present example embodiment, the semiconductor film 15 in the low-resistance region 15b-1 may have the thickness t1 that is smaller than the thickness t2 of the semiconductor film 15 in the second region 10-2 (i.e., the low-resistance region 15b-2). Thus, the diffusion distance of carriers from the low-resistance region 15b-1 to the first region 10-1 and the channel region 15a (i.e., the diffusion distance ΔL1) is shorter than the diffusion distance ΔL2 of carriers from the second region 10-2 to the first region 10-1, as illustrated in FIG. 37. This allows for suppression of the diffusion of the carriers from the low-resistance region 15b-1 to the channel region 15a (i.e., the diffusion distance ΔL1) while sufficiently securing the electric conductivity of the semiconductor film 15 in the first region 10-1 because of the diffusion of the carriers from the second region 10-2 (i.e., the diffusion distance ΔL2). Hence, it becomes possible to enhance stability of the contact 10C, and to maintain the TFT characteristics of the transistor Tr.

Further, the suppression of the diffusion of carriers to the channel region 15a makes it possible to maintain the TFT characteristics even when the transistor Tr has a shorter channel length. Hence, it becomes possible to enhance a degree of definition.

As described hereinabove, in the present example embodiment, the provision of the second insulating film 16 between the gate wiring line 17W and the semiconductor film 15 in the first region 10-1 allows for suppression of reduction in film thickness, for example, of the semiconductor film 15, thus making it possible to stably couple the semiconductor film 15 and the lower electrode 13 to each other. Hence, it becomes possible to enhance the stability of the contact 10C.

Furthermore, the semiconductor film 15 in the low-resistance region 15b-1 may have the thickness t1 that is smaller than the thickness t2 of the semiconductor film 15 in the second region 10-2. This allows for sufficient diffusion of carriers from the second region 10-2 to the first region 10-1, and allows for suppression of the diffusion of carriers from the low-resistance region 15b-1 to the channel region 15a. Hence, it becomes possible to enhance stability of the contact 10C, and to maintain the characteristics of the transistor Tr.

Moreover, the suppression of the diffusion of the carriers from the low-resistance region 15b-1 to the channel region 15a allows the transistor Tr to have a shorter channel length. This makes it possible to further enhance the degree of definition.

Modification Example 8

FIG. 38 schematically illustrates a cross-sectional configuration of the contact 10C according to a modification example of the foregoing fourth example embodiment (i.e., Modification Example 8). As described, another semiconductor film (i.e., a semiconductor film 15A; a second semiconductor film) may be provided between the semiconductor film 15 and the first insulating film 14 that are each provided in the first region 10-1 and the second region 10-2. In other words, the semiconductor films 15 and 15A having a stacked structure may be provided in the first region 10-1 and the second region 10-2. The thickness t2 of the semiconductor films (i.e., the semiconductor films 15 and 15A) in the second region 10-2 is a sum of the thickness of the semiconductor film 15 and a thickness of the semiconductor film 15A.

The semiconductor film 15A may be stacked on a portion of the semiconductor film 15 in the low-resistance region 15b-1. A material similar to that of the semiconductor film 15 may be used for the semiconductor film 15A. For example, the semiconductor film 15A may have an oxygen concentration lower than an oxygen concentration of the semiconductor film 15 in the first region 10-1. The semiconductor film 15A may have electric resistance lower than electric resistance of the semiconductor film 15 in the first region 10-1. In an alternative embodiment, the semiconductor film 15A may have electric resistance that is substantially equal to the electric resistance of the semiconductor film 15 in the first region 10-1.

The provision of the semiconductor films 15 and 15A having the stacked structure in the first region 10-1 allows the electric resistance of each of the semiconductor films 15 and 15A in the first region 10-1 to be lowered. Hence, it becomes possible to enhance the stability of the contact 10C.

Fifth Example Embodiment

FIG. 39 schematically illustrates a configuration of a contact, i.e., a contact 10D according to a fifth example embodiment of the technology. (A) of FIG. 39 illustrates a planar configuration of the contact 10D. (B) of FIG. 39 illustrates a cross-sectional configuration of the contact 10D taken along a line B-B illustrated in (A) of FIG. 39. (C) of FIG. 39 illustrates a cross-sectional configuration of the contact 10D taken along a line C-C illustrated in (A) of FIG. 39. In (B) and (C) of FIG. 39, illustration of the UC film 12 is omitted.

The contact 10D may include, adjacently, the first region 10-1, the second region 10-2, and the third region 10-3, in order from a position close to the transistor Tr, in a direction in which the wiring lines extend (i.e., in a direction in which the transistor Tr and the storage capacitor Cs are arranged; in X-direction in FIG. 39).

In the contact 10D, the semiconductor film 15 in the first region 10-1 may be exposed from the second insulating film 16 and the gate wiring line 17W. The contact 10D differs from the contact 10 of the foregoing first example embodiment in this point.

The contact 10D may include, on the substrate 11, the UC film 12, the lower electrode 13, the first insulating film 14, the semiconductor film 15, the second insulating film 16, and the gate wiring line 17W that are provided in this order. The contact hole H disposed in the second region 10-2 and the third region 10-3 may allow the semiconductor film 15 and the lower electrode 13 to be electrically coupled to each other. The contact hole H may be disposed, for example, at a substantially middle part of the wiring lines (i.e., the lower electrode 13, the semiconductor film 15, and the gate wiring line 17W) in the width direction (i.e., the direction orthogonal to the current-flowing direction; Y-direction in (A) of FIG. 39). As described later, the first insulating film 14 of the contact 10D may be formed in the same process steps as those of the first insulating film 14 of the storage capacitor Cs, for example. The first insulating film 14 of the contact 10D may include the same constituent material as that of the first insulating film 14 of the storage capacitor Cs. The first insulating film 14 of the contact 10D may have the same thickness as that of the first insulating film 14 of the storage capacitor Cs. The second insulating film 16 and the gate wiring line 17W of the contact 10D may be formed in the same process steps as those of, respectively, the second insulating film 16 (i.e., the gate insulating film) and the gate electrode 17 of the transistor Tr, for example. The second insulating film 16 and the gate wiring line 17W of the contact 10D may include the same constituent material as that of, respectively, the second insulating film 16 (i.e., the gate insulating film) and the gate electrode 17 of the transistor Tr. The second insulating film 16 and the gate wiring line 17W of the contact 10D may have the same thickness as that of, respectively, the second insulating film 16 (i.e., the gate insulating film) and the gate electrode 17 of the transistor Tr.

The first region 10-1 may include, on the substrate 11, the UC film 12, the first insulating film 14, and the semiconductor film 15 that are provided in this order. That is, in the first region 10-1, the semiconductor film 15 may be exposed from the second insulating film 16 and the gate wiring line 17W.

The semiconductor film 15 in the first region 10-1 may be the low-resistance region 15b, but may have, in a portion thereof, the exposed region 15d that is caused to have higher resistance, as illustrated in (B) of FIG. 39. The exposed region 15d may be a region that has undergone reduction in film thickness as compared with other parts by subjecting the semiconductor film 15 to multiple etching, or may be a region where the semiconductor film 15 may disappear, as described later. The exposed region 15d may be disposed adjacently to the contact hole H, and may be provided to have the same width (a size in Y-direction in FIG. 39) as the width of the contact hole H (the width $W_H$ described later), for example.

The second region 10-2 may include, on the substrate 11, the UC film 12, the first insulating film 14, the semiconductor film 15, the second insulating film 16, and the gate wiring line 17W that are provided in this order. In the second region 10-2, the contact hole H may be provided in a portion of the second insulating film 16, and the gate wiring line 17W and the semiconductor film 15 may be in contact with each other. The semiconductor film 15 in the contact hole H may be the low-resistance region 15b, as illustrated in (B) of FIG. 39. Although the detail is described later, in the present example embodiment, the gate wiring line 17W and the semiconductor film 15 each provided in the first region 10-1 and the second region 10-2 may each have a width (width W10; a size in Y-direction in FIG. (A) of FIG. 39) that is larger than the width $W_H$ of the contact hole. This allows carrier paths (i.e., E1+E2) to be secured even in a case where the semiconductor film 15 includes the exposed region 15d, thus making it possible to stably couple the semiconductor film 15 and the lower electrode 13 to each other.

In a region (illustrated in (C) of FIG. 39) having a larger width than the contact hole H, the second insulating film 16 may be interposed between the semiconductor film 15 and the gate wiring line 17W. Therefore, the semiconductor film 15 outside the contact hole H appears to exhibit characteristics similar to those of the transistor. However, the semiconductor film 15 in this part may also serve as the conductor. One reason for this is that at least one portion of the semiconductor film 15 is provided with the low-resistance region 15b, and the carriers with high concentration in the low-resistance region 15b are diffused to the semiconductor film 15 below the second insulating film 16. For example, the semiconductor film 15 both in the first region 10-1 and the contact hole H may be the low-resistance region 15b. Accordingly, leakage of carriers from the first region 10-1 causes also the semiconductor film 15 outside the contact hole H to have lower resistance at a location, of the second region 10-2, that is adjacent to the first region 10-1, thus allowing for current flow.

In one embodiment, the contact hole H may have the width $W_H$ of 2 μm or more, for example, and the gate wiring line 17W and the semiconductor film 15 may each have the width $W_{10}$ of 5 μm or more. In one embodiment, the carrier paths (i.e., E1+E2 illustrated in (A) of FIG. 39) of 3 μm or more may be secured in the semiconductor film 15. The symbol E1+E2 denotes a difference between the width $W_{10}$ of the semiconductor film 15 and the width $W_H$ of the contact hole H, for example. By securing the carrier paths (i.e., E1+E2) of 3 μm or more, it becomes possible to suppress increase in the contact resistance. For example, E1 and E2 may be values equal to each other to allow the contact hole H to be disposed at the middle of the semiconductor film 15. In an alternative embodiment, E1 and E2 may be values different from each other to allow the contact hole H to be disposed at a position deviated from the middle of the semiconductor film 15. The gate wiring line 17W and the lower electrode 13 may each also have a width that is larger than the width $W_H$ of the contact hole H. For example, the gate wiring line 17W and the lower electrode 13 may also each have a width that is equal to the width $W_{10}$ of the semiconductor film 15.

The third region 10-3 may include, on the substrate 11, the UC film 12, the lower electrode 13, the first insulating film 14, the second insulating film 16, and the gate wiring line 17W that are provided in this order. In the third region 10-3, the contact hole H may be provided that penetrates the second insulating film 16 and the first insulating film 14, thus allowing the gate wiring line 17W and the lower electrode 13 to be in contact with each other. In this manner, the semiconductor film 15 and the lower electrode 13 may be electrically coupled to each other via the gate wiring line 17W in the contact hole H. The lower electrode 13 may extend, for example, from the third region 10-3 to a portion of the second region 10-2. However, it is sufficient that the lower electrode 13 may be provided at least in the third region 10-3. In the second region 10-2, the first insulating film 14 may be provided between the lower electrode 13 and the semiconductor film 15.

The gate wiring line 17W may also be provided, for example, in a region other than the contact 10D as illustrated in FIG. 1. The second insulating film 16 having the same shape, in a plan view, as that of the gate wiring line 17W may be provided between the gate wiring line 17W and the first insulating film 14.

[Manufacturing Method]

The semiconductor device 1 as described above may be manufactured, for example, as follows, as illustrated in FIGS. 4A, and 40A to 42B.

First, there may be formed, on the substrate 11, the UC film 12, the lower electrode 13, the first insulating film 14, the semiconductor film 15, and the second insulating film 16 in this order as illustrated in FIG. 4A. In a specific but non-limiting example, formation may be performed as follows. First, the UC film 12 may be formed on the entire surface of the substrate 11. Next, for example, a metal film may be formed on the UC film 12. The metal film may be patterned into a predetermined shape by means of dry etching to form the lower electrode 13. Subsequently, the first insulating film 14 may be formed throughout the entire surface of the substrate 11 to cover the lower electrode 13. Next, for example, a film of an oxide semiconductor material may be formed on the first insulating film 14 by means of a sputtering method, for example, following which the film of the oxide semiconductor material may be patterned into a predetermined shape by means of photolithography and etching, for example, to form the semiconductor film 15. Thereafter, the second insulating film 16 may be formed throughout the entire surface of the substrate 11 to cover the semiconductor film 15.

After the formation of the second insulating film 16, the second insulating film 16 in the first region 10-1, the second region 10-2, and the third region 10-3, and the first insulating film 14 in the third region 10-3 may be removed selectively to form the contact hole H, as illustrated in FIG. 40A. The contact hole H may be formed using dry etching, for example. In this situation, the semiconductor film 15 in the contact hole H may be subjected to the dry etching (i.e., the first dry etching), and thus the low-resistance region 15b may be formed. After the formation of the contact hole H, the electrically conductive film 17A made of, for example, a metal material may be formed throughout the entire surface of the substrate 11.

Subsequently, photoresists Pr1, Pr2, and Pr3 each having a predetermined pattern may be formed on the electrically conductive film 17A, as illustrated in FIG. 40B. The photoresist Pr1 may be provided to form the gate electrode 17 and the second insulating film 16 of the transistor Tr. The photoresist Pr2 may be provided to form the gate wiring line 17W and the second insulating film 16 (i.e., the second region 10-2 and the third region 10-3) of the contact 10D. The photoresist Pr3 may be provided to form the gate wiring line 17W and the second insulating film 16 in the region other than the contact 10D. In the semiconductor device 1, even when a slight positional deviation occurs between the contact hole H and the gate wiring line 17W, stable contact is formed insofar as the carrier paths (i.e., E1+E2) are secured. Thus, it becomes possible to increase an allowable range of the positional deviation of the photoresist Pr2.

The photoresists Pr1, Pr2, and Pr3 may be used to successively perform patterning of the electrically conductive film 17A and the second insulating film 16, as illustrated in FIGS. 41 and 42. As illustrated in (A), (B), and (C) of FIG. 41, first, the electrically conductive film 17A may be patterned using dry etching to form the gate electrode 17 and the gate wiring line 17W. (A) of FIG. 41 illustrates a planar configuration in a process step subsequent to FIG. 40B. (B) of FIG. 41 illustrates a cross-sectional configuration taken along a line B-B illustrated in (A) of FIG. 41, and (C) of FIG. 41 illustrates a cross-sectional configuration taken along a line C-C illustrated in (A) of FIG. 41. In this situation, a portion of the semiconductor film 15 in the first region 10-1 (a region adjacent to the contact hole H) may be subjected to the second dry etching. This may cause the semiconductor film 15 to undergo reduction in film thickness, or to disappear, thus forming the exposed region 15$d$ in the semiconductor film 15, as illustrated in (B) of FIG. 41. The semiconductor film 15 (i.e., the first region 10-1 and the second region 10-2) outside the contact hole H may be covered with the second insulating film 16, and thus may not undergo reduction in film thickness, thus allowing the semiconductor film 15 outside the contact hole H to be present to have a predetermined thickness, as illustrated in (C) of FIG. 41. In the contact 10D, even when such an exposed region 15$d$ is formed, a current may flow via the semiconductor film 15 outside the contact hole H, thus making it possible to increase an allowable range of an etching error in the electrically conductive film 17A and the second insulating film 16.

After the formation of the gate electrode 17 and the gate wiring line 17W, patterning of the second insulating film 16 may be performed subsequently, as illustrated in FIG. 42. This allows for formation of the second insulating film 16 having the same shape, in a plan view, as that of the gate electrode 17 and the second insulating film 16 having the same shape, in a plan view, as that of the gate wiring line 17W. In this situation, a region, of the semiconductor film 15, that is exposed from the second insulating film 16 may be caused to have lower resistance by the dry etching to form the low-resistance region 15$b$ of the transistor Tr and the upper electrode 15C of the storage capacitor Cs.

Thereafter, the metal oxide film 18 and the interlayer insulating film 19 may be formed throughout the entire surface of the substrate 11. Finally, the source-drain electrode 21 may be formed on the interlayer insulating film 19 to complete the semiconductor device 1 as illustrated in FIG. 1.

Workings and Effects

In the contact 10D of the present example embodiment, the gate wiring line 17W and the semiconductor film 15 may each have the width $W_{10}$ that is larger than the width $W_H$ of the contact hole H. This allows the carrier paths (i.e., E1+E2) to be secured even in a case where the exposed region 15$d$ having the same width as that of the contact hole H is provided in the semiconductor film 15 in the first region 10-1, as described below referring to Comparative Example 4.

FIG. 43 schematically illustrates a configuration of a contact, i.e., a contact 100D of a semiconductor device according to Comparative Example 4. (A) of FIG. 43 illustrates a planar configuration of the contact 100D, and (B) of FIG. 43 illustrates a cross-sectional configuration of the contact 100D. The contact 100D has a first region 100-1, a second region 100-2, and a third region 100-3 adjacently in this order. The contact hole H is provided in the second region 100-2 and the third region 100-3. The gate wiring line 17W and the semiconductor film 15 are in contact with each other in the second region 100-2 of the contact hole H. The gate wiring line 17W and the lower electrode 13 are in contact with each other in the third region 100-3 of the contact hole H. In the contact 100D, the semiconductor film 15 has the width $W_{10}$ that is smaller than the width $W_H$ of the contact hole H. The contact 100D differs from the contact 10D in this point.

In such a contact 100D, when the exposed region 15$d$ is formed on the semiconductor film 15 in the first region 100-1, it is unable to secure a carrier path, thus causing the contact resistance to be increased. In other words, the contact becomes unstable.

In contrast, in the contact 10D, the gate wiring line 17W and the semiconductor film 15 may each have the width $W_{10}$ that is larger than the width $W_H$ of the contact hole H. This allows the carrier paths (i.e., E1+E2) to be secured outside the contact hole H even in a case where the exposed region 15$d$ having the same width as that of the contact hole H is formed in the semiconductor film 15 in the first region 10-1, as illustrated in FIG. 39. Hence, it becomes possible to stably form the contact between the semiconductor film 15 and the lower electrode 13.

FIG. 44 illustrates a relationship between a size of carrier paths (i.e., E1+E2) of the semiconductor film 15 and contact resistance (i.e., ohm) per contact hole H. In order to obtain a stable contact, the contact resistance may be $1 \times 10^4 \Omega$ or less, in one embodiment. Accordingly, it is appreciated from FIG. 44 that the carrier paths (i.e., E1+E2) having a size of 3 μm or more allows a sufficient carrier path to be secured, thus making it possible to form the stable contact. For example, in a case where the minimum fabrication line width of the width $W_H$ of the contact hole H is 2 μm, when the gate wiring line 17W and the semiconductor film 15 each have the width $W_{10}$ of 5 μm or more, the carrier paths (i.e., E1+E2) of 3 μm or more is secured.

As described hereinabove, in the present example embodiment, the gate wiring line 17W and the semiconductor film 15 may each have the width $W_{10}$ that is larger than the width $W_H$ of the contact hole H. This allows the carrier paths (i.e., E1+E2) to be secured even when the exposed region 15$d$ is formed on the semiconductor film 15, thus enabling the semiconductor film 15 and the lower electrode 13 to be stably coupled to each other. Hence, it becomes possible to enhance the contact stability. Even when the semiconductor device 1 has a plurality of contact holes H, it becomes possible to achieve high in-plane uniformity.

Further, by securing the carrier paths (i.e., E1+E2) of 3 μm or more, it becomes possible to sufficiently suppress the increase in the contact resistance.

Furthermore, in the contact 10D, even when the semiconductor film 15 undergoes reduction in film thickness or is disappeared, the stable contact is formed, thus making it possible to reduce the thickness of the semiconductor film 15. That is, the thin semiconductor film 15 enables superior transistor characteristics and high productivity to be achieved, and enables the semiconductor film 15 and the lower electrode 13 to be electrically coupled to each other stably.

Moreover, even when the semiconductor film 15 undergoes reduction in film thickness or is disappeared, the stable contact is formed, and thus the allowable range of the manufacturing error is increased, leading to easy manufacture. In a more specific but non-limiting example, the allowable range of the etching error is increased in the process steps of etching the electrically conductive film 17A and the second insulating film 16 (illustrated in FIGS. 41 and 42). Further, the allowable range of the positional deviation upon the formation of the contact hole H is increased.

Sixth Example Embodiment

[Configuration]

FIG. 45 schematically illustrates a cross-sectional configuration of a semiconductor device, i.e., a semiconductor device 2 according to a sixth example embodiment of the technology. FIG. 46 illustrates a planar configuration of a portion of the semiconductor device 2. FIG. 45 illustrates a cross-sectional configuration taken along a line I-I' in FIG. 46. The semiconductor device 2 may have a top-gate thin film transistor, i.e., a transistor 20T, and may be used, for example, for a drive circuit of a unit such as a display unit and an imaging unit (e.g., the display unit 3A in FIG. 51 and the imaging unit 3B in FIG. 52). The semiconductor device 2 may include, on the substrate 11, an insulating film 22 (i.e., a second insulating film), an oxygen-permeation prevention film 23, an interlayer insulating film 24 (a first insulating film), an oxide semiconductor film 25, a gate insulating film 26, and a gate electrode 27 that are provided in this order.

A region, of the oxide semiconductor film 25, that faces the gate electrode 27 may be a channel region 25T of the transistor 20T. A region other than the channel region 25T may be a first wiring line region 25W that is caused to have lower resistance. In the same layer as that of the gate electrode 27, a second wiring line 28 may be provided that is spaced apart from the gate electrode 27. The second wiring line 28 and the oxide semiconductor film 25 may extend in directions orthogonal to each other, as illustrated in FIG. 46. The semiconductor 2 may be provided with a part, i.e., a stack 20L where the second wiring line 28 and the oxide semiconductor film 25 overlap each other.

The substrate 11 may be made of, for example, glass, quartz, and silicon. In an alternative embodiment, the substrate 11 may be made of, for example, a resin material such as polyethylene terephthalate (PET), polyimide (PI), polycarbonate (PC), and polyethylene naphthalate (PEN). Aside from these materials, a member in which a film made of an insulating material is formed on a metal substrate may be used as the substrate 11. The metal substrate may be a stainless steel (SUS) substrate without limitation.

The insulating film 22 may be provided to prevent diffusion of impurities from the substrate 11, and may be provided throughout the entire surface of the substrate 11. The insulating film 22 may also serve to control carrier density of the oxide semiconductor film 25. The insulating film 22 may be configured by, for example, an inorganic insulating film such as a silicon oxide ($SiO_x$) film, a silicon nitride ($SiN_x$) film, a silicon oxynitride (SiON) film, and an aluminum oxide ($AlO_x$) film. The insulating film 22 may have a configuration, for example, in which an organic insulating film made of a material such as an acrylic resin, a polyimide resin, and a novolak resin, and the inorganic insulating film are stacked. The insulating film 22 may have a thickness of 10 nm to 1,000 nm, for example.

The oxygen-permeation prevention film 23 may be provided to prevent oxygen from moving from the substrate 11 and the insulating film 22 to the oxide semiconductor film 25. In the present example embodiment, the oxygen-permeation prevention film 23 may be provided in the stack 20L, and may face the second wiring line 28, with the oxide semiconductor film 25 in the first wiring line region 25W being interposed therebetween. This allows for suppression of oxygen supply to the oxide semiconductor film 25 from underlayers such as the substrate 11 and the insulating film 22, thus making it possible to stably maintain electric conductivity of the first wiring line region 25W, although the detail is described later.

The oxygen-permeation prevention film 23 may be provided in a selective region (i.e., the stack 20L) on the insulating film 22. For example, the oxygen-permeation prevention film 23 may have a width (i.e., a length in Y-direction) that is smaller than a width of the oxide semiconductor film 25. The oxygen-permeation prevention film 23 may have a length (i.e., a length in X-direction) that is larger than a width of the second wiring line 28 as illustrated in FIG. 46.

The oxygen-permeation prevention film 23 may include metal, for example. The oxygen-permeation prevention film 23 may be made of a simple substance of one of titanium (Ti), tungsten (W), tantalum (Ta), aluminum (Al), molybdenum (Mo), silver (Ag), neodymium (Nd), and copper (Cu), or an alloy of any combination thereof, for example. The oxygen-permeation prevention film 23 may be made of a metal oxide. For example, the oxygen-permeation prevention film 23 may be made of an oxide including one or more elements of indium (In), gallium (Ga), zinc (Zn), tin (Sn), titanium (Ti), and niobium (Nb) without limitation. In a specific but non-limiting example, the oxygen-permeation prevention film 23 may be made of a metal oxide such as indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), tin oxide (SnO), and indium oxide (InO). Titanium oxide (TiO) and aluminum oxide (AlO) may also be used for the oxygen-permeation prevention film 23. The oxygen-permeation prevention film 23 may have a thickness (a length in Z direction) of 10 nm to 500 nm, for example.

The interlayer insulating film 24 may be provided between the oxygen-permeation prevention film 23 and the oxide semiconductor film 25. The interlayer insulating film 24 may be provided to prevent contact between the oxygen-permeation prevention film 23 and the oxide semiconductor film 25. The interlayer insulating film 24 covers the oxygen-permeation prevention film 23, and may be provided throughout the entire surface of the substrate 11, for example. The interlayer insulating film 24 may be configured by, for example, an inorganic insulating film such as a silicon oxide ($SiO_x$) film, a silicon nitride ($SiN_x$) film, a silicon oxynitride (SiON) film, and an aluminum oxide ($AlO_x$) film. An organic insulating film made of a material such as a polyimide resin, an acrylic resin, and a silicon resin may be used for the interlayer insulating film 24. The interlayer insulating film 24 may have a thickness of 10 nm to 1,000 nm, for example.

The top-gate transistor 20T may include the gate electrode 27 on the oxide semiconductor film 25 (i.e., the channel region 25T), with the gate insulating film 26 being interposed therebetween. An unillustrated source-drain electrode may be electrically coupled to the oxide semiconductor film 25 in the first wiring line region 25W.

The oxide semiconductor film 25 may be provided in a selective region on the interlayer insulating film 24. The oxide semiconductor film 25 may extend in X-direction, for example, as illustrated in FIG. 46, and may have the channel region 25T and the first wiring line region 25W, as described above. The channel region 25T may overlap (i.e., face) the gate electrode 27, in a plan view. The first wiring line region 25W may have electric resistance lower than that of the channel region 25T, and may include a metal element that is diffused as a dopant, for example. Non-limiting examples of the metal element may include aluminum (Al), indium (In), titanium (Ti), and tin (Sn). The first wiring line region 25W may be caused to have lower resistance by desorbing oxygen in the oxide semiconductor film 25. The first wiring line region 25W may serve as the conductor. The second wiring line 28 may be provided to intersect the first wiring line region 25W. That is, in the stack 20L, the oxide semiconductor film 25 in the first wiring line region 25W and the second wiring line 28 may overlap each other, with the gate insulating film 26 being interposed therebetween. In this example, the oxide semiconductor film 25 in the first wiring line region 25W corresponds to a specific but non-limiting example of a "first wiring line" of the technology. That is, in this example, the "first wiring line" may be made of the same constituent material and may have the same thickness as those of the oxide semiconductor film 25 having the channel region 25T.

The oxide semiconductor film 25 may be configured by an oxide semiconductor that includes, as a main component, an oxide of one or more elements of indium (In), gallium (Ga), zinc (Zn), tin (Sn), titanium (Ti), and niobium (Nb) without limitation. Specific but non-limiting examples of the oxide that may be used for the oxide semiconductor film 25 may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). The oxide semiconductor film 25 may have a thickness of 10 nm to 200 nm, for example.

The gate insulating film 26 may be provided throughout the entire surface of the substrate 11, for example, to cover the oxide semiconductor film 25, and may be provided on the interlayer insulating film 24. In the transistor 20T, the gate insulating film 26 (i.e., a third insulating film) may be disposed between the channel region 25T and the gate electrode 27. In the stack 20L, the gate insulating film 26 may be disposed between the first wiring line region 25W and the second wiring line 28. The gate insulating film 26 may be configured by, for example, a single film such as a silicon oxide ($SiO_x$) film, a silicon nitride ($SiN_x$) film, a silicon oxynitride (SiON) film, and an aluminum oxide ($AlO_x$) film, or may be configured by a stacked film including two or more thereof. The gate insulating film 26 may have a thickness ranging from 50 nm to 300 nm, for example, in a case of the single film of the silicon oxide film.

The gate electrode 27 may serve to control a carrier density in the channel region 25T by means of application of the gate voltage (Vg), and may serve as a wiring line that supplies an electric potential. Non-limiting examples of a constituent material of the gate electrode 27 may include a simple substance of one of titanium (Ti), tungsten (W), tantalum (Ta), aluminum (Al), molybdenum (Mo), silver (Ag), neodymium (Nd), and copper (Cu), or an alloy of any combination thereof. In an alternative embodiment, the gate electrode 27 may be a compound that includes one or more of the above-mentioned materials, or a stacked film that includes two or more thereof. Further, for example, a transparent electrically conductive film made of a material such as ITO may also be used. The gate electrode 27 may be provided in a selective region on the gate insulating film 26 to face the channel region 25T.

The unillustrated source-drain electrode may serve as a source or a drain of the transistor 20T. The source-drain electrode may include, for example, a metal or a transparent electrically conductive film similar to those given as examples of a constituent material of the above-described gate electrode 27. In one embodiment, a material having good electrical conductivity may be selected as the source-drain electrode.

The second wiring line 28 may be provided in the same layer as that of the gate electrode 27. In other words, the second wiring line 28 may be provided on the gate insulating film 26, and may extend in Y-direction, for example. The second wiring layer 28 may be provided to control a voltage of a data line or a gate line, for example. The second wiring layer 28 may be coupled to a gate electrode or a source-drain electrode, for example, of each pixel transistor. The second wiring line 28 may be formed in the same process steps as those of the gate electrode 27, may be made of the same constituent material as that of the gate electrode 27, and may have the same thickness as that of the gate electrode 27.

[Manufacturing Method]

The semiconductor device 2 as described above may be manufactured, for example, as follows.

First, the insulating film 22 may be formed on the entire surface of the substrate 11. Thereafter, a metal film may be formed on the insulating film 22 by means of a sputtering method, for example. Thereafter, photolithography and etching, for example, may be used to pattern the formed metal film into a predetermined shape to form the oxygen-permeation prevention film 23. Subsequently, the interlayer insulating film 24 may be formed on the oxygen-permeation prevention film 23 and on the insulating film 22.

Thereafter, a film of an oxide semiconductor material may be formed on the interlayer insulating film 24 by means of a sputtering method, for example, following which the film of the oxide semiconductor material may be patterned into a predetermined shape by means of photolithography and etching, for example, to form the oxide semiconductor film 25. Thereafter, a metal element may be diffused as a dopant to the oxide semiconductor film 25 in the first wiring line region 25W to cause the first wiring line region 25W to have lower resistance. In an alternative embodiment, a method of desorbing oxygen in the oxide semiconductor film 25, for example, may be used to cause the first wiring line region 25W to have lower resistance. Subsequently, the gate insulating film 26 may be formed by using a chemical vapor deposition (CVD) method, for example, and thereafter the gate electrode 27 and the second wiring line 28 may be formed on the gate insulating film 26. Finally, the source-drain electrode made of the above-mentioned metal material may be formed to complete the semiconductor device 2 illustrated in FIG. 45.

Workings and Effects

In the semiconductor device 2 of the present example embodiment, application of an On voltage equal to or more than a threshold voltage to the gate electrode 27 activates the oxide semiconductor film 25 in the channel region 25T. This allows a current to flow across a pair of source-drain electrodes through the first wiring line region 25W.

In the semiconductor device 2 of the present example embodiment, the oxygen-permeation prevention film 23 may be provided between the insulating film 22 and the oxide semiconductor film 25 in the first wiring line region 25W in the stack 20L. This allows for suppression of oxygen supply to the oxide semiconductor film 25 from the substrate 11 and the insulating film 22, thus making it possible to stably maintain the electrical conductivity of the first wiring line region 25W, as described below referring to Comparative Example 5.

FIG. 47 illustrates a schematic cross-sectional configuration of a semiconductor device, i.e., a semiconductor device 200 according to Comparative Example 5. The semiconductor device 200 includes neither the oxygen-permeation prevention film nor the interlayer insulating film (i.e., neither the oxygen-permeation prevention film 23 nor the interlayer insulating film 24 in FIG. 45). The semiconductor device 200 includes a metal oxide film 230 on the oxide semiconductor film 25. The semiconductor device 200 includes a metal oxide film 230 on the oxide semiconductor film 25. The metal oxide film 230 is in contact with the oxide semiconductor film 25 in a region other than the channel region 25T and a stack 200L. Similarly to the semiconductor device 2, the gate insulating film 26 and the gate electrode 27 are provided on the oxide semiconductor film 25 in the channel region 25T, and the gate insulating film 26 and the second wiring line 28 are provided on the oxide semiconductor film 25 in the stack 200L.

The metal oxide film 230 is made of aluminum oxide, for example, and absorbs oxygen O upward from underlayers such as the insulating film 22 and the oxide semiconductor film 25. Thus, the first wiring line region 25W in a part that is in contact with the metal oxide film 230 is able to stably maintain electric conductivity. Further, the metal oxide film 230 also serves to protect the oxide semiconductor film 25.

In the stack 200L, however, the gate insulating film 26 and the second wiring line 28 are provided on the first wiring line region 25W as described above, thus making it unable to bring the metal oxide film 230 into contact with the first wiring line region 25W. As a result, there is a possibility that the first wiring line region 25W in the stack 200L may be supplied with oxygen from the underlayers to exhibit a semiconductor behavior similar to that of the channel region 25T. In other words, in the stack 200L having a structure similar to that of the transistor, it is unable to stably maintain the electric conductivity of the first wiring line region 25W. Consequently, it is difficult, in the semiconductor device 200, to dispose the oxide semiconductor film 25 and the second wiring line 28 to overlap each other, thus resulting in a limited layout without the stack 200L.

In contrast, in the semiconductor device 2, the provision of the oxygen-permeation prevention film 23 in the stack 20L prevents movement of oxygen O from the substrate 11 and the insulating film 22 to the oxide semiconductor film 25, as illustrated in FIG. 48. Hence, in the stack 20L as well, it becomes possible to stably maintain the electric conductivity of the first wiring line region 25W, thus allowing for a more free layout of the oxide semiconductor film 25 and the second wiring line 28.

As described hereinabove, in the present example embodiment, the provision of the oxygen-permeation prevention film 23 between the insulating film 22 and the oxide semiconductor film 25 in the stack 20L makes it possible to stably maintain the electric conductivity of the first wiring line region 25W. This allows for enhancement in a degree of freedom of design.

Modification Example 9

(A) of FIG. 49 illustrates a schematic planar configuration of a main part of a semiconductor device, i.e., a semiconductor device 2A according to a modification example of the foregoing sixth example embodiment (i.e., Modification Example 9). (B) of FIG. 49 illustrates a schematic cross-sectional configuration of the main part of the semiconductor device 2A. In the semiconductor device 2A, a portion of an oxygen-permeation prevention film (i.e., an oxygen-permeation prevention film 23A) may serve as a component of an electron element. The oxygen-permeation prevention film 23A and the oxide semiconductor film 25 may be electrically coupled to each other via the second wiring line 28. Except this point, the semiconductor device 2A has a configuration similar to that of the semiconductor device 2 of the foregoing sixth example embodiment, and also has workings and effects similar to those of the semiconductor device 2 of the foregoing sixth example embodiment.

The semiconductor device 2A may include, for example, an illustrated storage capacitor element together with the thin film transistor (e.g, the transistor 20T in FIG. 45). The oxygen-permeation prevention film 23A may be configured by an electrically conductive film; an unillustrated portion of the oxygen-permeation prevention film 23A may serve as one electrode (e.g., as the lower electrode) of the storage capacitor element, for example.

In the stack 20L, there may be stacked the substrate 11, the oxygen-permeation prevention film 23A, the interlayer insulating film 24, the first wiring line region 25W, the gate insulating film 26, and the second wiring line 28 in this order. That is, the provision of the oxygen-permeation prevention film 23A between the substrate 11 and the oxide semiconductor film 25 suppresses oxygen supply from the substrate 11 to the oxide semiconductor film 25, thus making it possible to stably maintain the electric conductivity of the first wiring line region 25W.

The semiconductor device 2A may have a first contact C1 and a second contact C2. In the first contact C1, the oxide semiconductor film 25 and the second wiring line 28 may be in contact with each other. In the second contact C2, the oxygen-permeation prevention film 23A and the second wiring line 28 may be in contact with each other. The first contact C1 and the second contact C2 allow for electrical coupling between the oxygen-permeation prevention film 23A and the oxide semiconductor film 25 via the second wiring line 28. The first contact C1 may include the substrate 11, the oxygen-permeation prevention film 23A, the interlayer insulating film 24, the oxide semiconductor film 25, and the second wiring line 28 that are provided in this order. The second contact C2 may include the substrate 11, the oxygen-permeation prevention film 23A, and the second wiring line 28 that are provided in this order. In the semiconductor device 2A, the stack 20L, the first contact C1, and the second contact C2 may be disposed adjacently in this order.

In the semiconductor device 2A, the oxygen-permeation prevention film 23A that is an extension of the lower electrode of the storage capacitor element may be provided in the stack 20L. This allows for formation of a stable contact structure of the lower electrode of the storage capacitor element and the oxide semiconductor film 25 (i.e., the first wiring line region 25W) in a simpler manner.

In a case where the oxygen-permeation prevention film 23A is not provided in the stack 20L, it is unable to stably maintain the electric conductivity of the first wiring line region 25W, thus making it unable to dispose the second wiring line 28 to overlap the oxide semiconductor film 25. As a result, a plurality of photolithography steps may be necessary to couple the lower electrode of the storage capacitor element and the oxide semiconductor film 25 to each other, thus making the manufacturing steps complicated.

In contrast, in the semiconductor device 2A, the oxygen-permeation prevention film 23A that is the extension of the lower electrode of the storage capacitor element may be provided in the stack 20L. This allows the electric conductivity of the first wiring line region 25W to be stably maintained in the stack 20L. Thus, it becomes possible to electrically couple the lower electrode of the storage capacitor element and the oxide semiconductor film 25 (in the first wiring line region 25W) without increasing the number of the photolithography steps. Hence, it becomes possible to form the stable contact structure of the lower electrode of the storage capacitor element and the first wiring line region 25W in a simpler manner.

Further, by disposing the first contact C1 and the second contact C2 adjacently, it becomes possible to suppress increase in an area of the contact.

Similarly to the above-described semiconductor device 2, in the semiconductor device 2A as well, the provision of the oxygen-permeation prevention film 23A in the stack 20L enables the oxide semiconductor film 25 and the second wiring line 28 to be disposed more freely, thus allowing for enhancement in a degree of freedom of design. Further, a portion of the oxygen-permeation prevention film 23A may serve as the component of an electron element, thus allowing for formation of the contact structure of the oxygen-permeation prevention film 23A and the oxide semiconductor film 25 (i.e., the first wiring line region 25W) in a simpler manner.

Modification Example 10

FIG. 50 schematically illustrates a cross-sectional configuration of a semiconductor device, i.e., a semiconductor device 2B according to a modification example of the foregoing sixth example embodiment (i.e., Modification Example 10). The semiconductor device 2B may include a bottom-gate transistor, i.e., a transistor 20TB. Except this point, the semiconductor device 2B has a configuration similar to that of the semiconductor device 2 of the foregoing sixth example embodiment, and also has workings and effects similar to those of the semiconductor device 2 of the foregoing sixth example embodiment.

The semiconductor device 2B may include the substrate 11, the gate electrode 27, the gate insulating film 26, the oxide semiconductor film 25, the interlayer insulating film 24, the oxygen-permeation prevention film 23, and the insulating film 22 that are provided in this order. In the stack 20L, the second wiring layer 28 may be provided in the same layer as that of the gate electrode 27, and the oxygen-permeation prevention film 23 may be provided between the interlayer insulating film 24 and the insulating film 22.

Similarly to the above-described semiconductor device 2, in such a semiconductor device 2B as well, the provision of the oxygen-permeation prevention film 23 in the stack 20L allows for suppression of oxygen supply from the layer above (i.e., the insulating film 22) to the first wiring line region 25W. This makes it possible to stably maintain the electric conductivity of the first wiring line region 25W in the stack 20L, thus allowing for enhancement in a degree of freedom of design.

Application Example 11

The semiconductor devices described in the foregoing example embodiments and modification examples (e.g., the semiconductor devices 1, 1A, 2, 2A, and 2B) may be each used, for example, for a drive circuit of a unit such as a display unit (i.e., the display unit 3A in FIG. 51 described later) and an imaging unit (i.e., the imaging unit 3B in FIG. 52 described later).

FIG. 51 illustrates a functional block configuration of the display unit 3A. The display unit 3A may display, as an image, an image signal inputted from the outside or generated inside the display unit 3A. The display unit 3A may also be applied to a liquid crystal display, for example, aside from an organic electroluminescence (EL) display. The display unit 3A may include, for example, a timing controller 31, a signal processor 32, a driver 33, and a display pixel section 34.

The timing controller 31 may include a timing generator that generates various timing signals, i.e., control signals. The timing controller 31 may control driving of the signal processor 32, for example, on the basis of the various timing signals. The signal processor 32 may perform a predetermined correction on, for example, the digital image signal inputted from the outside, and may output the thus-obtained image signal to the driver 33. The driver 33 may include circuits such as a scanning line drive circuit and a signal line drive circuit, for example. The driver 33 may drive each pixel of the display pixel section 34 through various control lines. The display pixel section 34 may include, for example, a display element and a pixel circuit. Non-limiting examples of the display element may include an organic EL element and a liquid crystal display element. The pixel circuit may be provided to drive the display element on a pixel basis. Each of the above-described semiconductor devices may be used, for example, for various circuits constituting a portion of the driver 33 or a portion of the display pixel section 34, among the above-described components.

FIG. 52 illustrates a functional block configuration of the imaging unit 3B. The imaging unit 3B may be a solid-state imaging unit that obtains an image, for example, as an electric signal. The imaging unit 3B may be configured by, for example, a charge coupled device (CCD) image sensor or a complementary metal oxide semiconductor (CMOS) image sensor. The imaging unit 3B may include, for example, a timing controller 35, a driver 36, an imaging pixel section 37, and a signal processor 38.

The timing controller 35 may include a timing generator that generates various timing signals, i.e., control signals. The timing controller 35 may control driving of the driver 36 on the basis of the various timing signals. The driver 36 may include, for example, a row selection circuit, an AD conversion circuit, and a horizontal transfer scanning circuit. The driver 36 may perform driving to read a signal from each pixel of the imaging pixel section 37 through various control lines. The imaging pixel section 37 may include, for example, an imaging element, i.e., a photoelectric conversion element such as a photodiode, and a pixel circuit for reading of a signal. The signal processor 38 may apply various signal processings to the signal obtained from the imaging pixel section 37. Each of the above-described semiconductor devices may be used, for example, for various circuits constituting a portion of the driver 36 or a portion of the imaging pixel section 37, among the above-described components.

[Examples of Various Electronic Apparatuses]

A unit such as the display unit 3A and the imaging unit 3B may be used for various types of electronic apparatuses. FIG. 53 illustrates a functional block configuration of an electronic apparatus 4. Non-limiting examples of the electronic apparatus 4 may include a television, a personal computer (PC), a smartphone, a tablet PC, a mobile phone, a digital still camera, and a digital video camera.

The electronic apparatus 4 may include, for example, the above-described display unit 3A (or imaging unit 3B) and an interface section 40. The interface section 40 may be an input section that receives various signals and a power supply, for example, from the outside. The interface section 40 may include a user interface such as a touch panel, a keyboard, and operation buttons, for example.

Although description has been given hereinabove with reference to the example embodiments, etc., the technology is not limited thereto, but may be modified in a wide variety of ways. For example, factors such as a material and a thickness of each layer exemplified in the foregoing example embodiments, etc. are illustrative and non-limiting. Any other material, any other thickness, and any other factor may be adopted besides those described above.

Although description has been given, by way of example in the foregoing example embodiments, etc., of the case where each of the contacts 10, 10A, 10B, 10C, and 10D couples the transistor Tr and the storage capacitor Cs to each other, it is also possible to apply each of the contacts 10, 10A, 10B, 10C, and 10D to coupling of other elements.

Although description has been given, in the foregoing third example embodiment, etc., of the case where the distance from the end $E_{17}$ of the gate wiring line 17W to the second region 10-2 varies continuously, the distance from the end $E_{17}$ of the gate wiring line 17W to the second region 10-2 may vary stepwise as illustrated in FIGS. 54 to 56. Further, the end $E_{17}$ of the gate wiring line 17W may be provided in a curved manner in a plan view, as illustrated in FIG. 57.

Although FIG. 34, etc. illustrate the case where the thickness t1 of the semiconductor film 15 in the low-resistance region 15b-1 and the thickness t2 of the semiconductor film 15 in the second region 10-2 are each constant, the thickness t1 of the semiconductor film 15 in the low-resistance region 15b-1 and the thickness t2 of the semiconductor film 15 in the second region 10-2 may vary. For example, the thickness t1 of the semiconductor film 15 in the low-resistance region 15b-1 may be larger at both ends than at a middle part. It is sufficient that the thickness of at least a portion of the semiconductor film 15 in the low-resistance region 15b-1 may be smaller than the thickness of the semiconductor film 15 in the second region 10-2.

Although FIG. 46 illustrates the case where the oxygen-permeation prevention film 23 has a width that is smaller than the width of the oxide semiconductor film 25, the oxygen-permeation prevention film 23 may have a width larger than the width of the oxide semiconductor film 25 as illustrated in FIG. 58.

Although description has been given, in the foregoing sixth example embodiment, etc., referring to the oxide semiconductor film 25 in the first wiring line region 25W, as a specific but non-limiting example of a "first wiring line" according to an embodiment of the technology, the "first wiring line" according to an embodiment of the technology may be provided separately from the oxide semiconductor film 25 where the channel region 25T is provided.

Although description has been given, in the foregoing sixth example embodiment, etc., of the case where the gate insulating film 26 is provided throughout the entire surface of the substrate 11, the gate insulating film between the channel region and the gate electrode and the insulating film (i.e., the third insulating film) between the first wiring line and the second wiring line may be provided in a manner separated from each other.

The effects described in the foregoing example embodiments, etc. are mere examples. The effects according to an embodiment of the disclosure may be other effects, or may further include other effects in addition to the effects described hereinabove.

It is to be noted that the technology may also have the following configurations.

(1)

A semiconductor device including:
  a substrate including a first region, a second region, and a third region that are provided adjacently in this order in a predetermined direction;
  a first wiring line that is provided on the substrate and provided in each of the first region, the second region, and the third region;
  a semiconductor film having a low-resistance region in at least a portion of the semiconductor film, the semiconductor film being provided between the first wiring line and the substrate in the first region, and being in contact with the first wiring line in the second region;
  a second wiring line that is provided at a position closer to the substrate than the semiconductor film, and is in contact with the first wiring line in the third region; and
  an insulating film provided between the first wiring line in the first region and the semiconductor film in the first region.

(2)

The semiconductor device according to (1), in which, in the first region, a portion of the semiconductor film is exposed from the insulating film and the first wiring line.

(3)

The semiconductor device according to (2), in which, at least in the first region, the first wiring line has a width that is smaller than a width of the semiconductor film.

(4)

The semiconductor device according to (1) or (2), in which
  the first wiring line has an end in the first region, and
  a distance from the end of the first wiring line to the second region has a plurality of different values.

(5)

The semiconductor device according to any one of (1) to (4), further including a transistor, in which
  the semiconductor film includes a channel region of the transistor.

(6)

The semiconductor device according to (5), in which, in the semiconductor film,
  the low-resistance region is provided between the channel region and the first region, and
  the low-resistance region has a thickness that is smaller than a thickness of the second region.

(7)

The semiconductor device according to (5) or (6), in which the transistor includes the semiconductor film, a gate insulating film, and a gate electrode in this order on the substrate.

(8)

The semiconductor device according to (7), in which
the gate insulating film includes a constituent material same as a constituent material of the insulating film, and has a thickness same as a thickness of the insulating film, and
the gate electrode includes a constituent material same as a constituent material of the first wiring line, and has a thickness same as a thickness of the first wiring line.

(9)

The semiconductor device according to any one of (1) to (8), further including a storage capacitor, in which
the second wiring line constitutes one of electrodes of the storage capacitor.

(10)

The semiconductor device according to any one of (1) to (9), in which the first region has a length of 2 μm or less in the predetermined direction.

(11)

The semiconductor device according to any one of (1) to (10), in which the first wiring line, the semiconductor film, and the second wiring line each have a width of 5 μm or less.

(12)

The semiconductor device according to any one of (1) to (11), in which the semiconductor film includes an oxide semiconductor material.

(13)

A semiconductor device including:
a substrate including a first region, a second region, and a third region that are provided adjacently in this order in a predetermined direction;
a first wiring line that is provided on the substrate and provided at least in the third region;
a first insulating film that covers the first wiring line;
a semiconductor film that is provided on the substrate and provided in each of the first region and the second region, with the first insulating film being interposed between the substrate and the semiconductor film, the semiconductor film having a low-resistance region at least in a portion of the semiconductor film;
a second insulating film that covers the semiconductor film; and
a second wiring line that is provided on the substrate and provided in each of the second region and the third region, with the second insulating film being interposed between the substrate and the second wiring line, the second wiring line being in contact with the semiconductor film in the second region via a contact hole provided in the second insulating film and the first insulating film, and being in contact with the first wiring line in the third region via the contact hole provided in the second insulating film and the first insulating film,
the second wiring line and the semiconductor film each having a width that is larger than a width of the contact hole.

(14)

The semiconductor device according to (13), in which, in the first region, the semiconductor film is exposed from the second insulating film and the second wiring line.

(15)

The semiconductor device according to (14), in which the semiconductor film has a high-resistance region in a portion of the first region, and
the semiconductor film in the high-resistance region has a thickness that is smaller than a thickness of the semiconductor film in other portions, or the semiconductor film is disappeared.

(16)

The semiconductor device according to any one of (13) to (15), in which the first wiring line, the semiconductor film, and the second wiring line each have a width that is larger than a width of the contact hole by 3 μm or more.

(17)

The semiconductor device according to any one of (13) to (16), in which the contact hole has a width of 2 μm or more.

(18)

The semiconductor device according to (17), in which the first wiring line, the semiconductor film, and the second wiring line each have a width of 5 μm or more.

(19)

A semiconductor device including:
a transistor having a gate electrode, and a channel region of an oxide semiconductor film that faces the gate electrode;
a first wiring line provided in same layer as a layer in which the oxide semiconductor film is provided, and including same constituent material as a constituent material of the oxide semiconductor film;
a second wiring line provided in same layer as a layer in which the gate electrode is provided; and
a stack that includes
an oxygen-permeation prevention film that faces the second wiring line, with the first wiring line being interposed between the second wiring line and the oxygen-permeation prevention film, and
a first insulating film provided between the oxygen-permeation prevention film and the first wiring line.

(20)

The semiconductor device according to (19), further including a second insulating film, in which
the second insulating film, the oxygen-permeation prevention film, and the first insulating film are provided in this order in the stack.

In the semiconductor device (1) according to the embodiment of the technology, a contact between the semiconductor film and the second wiring line is formed via the first wiring line in each of the second region and the third region. The insulating film is provided between the first wiring line and the semiconductor film in the first region, thus allowing for protection of the semiconductor film in the first region upon formation of a wiring line above the semiconductor film. For example, the etching upon formation of the first wiring line is less likely to influence the semiconductor film, thus suppressing reduction in film thickness, for example, of the semiconductor film.

In the semiconductor device (13) according to the embodiment of the technology, a contact between the semiconductor film and the first wiring line is formed via the second wiring line in each of the second region and the third region. The second wiring line and the semiconductor film each have a width that is larger than the width of the contact hole, thus ensuring a path of carriers even when the semiconductor film in the first region undergoes reduction in film thickness or is disappeared in the same width as that of the contact hole.

In the semiconductor device (19) according to the embodiment of the technology, the oxygen-permeation prevention film provided in the stack allows for suppression of oxygen supply to the first wiring line.

According to the semiconductor device (1) of the embodiment of the technology, the provision of the insulating film between the first wiring line and the semiconductor film in the first region allows for suppression of reduction in film thickness of the semiconductor film, for example, thus enabling the semiconductor film and the second wiring line to be coupled to each other stably. Hence, it becomes possible to enhance contact stability.

According to the semiconductor device (13) of the embodiment of the technology, the second wiring line and the semiconductor film each have a width that is larger than the width of the contact hole, thus ensuring a path of carriers even when the semiconductor film in the first region undergoes reduction in film thickness or is disappeared in the same width as that of the contact hole. This enables the semiconductor film and the first wiring line to be coupled to each other stably. Hence, it becomes possible to enhance the contact stability.

According to the semiconductor device (19) of the embodiment of the technology, the provision of the oxygen-permeation prevention film in the stack enables electric conductivity of the first wiring line to be stably maintained even in a part where the first wiring line and the second wiring line overlap each other. Hence, it becomes possible to enhance a degree of freedom of design.

It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A semiconductor device comprising:
    a substrate including a first region, a second region, and a third region that are provided adjacently in this order in a predetermined direction;
    a first wiring line that is provided on the substrate and provided in each of the first region, the second region, and the third region;
    a semiconductor film having a low-resistance region in at least a portion of the semiconductor film, the semiconductor film being provided between the first wiring line and the substrate in the first region, and being in direct physical contact with the first wiring line in the second region;
    a second wiring line that is provided at a position closer to the substrate than the semiconductor film, and is in contact with the first wiring line in the third region; and
    an insulating film provided between the first wiring line in the first region and the semiconductor film in the first region.

2. The semiconductor device according to claim 1, wherein, in the first region, a portion of the semiconductor film is exposed from the insulating film and the first wiring line.

3. The semiconductor device according to claim 2, wherein, at least in the first region, the first wiring line has a width that is smaller than a width of the semiconductor film.

4. The semiconductor device according to claim 1, wherein
    the first wiring line has an end in the first region, and
    a distance from the end of the first wiring line to the second region has a plurality of different values.

5. The semiconductor device according to claim 1, further comprising a transistor, wherein
    the semiconductor film includes a channel region of the transistor.

6. The semiconductor device according to claim 5, wherein, in the semiconductor film,
    the low-resistance region is provided between the channel region and the first region, and
    the low-resistance region has a thickness that is smaller than a thickness of the second region.

7. The semiconductor device according to claim 5, wherein the transistor includes the semiconductor film, a gate insulating film, and a gate electrode in this order on the substrate.

8. The semiconductor device according to claim 7, wherein
    the gate insulating film includes a constituent material same as a constituent material of the insulating film, and has a thickness same as a thickness of the insulating film, and
    the gate electrode includes a constituent material same as a constituent material of the first wiring line, and has a thickness same as a thickness of the first wiring line.

9. The semiconductor device according to claim 1, further comprising a storage capacitor, wherein
    the second wiring line constitutes one of electrodes of the storage capacitor.

10. The semiconductor device according to claim 1, wherein the first region has a length of 2 μm or less in the predetermined direction.

11. The semiconductor device according to claim 1, wherein the first wiring line, the semiconductor film, and the second wiring line each have a width of 5 μm or less.

12. The semiconductor device according to claim 1, wherein the semiconductor film includes an oxide semiconductor material.

13. A semiconductor device comprising:
    a substrate including a first region, a second region, and a third region that are provided adjacently in this order in a predetermined direction;
    a first wiring line that is provided on the substrate and provided at least in the third region;
    a first insulating film that covers the first wiring line;
    a semiconductor film that is provided on the substrate and provided in each of the first region and the second region, with the first insulating film being interposed between the substrate and the semiconductor film, the semiconductor film having a low-resistance region at least in a portion of the semiconductor film;

a second insulating film that covers the semiconductor film; and a second wiring line that is provided on the substrate and provided in each of the second region and the third region, with the second insulating film being interposed between the substrate and the second wiring line, the second wiring line being in contact with the semiconductor film in the second region via a contact hole provided in the second insulating film and the first insulating film, and being in contact with the first wiring line in the third region via the contact hole provided in the second insulating film and the first insulating film, the second wiring line and the semiconductor film each having a width that is larger than a width of the contact hole.

14. The semiconductor device according to claim 13, wherein, in the first region, the semiconductor film is exposed from the second insulating film and the second wiring line.

15. The semiconductor device according to claim 14, wherein the semiconductor film has a high-resistance region in a portion of the first region, and the semiconductor film in the high-resistance region has a thickness that is smaller than a thickness of the semiconductor film in other portions, or the semiconductor film is disappeared.

16. The semiconductor device according to claim 13, wherein the first wiring line, the semiconductor film, and the second wiring line each have a width that is larger than a width of the contact hole by 3 µm or more.

17. The semiconductor device according to claim 13, wherein the contact hole has a width of 2 µm or more.

18. The semiconductor device according to claim 17, wherein the first wiring line, the semiconductor film, and the second wiring line each have a width of 5 µm or more.

19. A semiconductor device comprising:

a transistor having a gate electrode, and a channel region of an oxide semiconductor film that faces the gate electrode;

a first wiring line provided in same layer as a layer in which the oxide semiconductor film is provided, and including same constituent material as a constituent material of the oxide semiconductor film;

a second wiring line provided in same layer as a layer in which the gate electrode is provided; and a stack that includes an oxygen-permeation prevention film that faces the second wiring line, with the first wiring line being interposed between the second wiring line and the oxygen-permeation prevention film, a first insulating film provided between the oxygen-permeation prevention film and the first wiring line, and a second insulating film, wherein the second insulating film, the oxygen-permeation prevention film, and the first insulating film are provided in this order in the stack.

* * * * *